US006526555B1

(12) United States Patent
Teig et al.

(10) Patent No.: US 6,526,555 B1
(45) Date of Patent: Feb. 25, 2003

(54) METHOD FOR LAYOUT AND MANUFACTURE OF GRIDLESS NON MANHATTAN SEMICONDUCTOR INTEGRATED CIRCUITS USING COMPACTION

(75) Inventors: Steven Teig, Menlo Park, CA (US); Andrew Caldwell, Santa Clara, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 09/972,556

(22) Filed: Oct. 5, 2001

Related U.S. Application Data

(63) Continuation of application No. 09/681,775, filed on Jun. 3, 2001.

(51) Int. Cl.⁷ .............................................. G06F 17/50
(52) U.S. Cl. ............................. 716/11; 716/12; 716/13; 716/14
(58) Field of Search ............................. 716/11, 12, 13, 716/14

(56) References Cited

U.S. PATENT DOCUMENTS

| | | | | |
|---|---|---|---|---|
| 5,640,327 A | * | 6/1997 | Ting | 716/12 |
| 5,822,214 A | * | 10/1998 | Rostoker et al. | 716/10 |
| 6,260,183 B1 | * | 7/2001 | Raspopovic et al. | 716/11 |
| 6,324,674 B2 | * | 11/2001 | Andreev et al. | 716/12 |
| 6,412,097 B1 | * | 6/2002 | Kikuchi et al. | 716/2 |
| 2001/0009031 A1 | * | 7/2001 | Nitta et al. | 716/13 |

* cited by examiner

Primary Examiner—Tom Thomas
Assistant Examiner—Quang Vu
(74) Attorney, Agent, or Firm—Dag Johansen; Stattler Johansen & Adeli LLP

(57) ABSTRACT

The present invention introduces methods for implementing gridless non Manhattan architecture for integrated circuits. In one particular embodiment, an integrated circuit layout containing horizontal, vertical, and diagonal interconnect lines is first created. Next, the integrated circuit layout is then compacted. The compacting method first creates groups of horizontal and diagonal interconnect lines sorted by vertical position and groups of vertical and diagonal interconnect lines sorted by horizontal position. The two groups are then compacted in a manner that ensures that a minimum manufacturing line spacing requirement is satisfied.

20 Claims, 48 Drawing Sheets

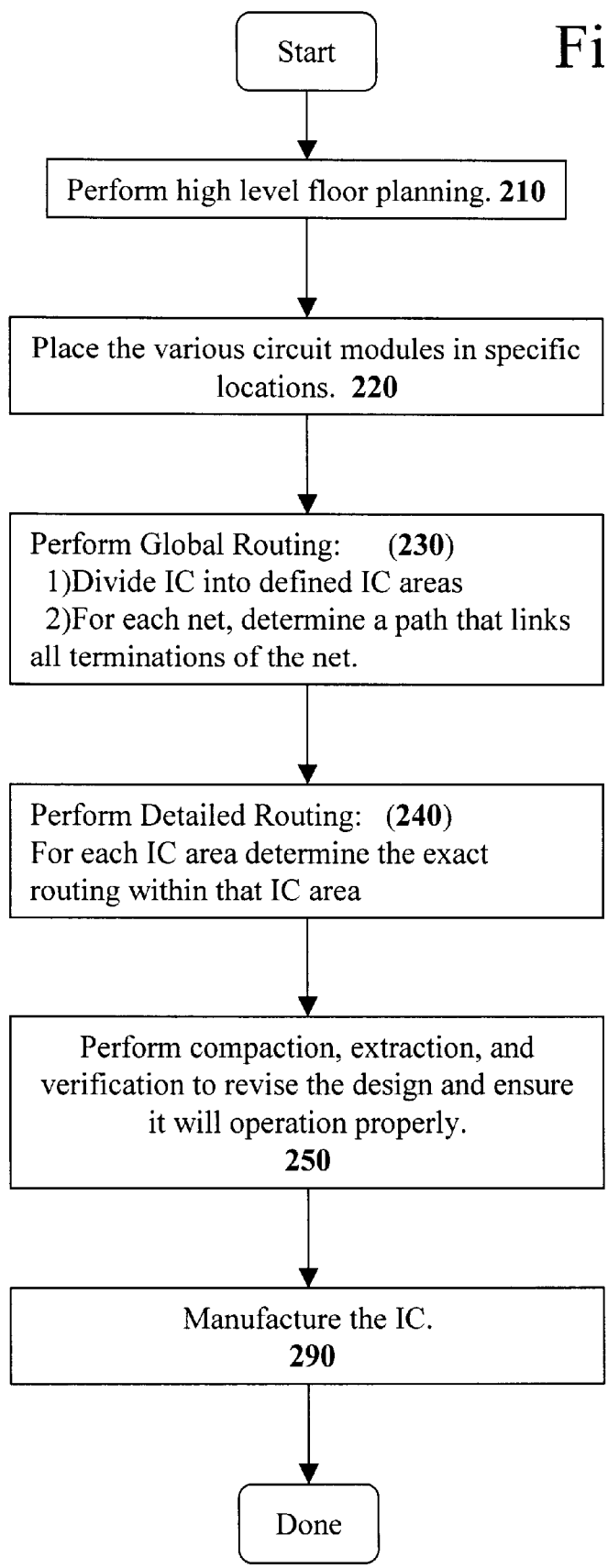

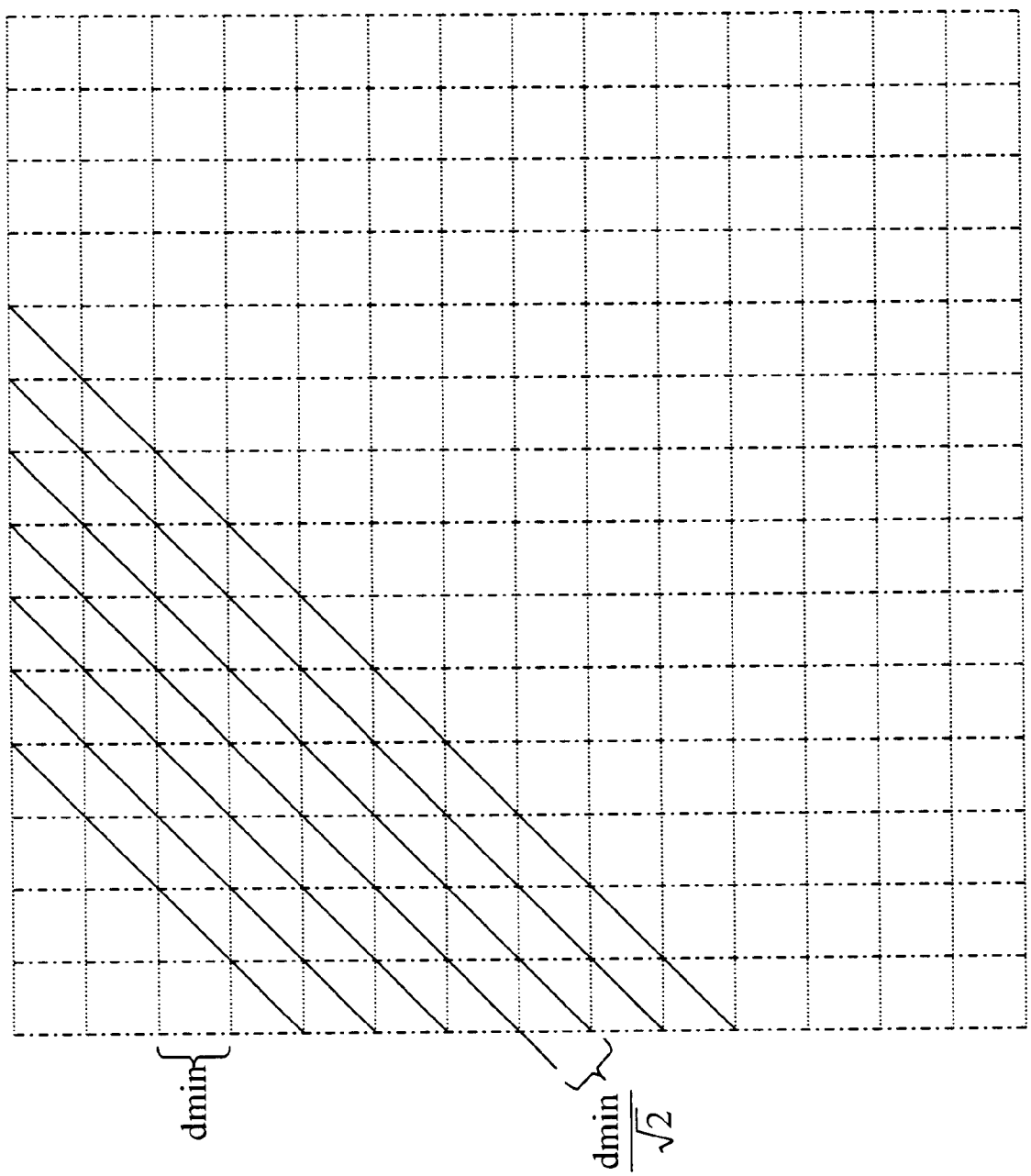

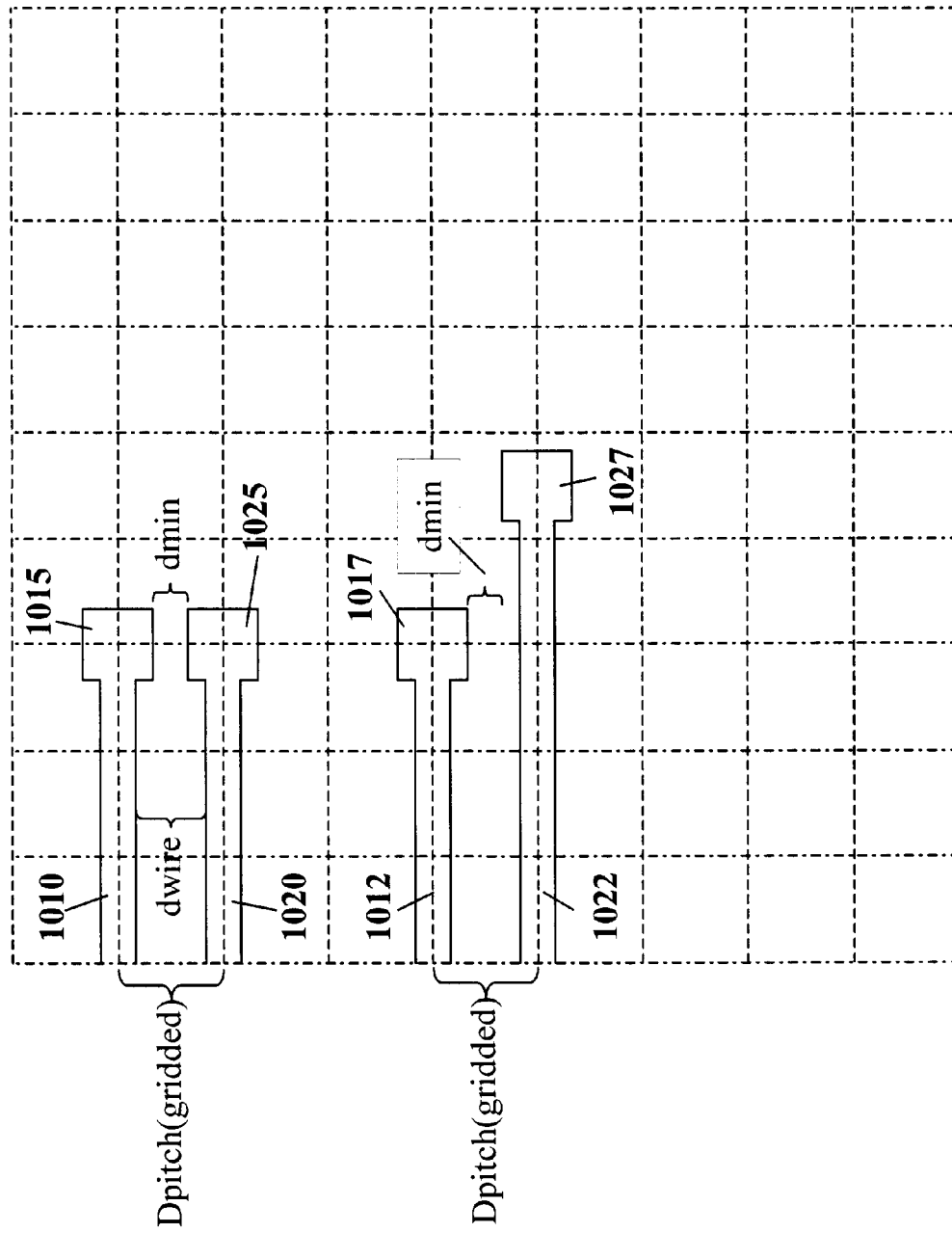

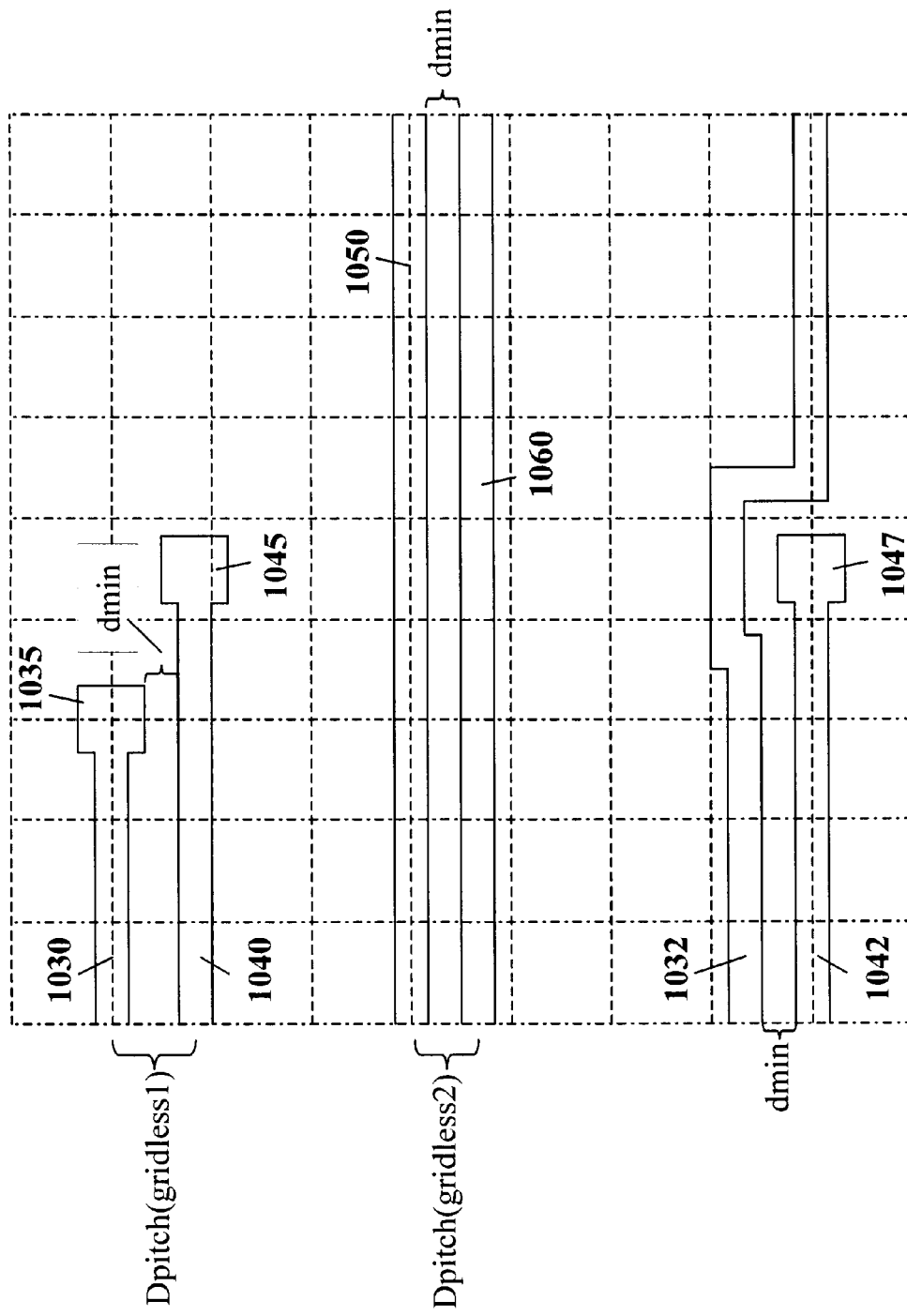

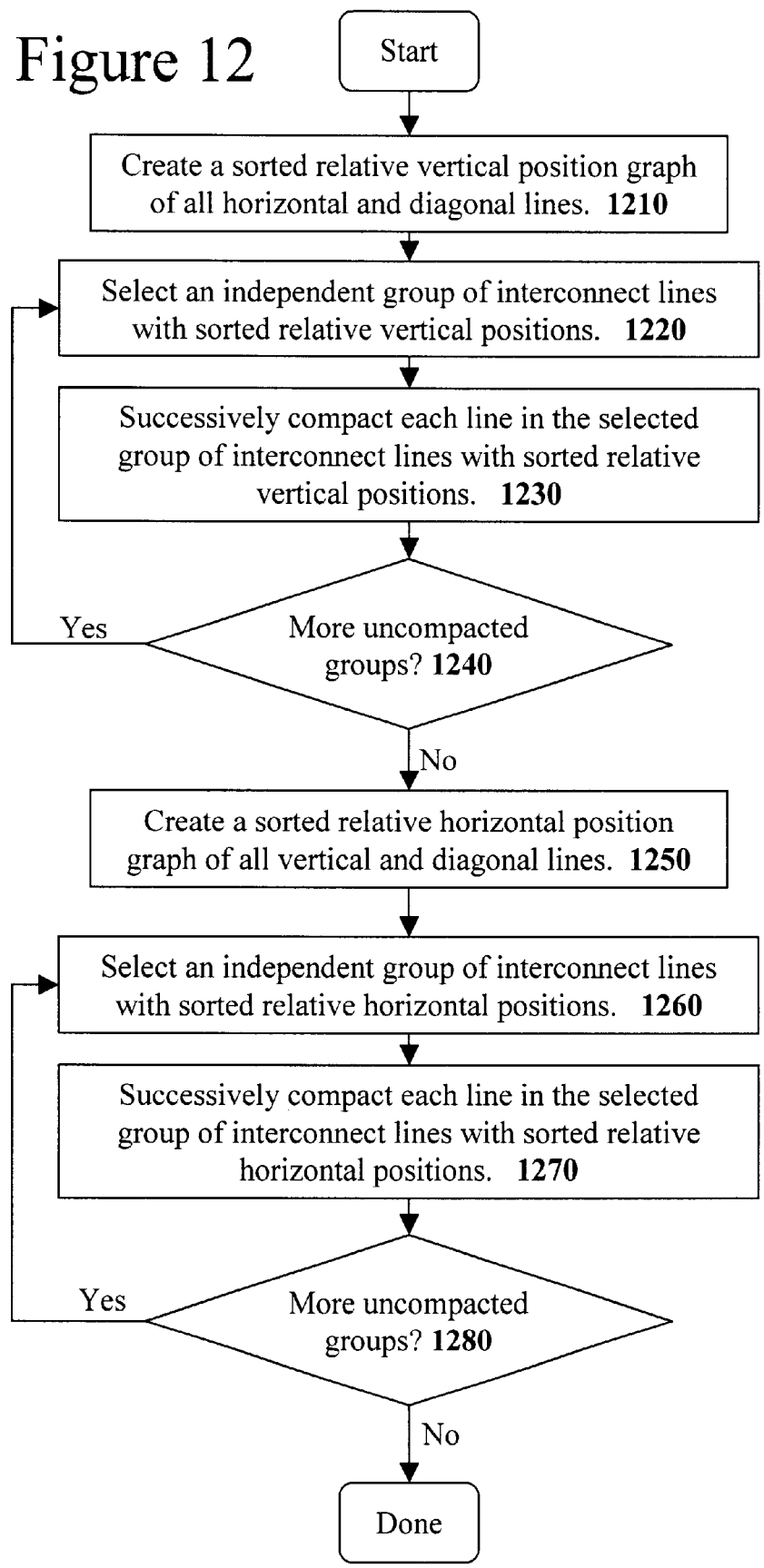

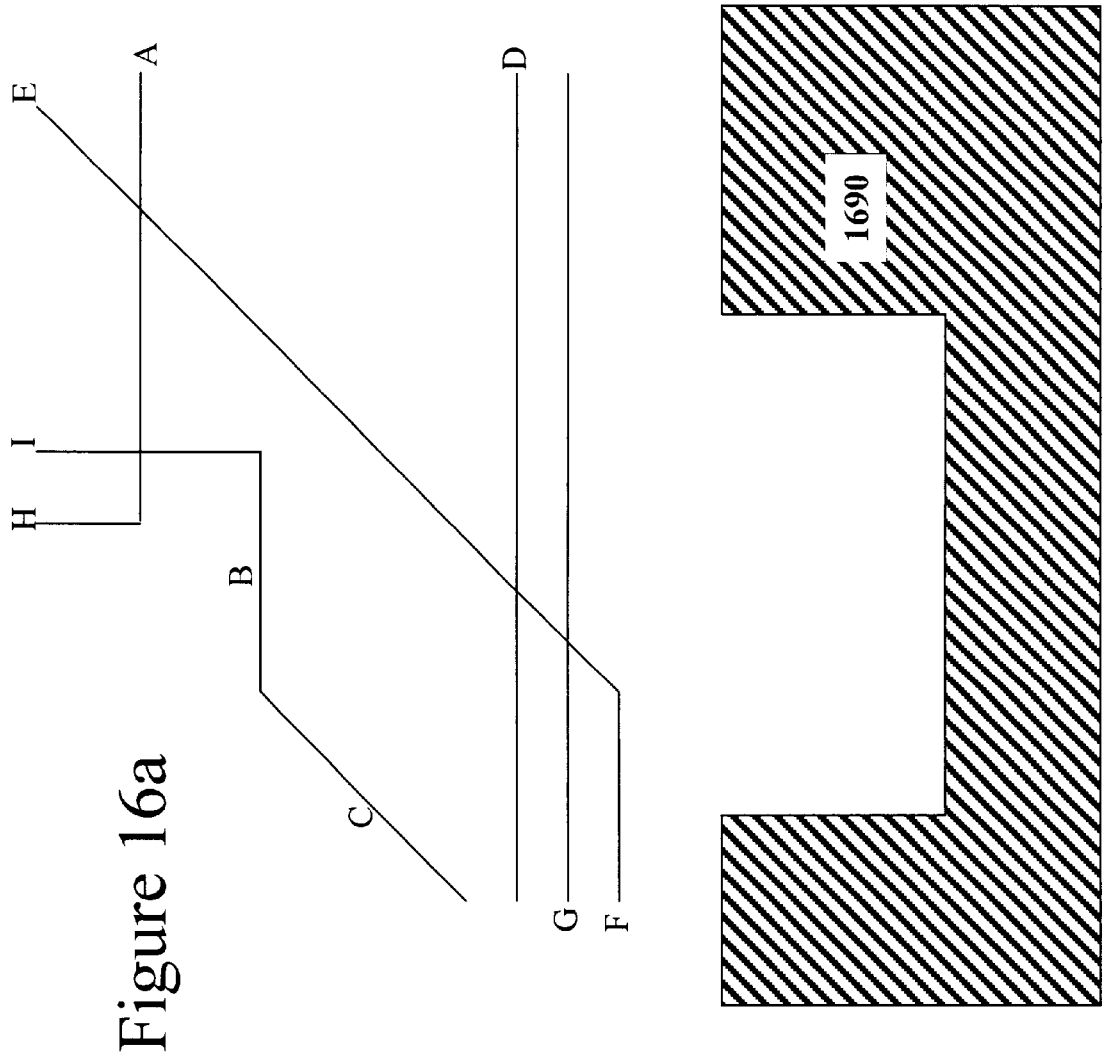

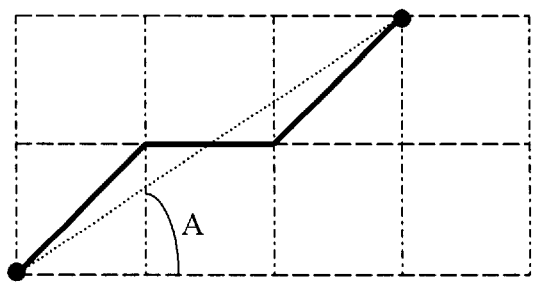
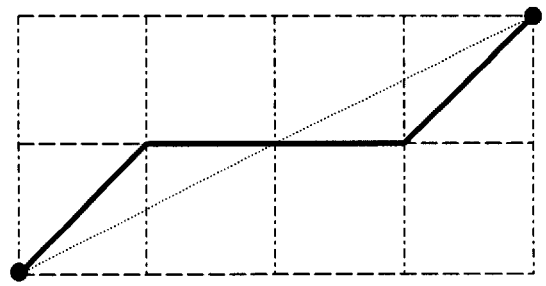
Figure 18a          Figure 18b
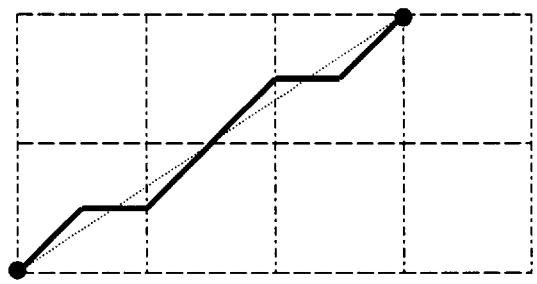
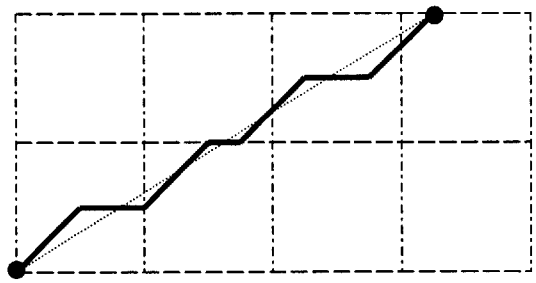
Figure 18c          Figure 18d
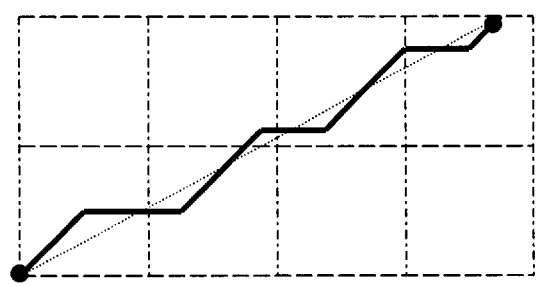
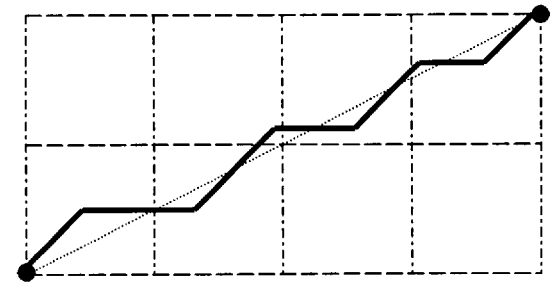
Figure 18e          Figure 18f

METHOD FOR LAYOUT AND MANUFACTURE OF GRIDLESS NON MANHATTAN SEMICONDUCTOR INTEGRATED CIRCUITS USING COMPACTION

CROSS REFERENCE TO RELATED APPLICATIONS

This application is a continuation application of United States Patent Application entitled "Method And Arrangement For Layout And Manufacture Of Gridless Non Manhattan Semiconductor Integrated Circuits," filed on Jun. 3, 2001, and having the Ser. No. 09/681,775.

FIELD OF THE INVENTION

The present invention relates to the field of semiconductor design and manufacture. In particular the present invention discloses gridless semiconductor architectures and methods for designing and manufacturing gridless semiconductor integrated circuits.

BACKGROUND OF THE INVENTION

An integrated circuit ("IC") is a semiconductor device that includes many electronic components (e.g., transistors, diodes, inverters, etc.). These electrical components are interconnected to form larger scale circuit components (e.g., gates, cells, memory units, arithmetic units, controllers, decoders, etc.) on the IC. The electronic and circuit components of IC's are jointly referred to below as "components."

An IC also includes multiple layers of metal and/or polysilicon wiring that interconnect its electronic and circuit components. For instance, many IC's are currently fabricated with five metal layers. In theory, the wiring on the metal layers can be all-angle wiring (i.e., the wiring can be in any arbitrary direction). Such all-angle wiring is commonly referred to as Euclidean wiring. In practice, however, each metal layer typically has a preferred wiring direction in an attempt to maximize the number of signal wires placed on each wiring layer by preventing intersections. In current ICs, the preferred direction alternates between successive metal layers. Most IC's use the "Manhattan" wiring model, which specifies alternating layers of preferred-direction horizontal and vertical wiring. (Viewed from above, the horizontal and vertical wiring resemble the orthogonal streets of Manhattan.) In the Manhattan wiring model, essentially all of the interconnect wires are horizontal or vertical.

Design engineers design IC's by transforming circuit description of the IC's into geometric descriptions, called layouts. To create an integrated circuit layout, design engineers typically use electronic design automation ("EDA") applications. These EDA applications provide sets of computer-based tools for creating, editing, and analyzing IC design layouts. EDA applications create layouts by using geometric shapes that represent different materials and devices on IC's. For instance, EDA tools commonly use rectangular lines to represent the wire segments that interconnect the IC components. These EDA tools also represent electronic and circuit IC components as geometric objects with varying shapes and sizes. For the sake of simplifying the discussion, these geometric objects are shown as rectangular blocks in this document. Also, in this document, the geometric representation of an electronic or circuit IC component by an EDA application is referred to as a "circuit module."

EDA applications typically illustrate circuit modules with electrical interface "pins" on the sides of the circuit modules. These pins connect to the interconnect lines, the "wiring" used to connect the various circuit modules. A collection of pins that are, or need to be, electrically connected is referred to as a net.

FIG. 1 illustrates a simple example of an IC layout 100. The IC layout 100 includes five circuit modules 105, 110, 115, 120, and 125 with pins 130–160. Four interconnect lines 165–180 connect these modules through their pins. In addition, five nets specify the interconnection between the pins. Specifically, pins 35, 45, and 60 define a three-pin net, while pins 30 and 55, and pins 40 and 50 respectively define two two-pin nets. As shown in FIG. 1, a circuit module (such as 105) can have multiple pins on multiple nets.

The IC design process entails various operations. FIG. 2 illustrates the overall process for laying out an integrated circuit device once the logical circuit design of the integrated circuit device has been completed. Some of the physical-design operations that EDA applications commonly help perform to layout an integrated circuit include: (1) floor planning (in step 210 of FIG. 2), which divides the integrated circuit layout area into different sections devoted to different purposes (such as ALU, memory, decoding, etc.); (2) placement (in step 220 of FIG. 2), which finds the alignment and relative orientation of the circuit modules; (3) global and detailed routing (in steps 230 and 240 of FIG. 2), which completes the interconnects between the circuit modules as specified by the net list; (4) compaction (in step 250 of FIG. 2), which compresses the layout in all directions to decrease the total IC area; and (5) verification (in step 250 of FIG. 2), which checks the layout to ensure that it meets design and functional requirements.

Referring to step 210 of FIG. 2, layout designers initially perform high-level floor planning. During the high-level floor planning, layout designers decide roughly where various large circuit blocks will be placed on the integrated circuit. The layout designers then perform a "placement" step 220. During the placement step, the layout designers place all the circuit cells into specific locations while following the high-level floor planning map of step 210. The placement step 220 is largely performed with the help of EDA tools that help select optimized placement. FIG. 3*a* illustrates an example of two large circuit modules 310 and 320 and two smaller circuit modules 330 and 340 placed onto an integrated circuit layout. The various circuit modules may be rotated ninety degrees as necessary to obtain a desired layout.

Operation (3), routing, is generally divided into two sub steps: global routing (step 230 of FIG. 2) and detailed routing (step 240 of FIG. 2). Global routing divides an integrated circuit into individual global routing areas. Then, a global routing path is created for each net by listing the global routing areas that the net must pass through. After global routes have been created, each individual global routing area is then processed with detailed routing. Detailed routing creates specific individual routing paths for each net within that global routing area.

Global routing is a step that is used to divide an extremely difficult overall routing problem into smaller routing problems in a "divide and conquer" approach. The overall task of routing an integrated circuit is to route together all electrically common signals on the integrated circuit. The global routing step divides an integrated circuit area into individual global routing areas and then determines the specific global routing areas that each electrically common signal must pass through. The list of circuit modules and pins that need to be connected for a specific electrically common signal is known as a net. The contiguous path through the global routing areas is known as a "global routing path" for that net. An example of global routing is provided with reference to FIGS. 3a and 3b.

Referring to FIG. 3a, there are three different electrically common signals A, B, and C. The electrical signal terminations for electrically common signals A, B, and C illustrated on FIG. 3a as marked dots. The electrical signal terminations are commonly referred to as "pins". Furthermore, the integrated circuit of FIG. 3a has been divided into sixteen different global routing areas that are labeled 01 to 16. For each electrically common signal, a net is created containing a list of all the global routing areas that have common electrical signal termination pins. Thus, for example, the net of electrical signal A is 01, 02, 08, and 12 since electrical signal A has termination pins in those labeled global routing areas.

After creating the various nets, global routing path lists are then constructed from the various nets. FIG. 3b illustrates the integrated circuit of FIG. 3a with the addition of global routing path lists and roughly sketched global routing paths. (The actual specific routing path is not determined during the global routing step, just the list of global routing areas that a signal must enter or pass through.) The global routing paths join together global routing areas in the nets with additional global routing areas such that all global routing areas in the global routing path list form a contiguous global routing path. Note that each net may have many different possible global routing paths. The Electronic Design Automation (EDA) software attempts to select the global routing paths that are close to optimal.

Referring back to the flow diagram of FIG. 2, detailed routing is performed at step 240 for the various global routing areas. In the detailed routing process, each electrical interconnect signal line that passes through or terminates within a particular global routing area must be given a specific routing path within that global routing area. Generally, detailed routing systems use a routing grid that specifies a very limited set of possible locations for the various electrical interconnect signals. Adjacent electrical interconnect signals in a gridded detailed routing system are separated by a worst-case distance that will ensure that adjacent electrical interconnect signals are not shorted together during the manufacturing process.

The routing example illustrated in FIGS. 3a and 3b requires several detailed routing tasks to be performed. For example, the detailed routing for global routing area 06 requires that electrical interconnect signal B pass from the left side to the right side of the global routing area and electrical interconnect signal C enter from the bottom and terminate at a pin on large circuit module 310. FIG. 3c illustrates an example of one possible detailed route for global routing area 06. Note that the detailed electrical interconnect signal routes illustrated in FIG. 3c follow the prescribed routing grid that is illustrated with dashed lines. The vertical and horizontal interconnect lines are on different layers such that there is no electrical connection at places where the interconnect wires cross unless a via has been created at that location. In most cases, many different possible detailed routing paths exist. For example, FIG. 3d illustrates just one alternate detailed electrical interconnect signal routing for global routing area 06 of the layout illustrated in FIGS. 3a and 3b.

Since the global routing step 230 divided the overall routing problem into many smaller routing problems, the detailed routing of each individual global routing area is simplified. If a particular detailed routing problem is unsolvable, the system may return to step 230 in order to get a different global routing solution and then attempt detailed routing on the new global routing solution. Thus, routing an integrated circuit is often an iterative process.

Referring back to FIG. 2, after the routing steps have been performed, the integrated circuit layout is tested and optimized at step 250. Common testing and optimization steps include extraction, verification, and compaction. The steps of extraction and verification are performed to ensure that the integrated circuit layout will perform as desired. Compaction allows designers to reduce the size of an integrated circuit design in order to improve performance. Furthermore, a compacted design lowers costs by allowing more integrated circuits to be produced for a given wafer size. Finally, the tested and optimized integrated circuit is manufactured at step 290. Note that problems may occur during various steps of the integrated circuit layout forcing the designers to return to earlier steps.

The task of routing a typical integrated circuit is a very difficult task due to the large number of interconnect lines that must be routed and the extremely large number of possible different routing paths. To simplify the routing task, most automated routing systems use a gridded system wherein the number of possible positions of interconnect signals is sharply limited to a specific set wiring grid. However, a gridless routing system that allows interconnect signal wires to be placed anywhere can provide better routing since it is not limited by the artificial routing grid restriction. Thus, to provide highly optimized interconnect line routing, it is desirable to implement gridless integrated circuit architectures.

SUMMARY OF THE INVENTION

The present invention introduces several methods for implementing gridless non Manhattan routing systems for integrated circuit manufacture. In a first embodiment, a gridless non Manhattan routing systems may be implemented by compacting a gridded non Manhattan design. In another embodiment, a gridless non Manhattan routing systems may be implemented by adapting a gridless Manhattan routing system by rotating a plane of a tile based maze router.

The present invention further discloses non Manhattan routing systems that use simulated Euclidean wiring. Entire routing layers may be implemented with arbitrary angle preferred wiring using simulated Euclidean wiring.

Other objects, features, and advantages of present invention will be apparent from the company drawings and from the following detailed description.

BRIEF DESCRIPTION OF THE DRAWINGS

The objects, features, and advantages of the present invention will be apparent to one skilled in the art, in view of the following detailed description in which:

FIG. 2 illustrates a flow diagram describing the steps performed when laying out an integrated circuit design.

FIG. 3b illustrates one possible global routing for the example integrated circuit of FIG. 3a.

FIG. 6a illustrates a first proposed gridded non Manhattan layer on top of a Manhattan routing grid.

FIG. 10a illustrates a gridded wiring system that separates interconnect lines by a worst-case distance.

FIG. 10b illustrates a section of detailed routing in a compacted gridless system.

FIG. 12 illustrates a flow diagram that describes one method of performing compaction on a routing layout that includes non Manhattan layers of interconnect lines.

FIG. 13l illustrates the layout section of non Manhattan interconnect wiring of FIG. 13a after it has been compacted.

FIG. 14 illustrates a sorted relative vertical position graph of all the horizontal and diagonal interconnect lines from FIG. 13a.

FIG. 15 illustrates a sorted relative horizontal position graph of all the vertical interconnect lines and diagonal interconnect lines from FIG. 13a.

FIGS. 16a to 16f illustrate the vertical compaction of interconnect lines around an obstacle.

FIG. 18a illustrates a first angled wire created with a gridded non Manhattan system.

FIG. 18b illustrates a second angled wire created with a gridded non Manhattan system.

FIG. 18c illustrates the angled wire of FIG. 18a created with a gridless non Manhattan system.

FIG. 18d illustrates a first angled wire with an angle between the angle of FIG. 18a and the angle of FIG. 18b created with a gridless non Manhattan system.

FIG. 18e illustrates a first angled wire with an angle between the angle of FIG. 18a and the angle of FIG. 18b created with a gridless non Manhattan system.

FIG. 18f illustrates the angled wire of FIG. 18b created with a gridless non Manhattan system.

DETAILED DESCRIPTION OF THE PREFERRED EMBODIMENT

Figure 1:
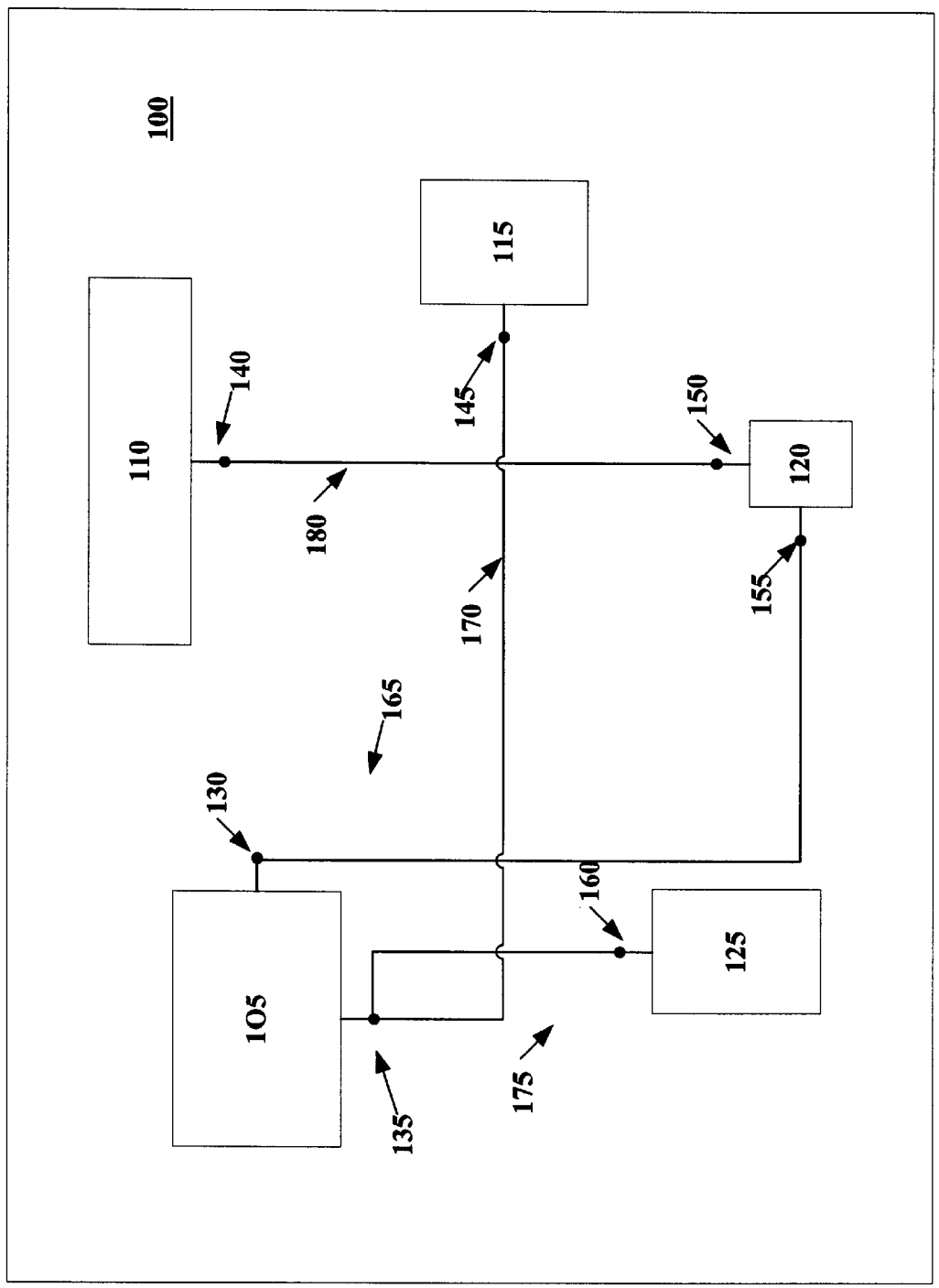
FIG. 1 illustrates an example of an integrated circuit layout.
Figure 3A:
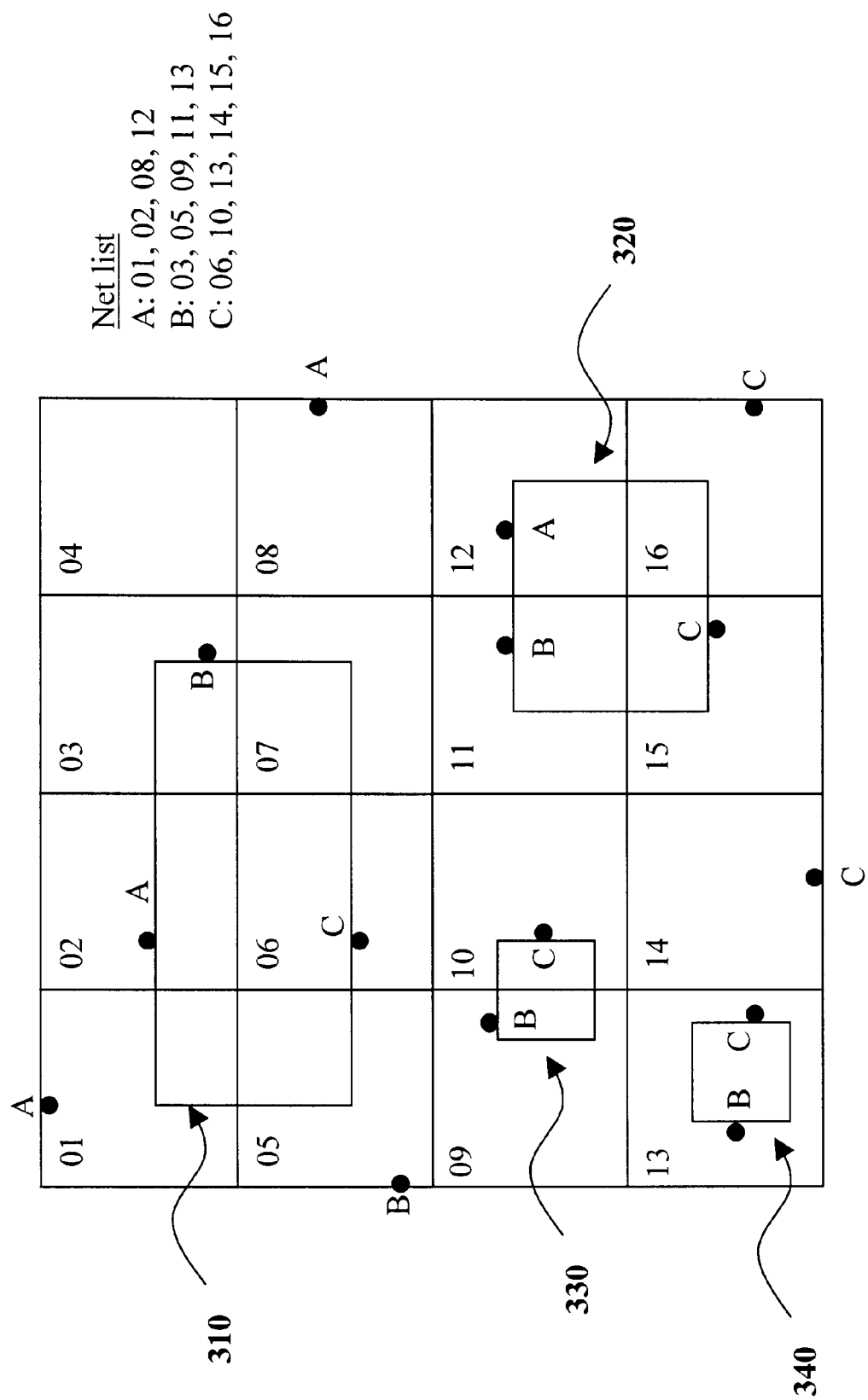
FIG. 3a illustrates an example of circuit placement for an integrated circuit layout along with nets for common electrical signals.
Figure 3B:
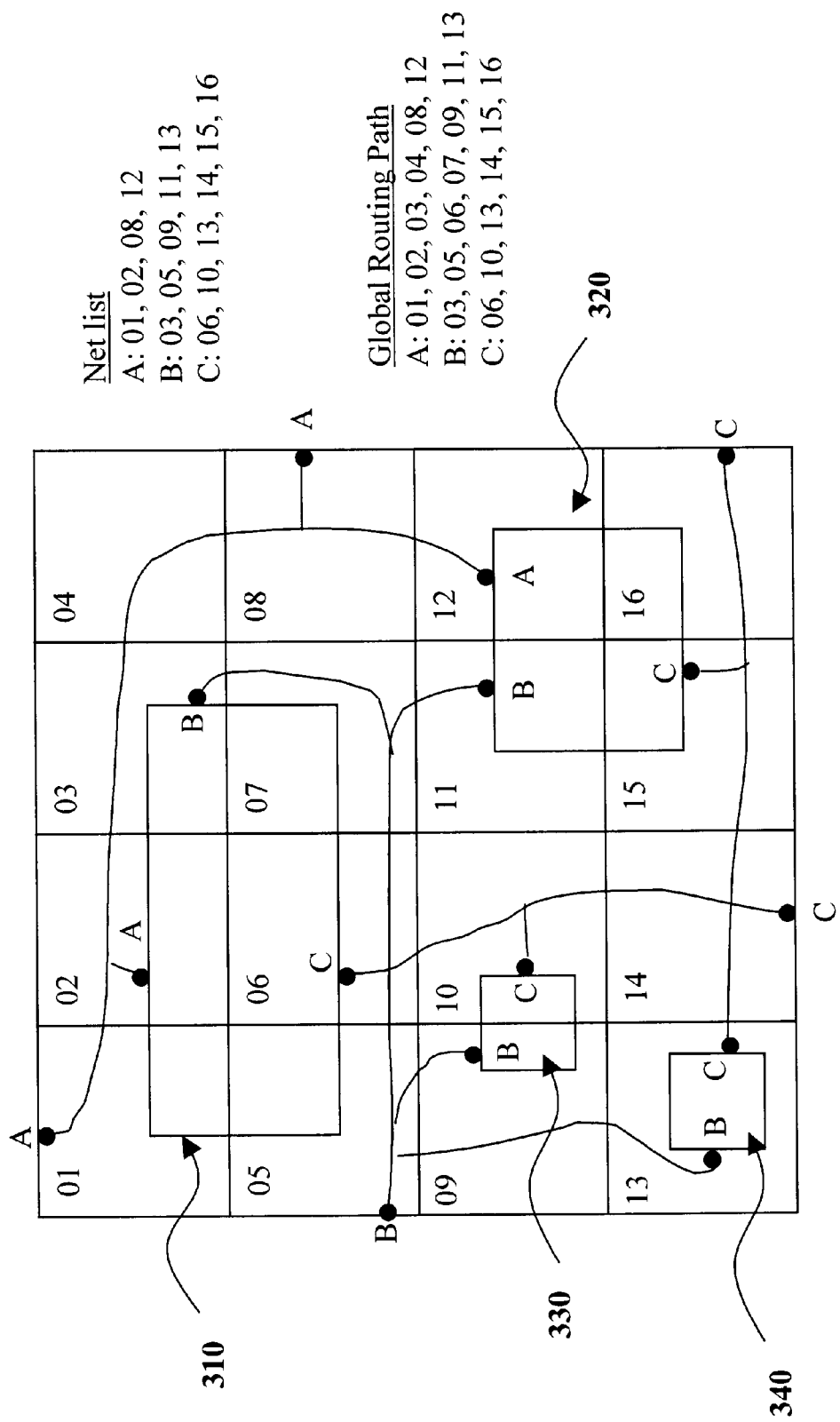
Figure 3C:
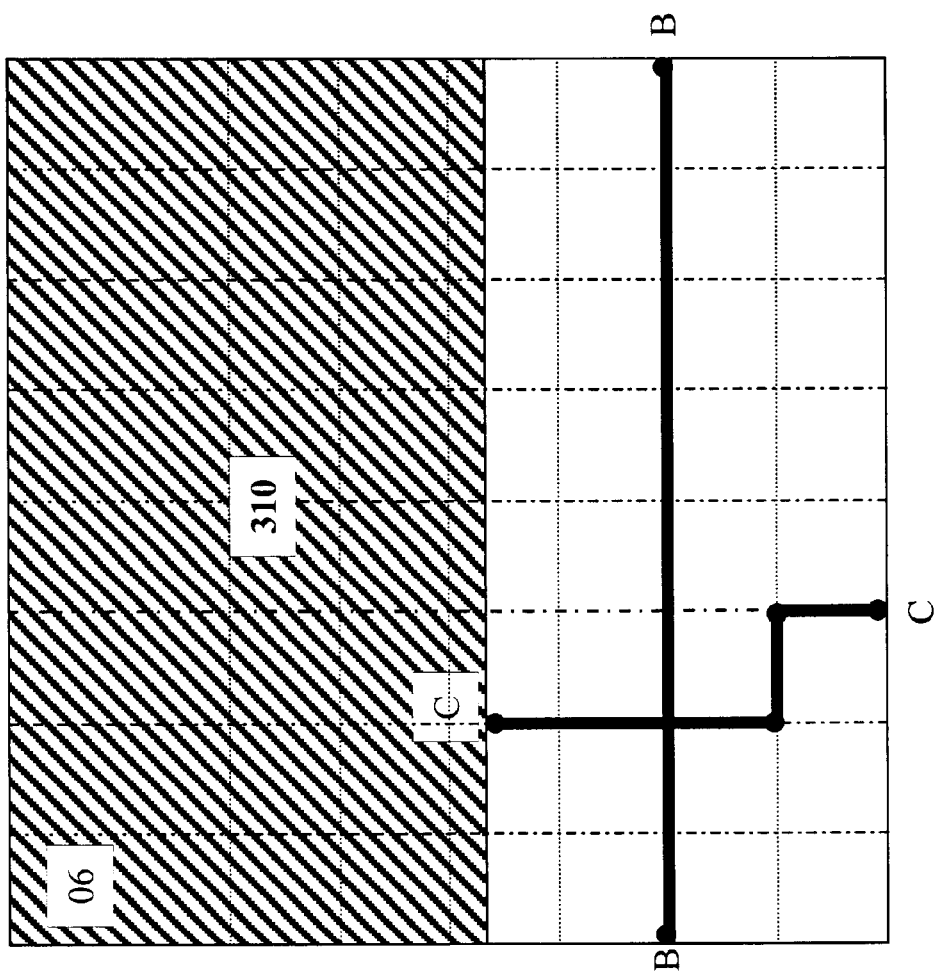
FIG. 3c illustrates one possible detailed route for global routing area 06 of the example integrated circuit of FIG. 3b.
Figure 3D:
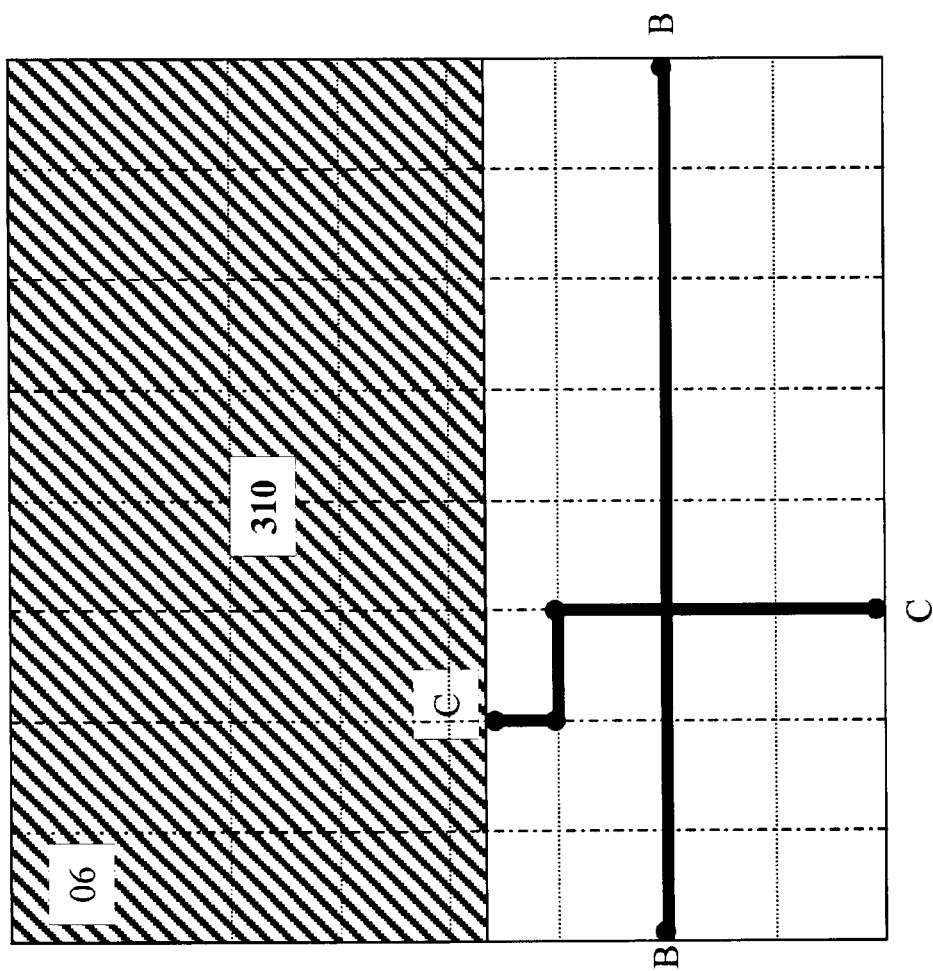
FIG. 3d illustrates one possible detailed route for global routing area 06 of the example integrated circuit of FIG. 3b.

Gridless non Manhattan integrated circuit ("IC") architectures and methods for designing and manufacturing gridless non Manhattan integrated circuits are disclosed. In the following description, for purposes of explanation, specific nomenclature is set forth to provide a thorough understanding of the present invention. However, it will be apparent to one skilled in the art that these specific details are not required in order to practice the present invention. For example, the present invention has mainly been described with reference to a non Manhattan routing system that uses two layers of orthogonal 45° angle wiring and a non Manhattan routing system that uses plus 60° angle wiring and negative 60° wiring. However, the same techniques can easily be applied to many other types of gridless non Manhattan routing systems.

Routing Architectures

Most existing semiconductors use the "Manhattan" wiring model that specifies alternating layers of preferred-direction horizontal and vertical wiring. In the Manhattan wiring model, the majority of the interconnect signals are horizontal or vertical. However, occasional diagonal jogs are sometimes allowed on the preferred horizontal and vertical layers.

The Manhattan wiring model has proven to be useful, but it is certainly not optimal. Distant pins must often be connected by long stretches of connected horizontal and vertical interconnect signals. To provide a more optimal system, a related patent application title "Multi-Directional Wiring On A Single Metal Layer", filed on Dec. 12, 2000 and having Ser. No. 09/733,104, incorporated by reference, uses a non Manhattan wiring model that uses diagonal wiring as a "preferred" direction for some layers. For purposes of nomenclature, a "preferred" direction is defined as the direction that at least 40 percent of the wires are configured. Interconnect lines are considered "diagonal" if they form an angle other than zero or ninety degrees with respect to the layout boundary of the IC.

In one embodiment, the diagonal wiring consists of wires deposed at plus 45 degrees or minus 45 degrees (referred to herein as "octalinear"). This architecture is referred to as octalinear wiring in order to convey that an interconnect line can traverse in eight separate directions from any given point. In another embodiment, wires are deposed at plus 60 degrees or minus 60 degrees (referred to herein as "hexalinear"). Although the use of the diagonal wiring in the present invention is described in conjunction with wires arranged at plus 45, minus 45, plus 60, and minus 60 degrees; any angle offset from zero and 90 degrees (horizontal or vertical) may be used as diagonal wiring without deviating from the spirit or scope of the invention. In one embodiment, the preferred wiring angle is selected based upon the needed interconnections.

In general, metal layers on integrated circuit are typically organized in perpendicular metal layer pairs. The use of perpendicular metal layer pairs minimizes wiring distances by minimizing the number of layers a wire or via must transverse to get to a layer with wires disposed in an orthogonal direction. In addition, the use of perpendicular wiring in adjacent layers eliminates wires routed in parallel on adjacent layers, thus reducing electrical coupling between metal layers and minimizes noise interference.

Some embodiments of the present invention are described using "complementary" pairs of wiring layers. As used herein, complementary pairs refer to two wiring layers with a preferred wiring direction perpendicular to one another or close to perpendicular to each other. For example, a complementary layer to a vertical wiring layer is a horizontal wiring layer. In diagonal wiring, a complementary direction to a plus 45 degree wiring direction is a negative 45 degree wiring direction. Similarly, a complementary direction to a negative 60 degree wiring direction may be a plus 60 degree wiring direction. An alternate embodiment may have a complementary direction to a negative 60° wiring direction as a plus 300 wiring direction.

Figure 4A:
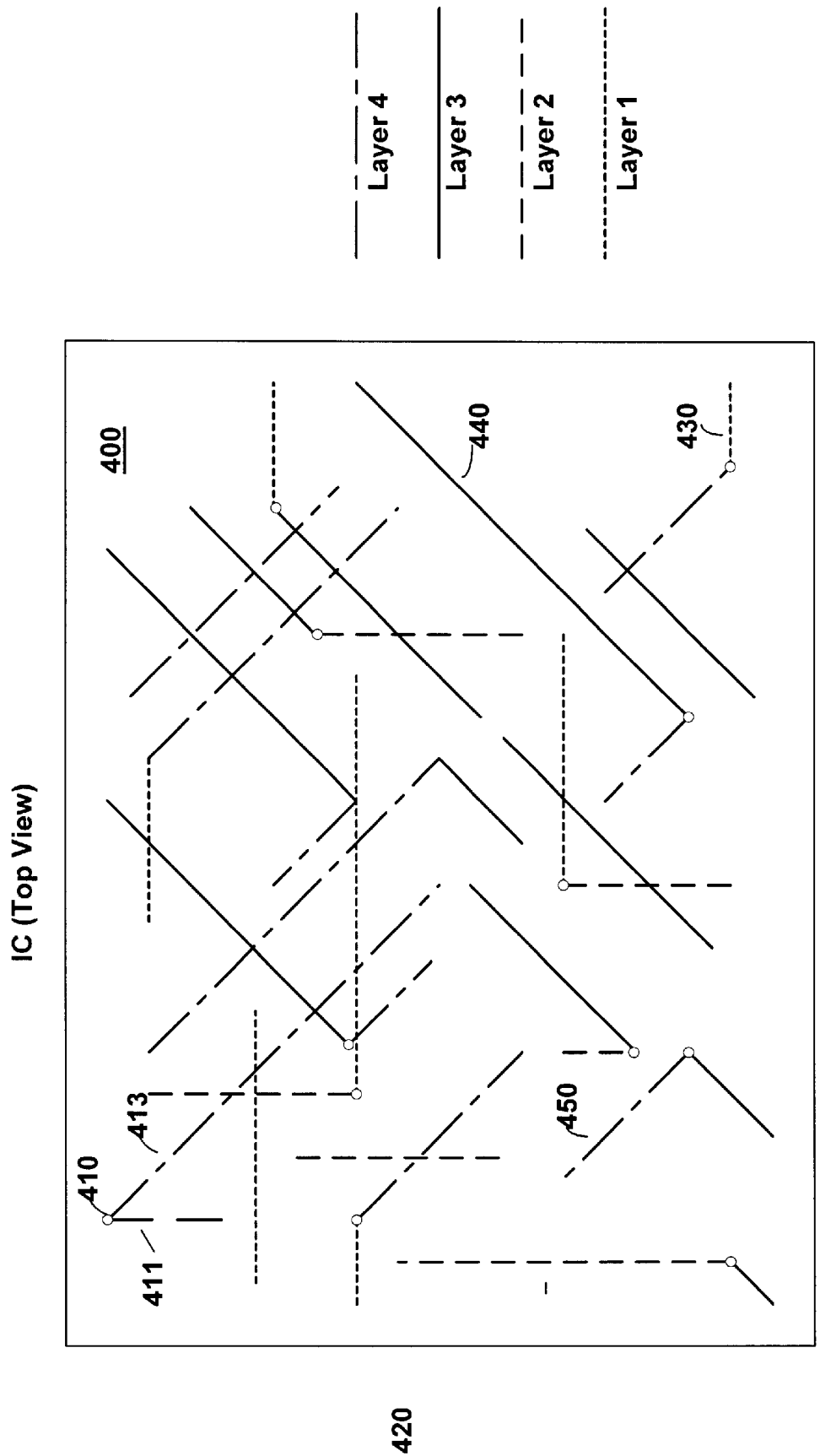
FIG. 4a illustrates the top view of a multiple layer integrated circuit that uses a non Manhattan diagonal wiring model.

FIG. 4a illustrates the top view of an example integrated circuit ("IC") that has multiple metal layers wherein some of the metal layers employ diagonal wiring. In the embodiment of FIG. 4a, the IC layout utilizes horizontal, vertical, and 45° diagonal interconnect line layers. The horizontal interconnect lines are the lines that are parallel to the x-axis (i.e., the horizontal lines are at 0° to the x-axis and parallel to the length of the layout). The vertical interconnect lines are the lines that are perpendicular to the x-axis (i.e., the vertical lines are at 90° to the x-axis). Furthermore, in the embodiment of FIG. 4a, one set of diagonal lines (layer 3) are at +45° with respect to the length of the IC layout, while another set (layer 4) are at −45° with respect to the length of the IC layout.

In the particular example of FIG. 4a, there are four metal (or wire) layers that carry interconnect signals. As shown in FIG. 4a, the horizontal wires in layer one are designated with the short dashed line, the vertical wires in layer two are designated with a longer dashed line, the +45° diagonal wires in layer three are designated with a solid line, and the −45° diagonal wires in layer four are designated with alternating long-short dashed lines. The wires on different nets in a specific layer generally do not touch or cross other wires in that same layer since that would cause an electrical short of the two nets. However, an occasional "zag" may not follow the preferred wiring direction.

As shown in FIG. 4a, layer one wires, such as wire 130, have a predominant or "preferred" horizontal direction. The wires in layer one are situated horizontally such that the wires run parallel to the top and bottom of integrated circuit 100. The wires in layer two have a preferred vertical direction (e.g., wire 120 is situated in a vertical direction relative to the top and bottom of the integrated circuit chip 100). Thus, for this example, metal layers one and two are Manhattan layers with horizontal and vertical preferred directions, respectively.

For the example of FIG. 4a, layers three and four employ diagonal wiring. Specifically, layer three has a preferred diagonal direction (i.e., plus 45°) relative to the top and bottom of integrated circuit 100. Interconnect wire 140 is an example layer three wire that is oriented in a diagonal direction. Layer four has a preferred diagonal direction that is negative 45° relative to the top and bottom of integrated circuit 100. Interconnect wire 150 is example of a layer four wire situated at minus 45°.

The example embodiment of FIG. 4a also includes a plurality of vias. In general, vias provide an electrical conductor between metal layers to permit routing between the metal layers in the integrated circuit. The circles illustrated in FIG. 4a depict vias that connect interconnect wires on different metal layers. For example, via 110 electrically connects a vertical wire 111 on layer two to a diagonal wire 113 on layer four. Similarly, several vias are shown in the example of FIG. 4a to couple wires: between Manhattan layers, between diagonal layers, and between Manhattan and diagonal layers.

Figure 4B:
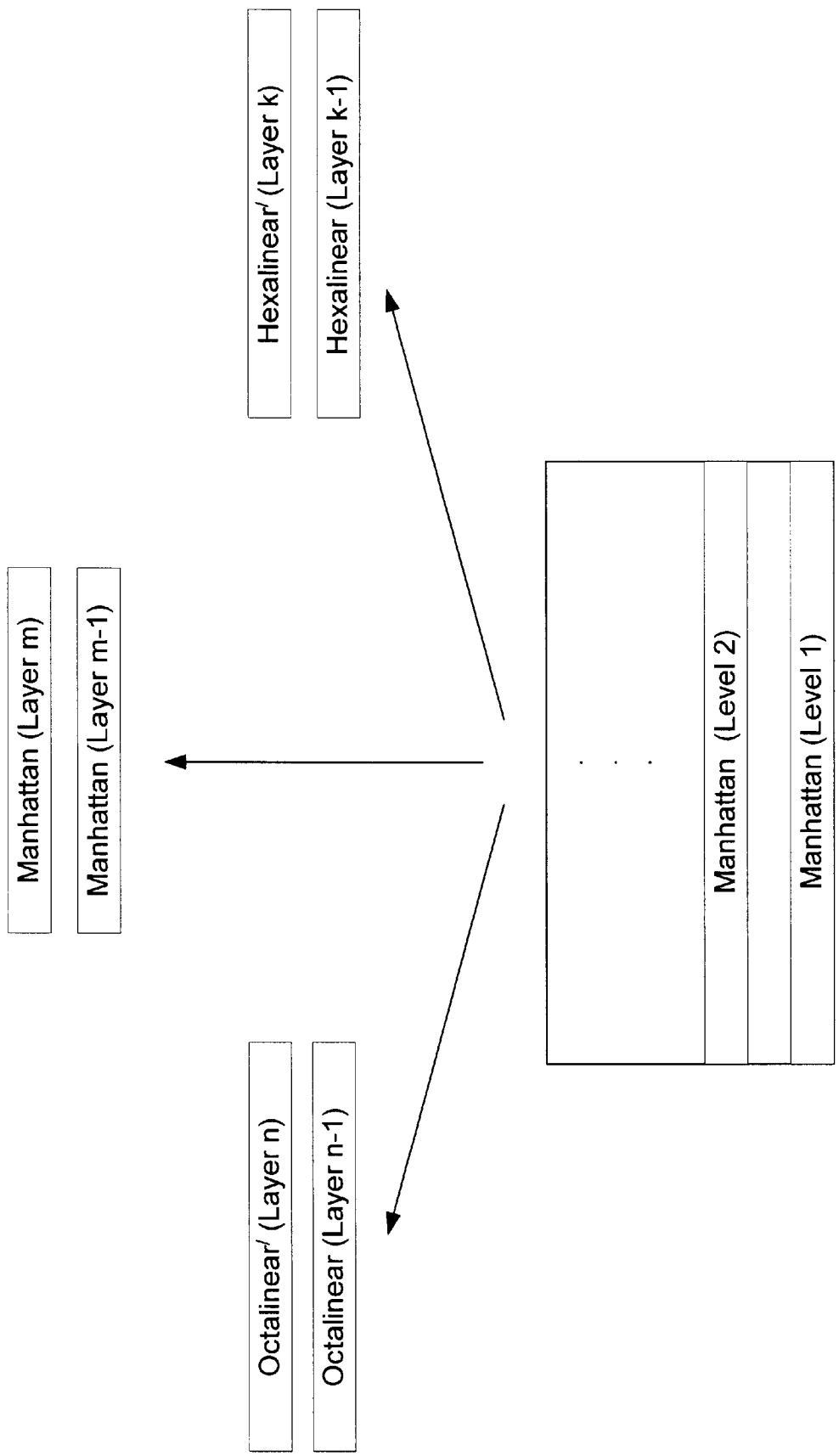
FIG. 4b illustrates a side view of various different types of multiple layer integrated circuits that start with two Manhattan layers.

The use of diagonal wiring more efficiently routes wires in an integrated circuit by reducing the length of the required interconnect wires. Many different combinations of wiring layers may be used. FIG. 4b illustrates a variety of multiple layer wiring configurations. Specifically, FIG. 4b illustrates a side view of an integrated circuit implemented using Manhattan geometries for the first two metal layers (layers one and two). In one embodiment, level one has a preferred horizontal direction and level two has a preferred vertical direction that is complementary to the horizontal direction of level one. In alternate embodiment, level one has a preferred vertical direction and level two has a preferred horizontal direction that is complementary to the vertical direction of level one. The use of horizontal and vertical preferred directions for layers one and two is desirable since many existing circuit libraries are designed for integrated circuits that will have horizontal and vertical preferred wiring for layers one and two. As illustrated in FIG. 4b, many different types of metal layers may be placed on top of the first two Manhattan metal layers.

Figure 4C:
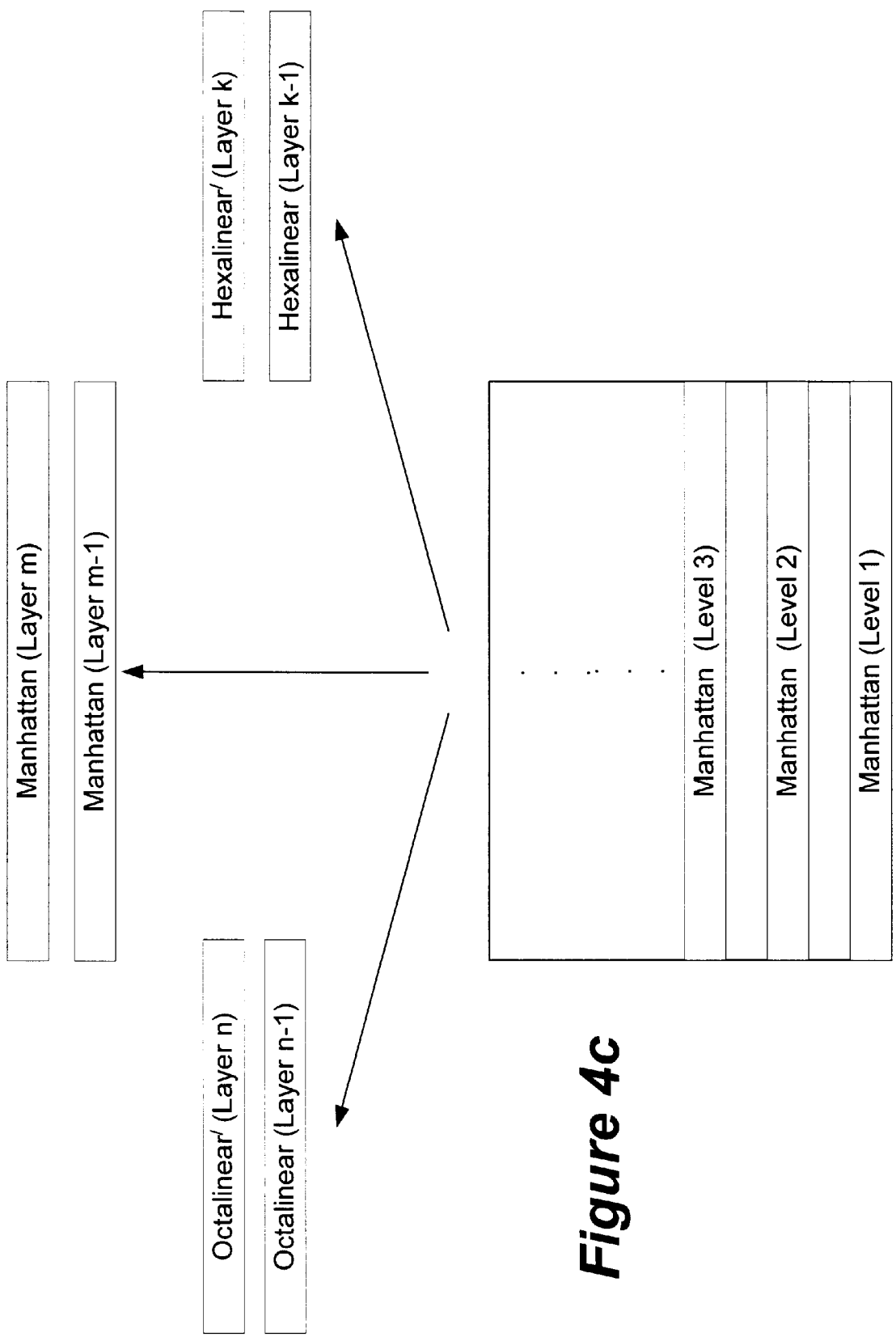
FIG. 4c illustrates a side view of various different types of multiple layer integrated circuits that start with three Manhattan layers.

FIG. 4c illustrates a side view of an integrated circuit implemented using Manhattan geometries for the first three metal layers (layers one, two, and three). The use of horizontal and vertical preferred directions for the first three layers is desirable since some complex libraries are designed for integrated circuits that have three Manhattan layers. The first three layers may be horizontal, vertical, horizontal (HVH); or vertical, horizontal, vertical (VHV).

Non Manhattan Routing

Most place and route EDA systems use a "gridded" Manhattan routing architecture wherein the interconnect signal lines are only placed onto a predefined two-dimensional routing "grid" of horizontal and vertical routing paths that is imposed by the routing system. The routing grid defines a specific set of paths (or channels) that may carry an interconnect signal line. The possible routing paths of the routing grid are separated by a defined worst-case minimum distance that ensures that adjacent signal lines will not be shorted together during the manufacturing process.

Non Manhattan Wiring

Figure 5:
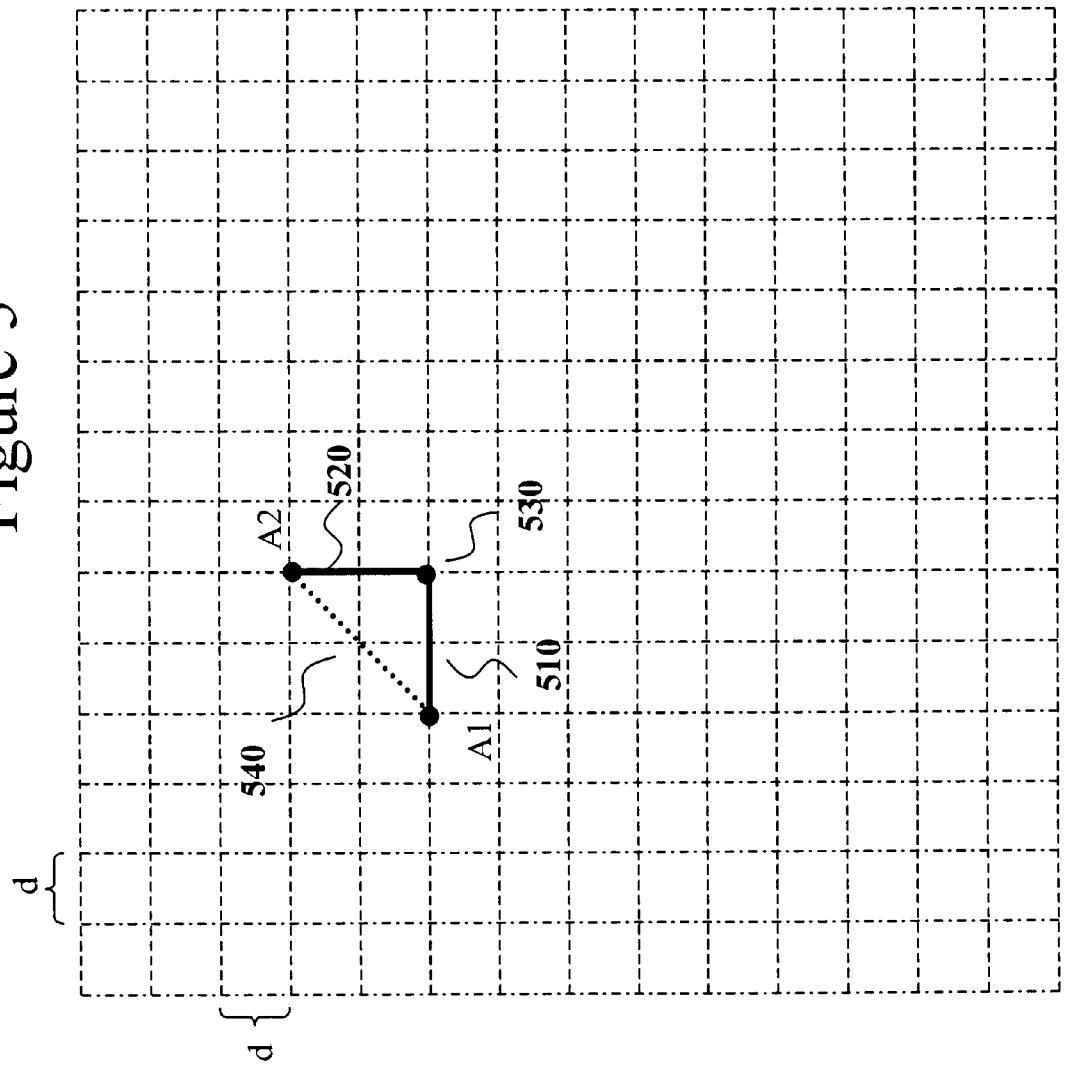
FIG. 5 illustrates an example of a Manhattan routing grid with example electrical signal lines.

The horizontal and vertical lines of FIG. 5 define an example routing grid in a Manhattan based routing system. Thus, to connect any two points in a gridded system, a path along the horizontal and vertical routing grid lines must be chosen. For example, to connect point A1 to point A2 on the routing grid of FIG. 5, horizontal interconnect line 510 and vertical signal line 520 may be used. The horizontal interconnect line 510 and vertical interconnect line 520 segments are generally on different metal layers and are connected by a via 530. In a gridded routing system, vias are generally required to be at the grid intersections such that horizontal and vertical signal lines may be interconnected.

To shorten the interconnect signal paths and allow higher density wiring, a gridded non Manhattan wiring system allows point A1 to be connected to point A2 with a diagonal interconnect line 540. However, it should be noted that the diagonal interconnect signal lines of the non Manhattan layers in a gridded system should also pass through the same routing grid intersections such that the interconnect lines of the non Manhattan layers may be connected to the signal lines of the Manhattan layers. As illustrated in FIG. 5, the distance along diagonal interconnect line 540 is shorter than the distance along horizontal interconnect line 510 and vertical interconnect line 520. Thus, an integrated circuit built with diagonal interconnect line 540 would exhibit a shorter propagation delay along diagonal interconnect line 540 than an integrated circuit built with horizontal interconnect line 510 and vertical interconnect line 520.

Gridded Non Manhattan Routing

FIG. 6a illustrates a grid for the Manhattan layers with a few diagonal lines for a proposed 45° angle non Manhattan layer. Note that all the proposed 45° angle non Manhattan layer interconnect lines pass through the intersection points of the Manhattan layer interconnect lines. However, the distance between the proposed adjacent 45° angle interconnect lines is less than the minimum distance requirement "dmin". (Specifically, the distance between the adjacent proposed 45° angle interconnect lines is $dmin/\sqrt{2}$.) Thus, the proposed 45° angle non Manhattan layer of FIG. 6a will cannot be manufactured reliably.

Gridded Non Manhattan Wiring with Exact Intersection Vias

Figure 6B:
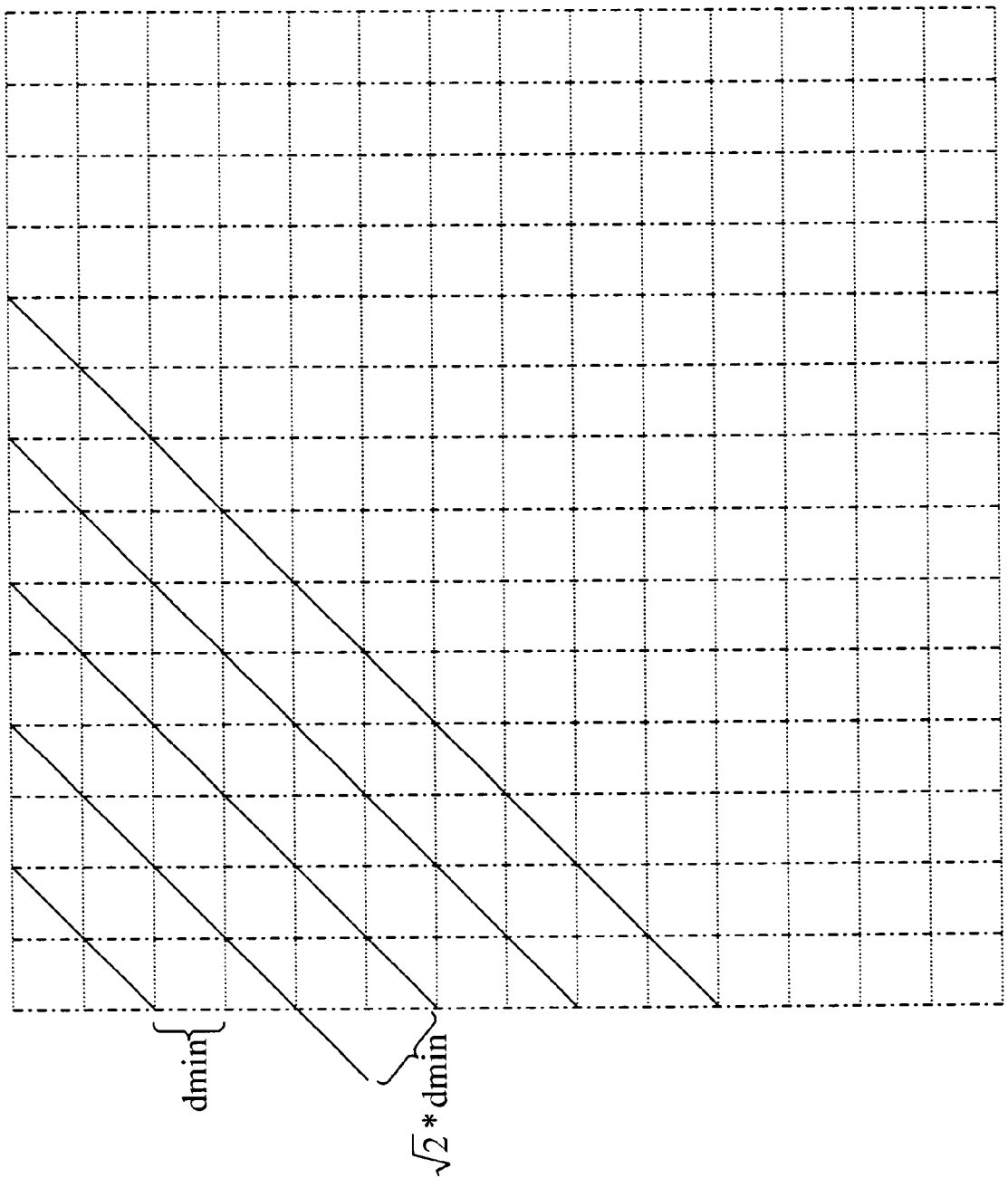
FIG. 6b illustrates a second proposed gridded non Manhattan layer on top of a Manhattan routing grid.

To have a gridded 45° angle non Manhattan layer operate properly, the adjacent 45° angle interconnect lines must be separated by a distance greater than or equal to minimum distance "dmin". Thus, FIG. 6b illustrates a functional gridded 45° angle non Manhattan layer wherein the distance between adjacent parallel signal lines is $\sqrt{2}*dmin$ in order to satisfy the minimum distance "dmin" requirement. The gridded 45° angle non Manhattan layer illustrated in the lower right of FIG. 6b is less than optimal since the interconnect line density is significantly lower than the gridded Manhattan layers. However, the interconnect line density may be greatly improved using compaction as will be described in detail in a later section of this document.

Gridded Non Manhattan Wiring with Inexact Intersection Vias

Figure 7:
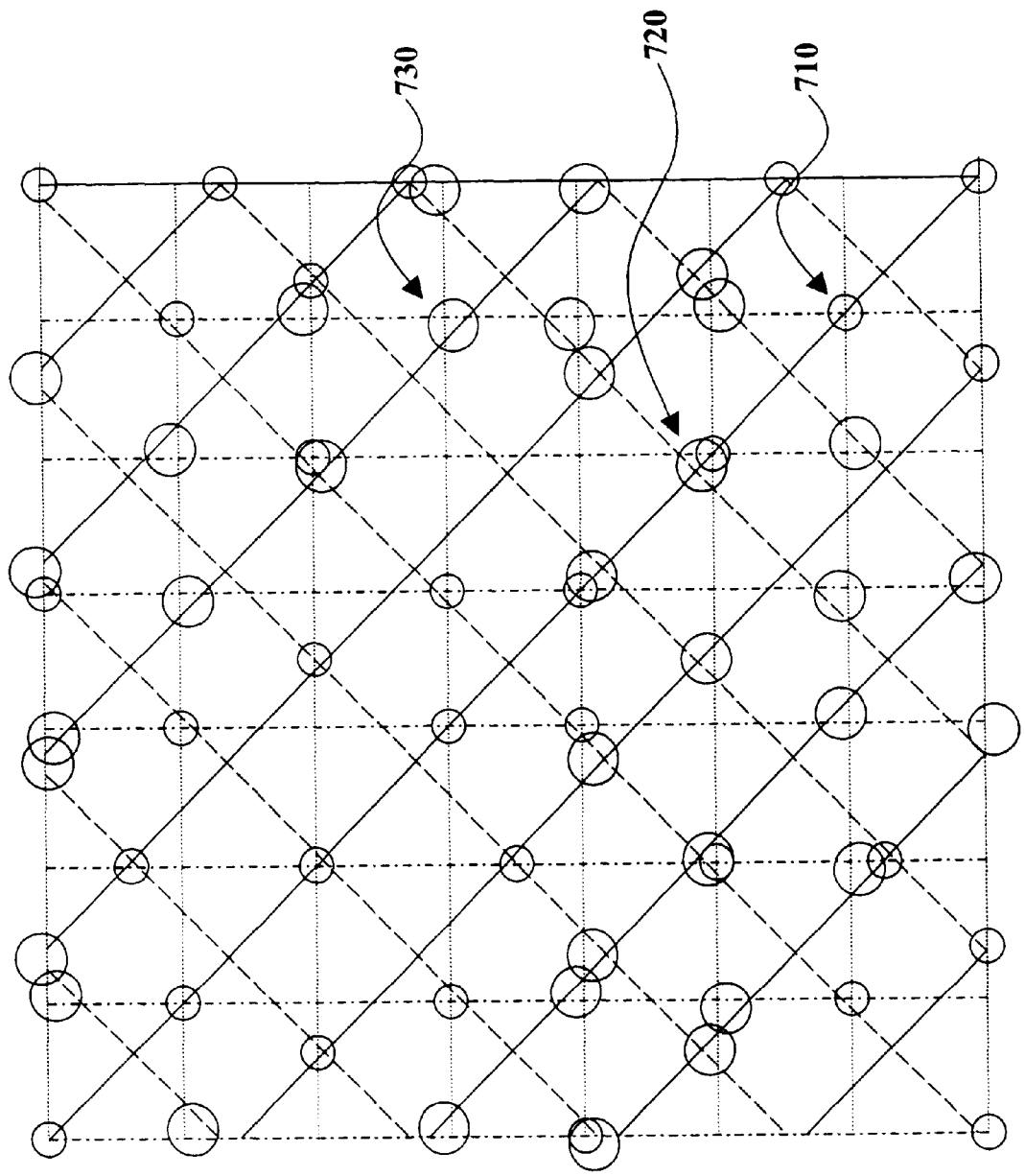
FIG. 7 illustrates an example of a 45° angle diagonal routing grid that has been superimposed on a Manhattan routing grid wherein both routing grids have the same pitch.

In an alternate gridded non Manhattan system, the gridded non Manhattan wiring layers are arranged in a manner that does not explicitly attempt to align the non Manhattan interconnect grid lines with the intersections of the Manhattan grid layers. FIG. 7 illustrates such an alternate gridded non Manhattan wiring embodiment. In the embodiment of FIG. 7, a +/−45° angle diagonal routing grid has been superimposed on a standard horizontal and vertical Manhattan routing grid. (Note that each different wiring direction is on an independent wiring layer.) Both the Manhattan routing grid (horizontal and the non Manhattan (+/−45° angle diagonal, in this example) routing grid have the same grid pitch. Thus, the diagonal interconnect lines do not all line up with the intersections of the Manhattan routing grid layers.

However, by examining the Manhattan routing grid and the non Manhattan routing grid of FIG. 7, it can be seen that at a large number of locations, three or more interconnect grid lines align very closely. Each of these positions has been marked with a small circle. At such positions, a via could be created thus allowing any of those three (or four) interconnect lines to be coupled. For example, at location 710, an interconnect line from the horizontal, vertical, or −45° diagonal interconnect layer can be coupled together. Thus, although not every intersection is available for connecting different layers, a sufficient number of vias positions are available to allow such a gridded non Manhattan routing system to be very useful. It should be noted that most grid layer intersections do not have vias for connecting the layers.

Close Intersection via Connections with Zags

In addition to the locations where three or more interconnect lines meet, there are several locations where three or more interconnect lines come relatively close to intersecting. The larger circles on FIG. 7 highlight these situations. At such locations, a small section of interconnect line may go in a direction other than the layer's preferred direction to couple that interconnect line to a via. For example, the area indicated by large circle 720 is an area where three of the interconnect lines intersect and a fourth interconnect line is relatively close. An enlarged view of the situation in circle 720 is illustrated in FIG. 8.

Figure 8:
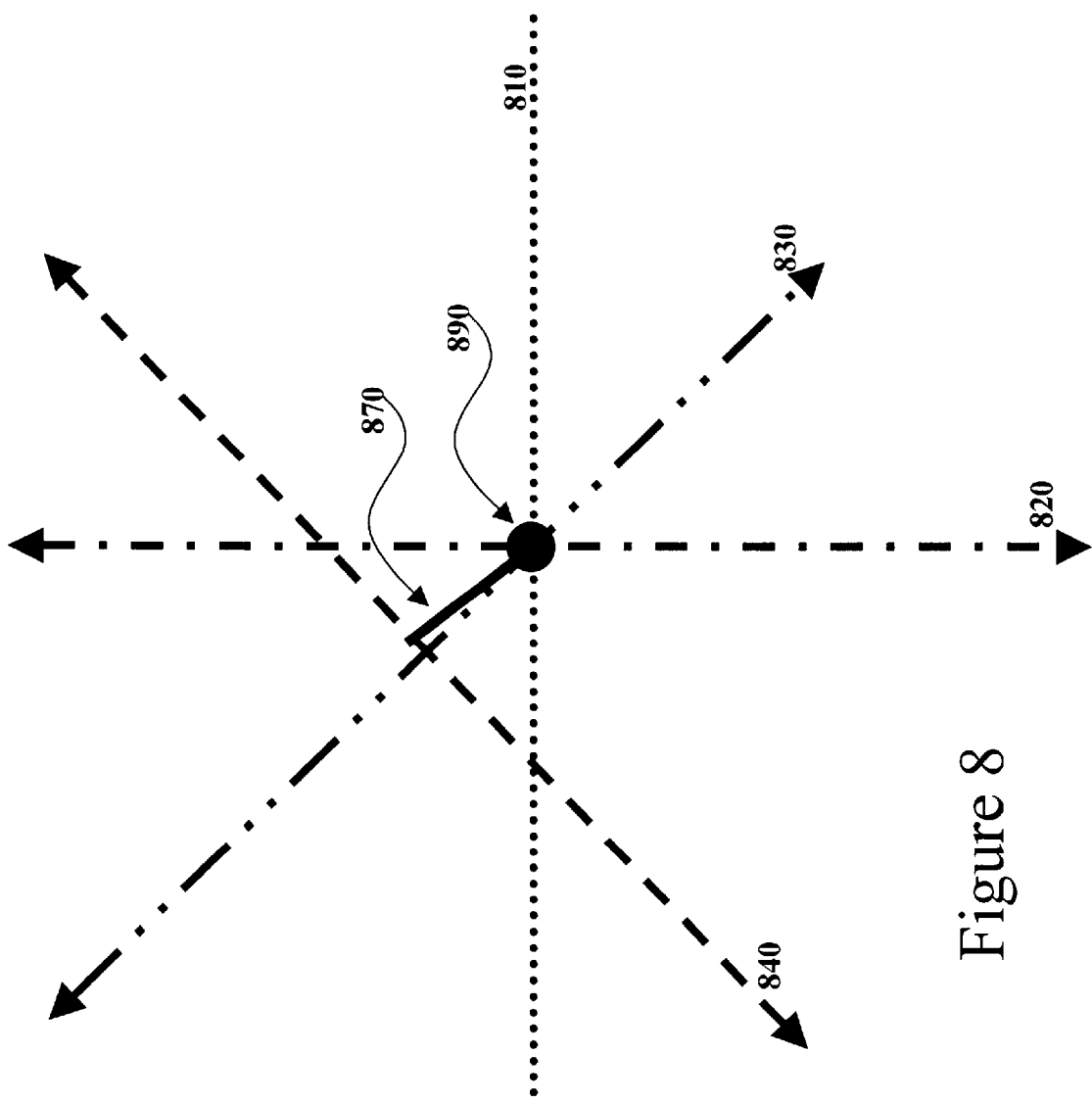
FIG. 8 illustrates an example of a situation where three interconnect lines intersect and a fourth interconnect line is relatively close.

As illustrated in FIG. 8, a horizontal interconnect line 810, a vertical interconnect line 820, and a first diagonal line 830 all intersect at a good via location 890. Thus, a via at location 890 could connected any of those three layers. A second diagonal interconnect line 840 is relatively close to the via at location 890 but does not intersect it. To connect the second diagonal interconnect line 840 a short diagonal "zag" 870 (an interconnect line that is not in the layer's preferred direction) connects second diagonal interconnect line 840 to the via at location 890. Thus, even in situations where the interconnect lines do not exactly align to form an intersection, a via may be used if the interconnect lines are sufficiently close to each other such that a zag can be used to connect interconnect lines that do not exactly cross the intersection.

Referring back to FIG. 7, it can be seen that in a gridded non Manhattan system there are a sufficiently large number of situations where the interconnect lines are close enough that a requirement of aligned via locations is not necessary. Not that the situations wherein the grid lines from different layers intersect at exactly the same position (such as location 710) are a special case wherein the needed "zag" is of length zero.

Opportunistic Connection Gridded System

A gridded non Manhattan routing system may relax the requirement that all interconnect lines meet as specific grid points. Such a system may instead allow any desired routing grid for any layer provided that it meets the minimum distance guidelines. In such a system, the gridded routing system may keep track of every location where interconnect lines from different layers cross each other. At any such crossing location, the gridded non Manhattan routing system may create a via to electrically couple the interconnect wires on those two layers provided that no interconnect line on any other layer is affected by the via. Such a system may be referred to as an "opportunistic connection gridded system."

Figure 9:
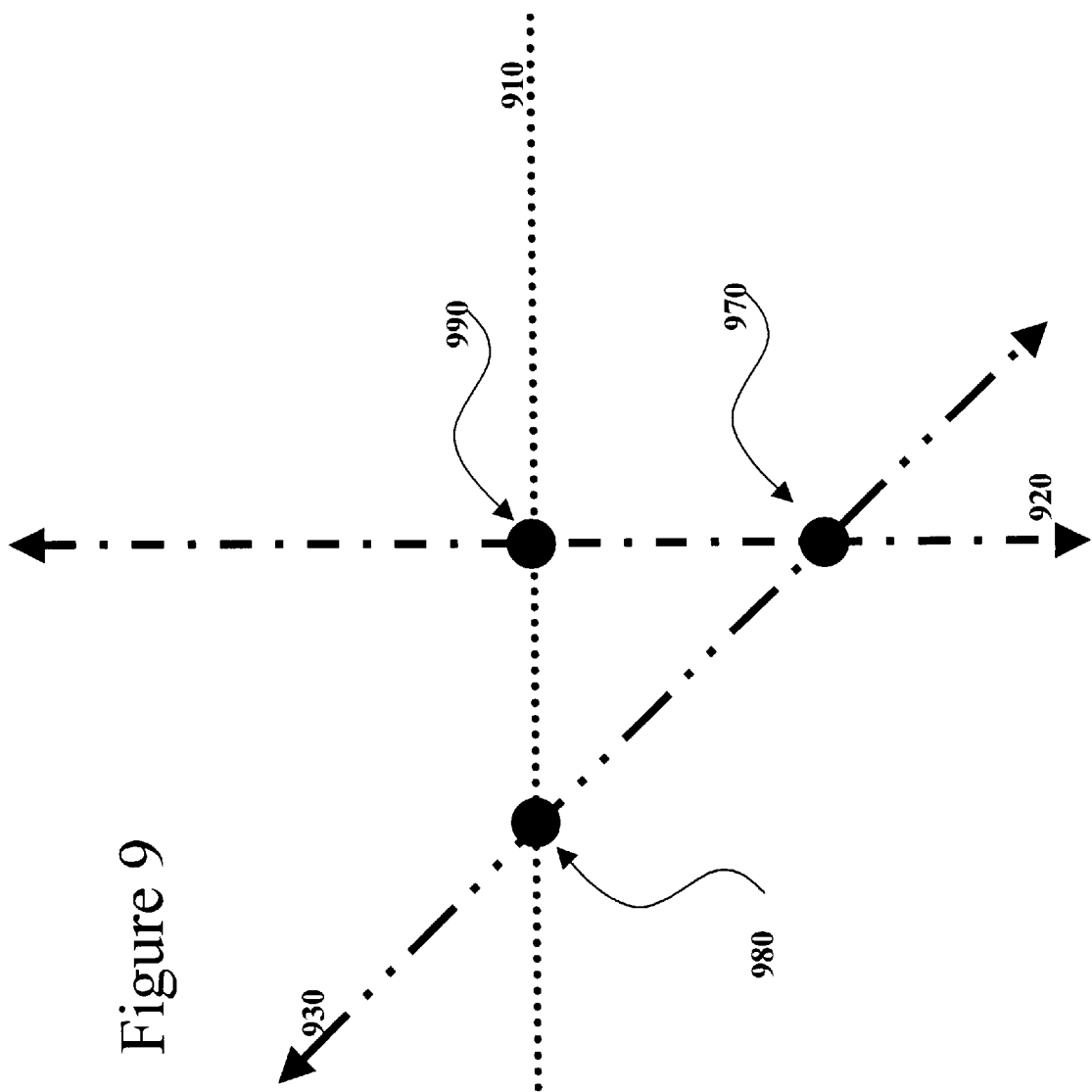
FIG. 9 illustrates a close-up view of the area indicated by large circle 730 in FIG. 7.

Referring to FIG. 7, the area indicated by large circle 730 is an area where three of the gridded interconnect lines on three different layers come relatively close to intersecting. FIG. 9 illustrates a close-up view of the area indicated by large circle 730 in FIG. 7. As illustrated in FIG. 9, there is no single location where all three interconnect lines intersect.

However, an "opportunistic connection" routing system can make electrical connections between any of the three interconnect line layers as illustrated in FIG. 9 where there is an opportunity for such a connection. Specifically, horizontal interconnect line 910 on the horizontal layer and vertical interconnect line 920 on the vertical layer may be connected by a via at location 990; horizontal interconnect line 910 on the horizontal layer and diagonal interconnect line 930 on the diagonal layer may be connected by a via at location 980; and vertical interconnect line 920 on the vertical layer and diagonal interconnect line 930 on the diagonal layer may be connected by a via at location 970. Thus, a sophisticated gridded non Manhattan "opportunistic connection" routing system may be implemented by determining where any two interconnect lines on different layers cross each other and placing vias in such locations as necessary to implement the desired interconnections.

Gridless Non Manhattan Routing Architecture

To improve upon the interconnect line density, the present invention further proposes a gridless non Manhattan routing architecture. The gridless non Manhattan routing architecture does not restrict the placement of interconnect signal lines to specific paths on a routing grid. In a gridless non Manhattan routing system, interconnect wires may be placed in almost any position and at almost any angle provided that the interconnect wires are placed far enough apart so that the interconnect wires can be manufactured reliably and there is not undesired interference between nearby interconnect wires.

One slight limitation on interconnect wiring placement is that a "manufacturing grid" imposed by the integrated circuit manufacturing process slightly limits the placement locations of interconnect wiring. However, the manufacturing grid is generally not much of a limitation since the pitch of the manufacturing grid is generally much smaller than the width of an individual interconnect wire. For example, the manufacturing grid may be on the order of 1 nanometer while the width of an individual interconnect wire may be an order of magnitude larger.

Gridless Routing Advantages

A gridless routing system provides interconnect line density improvement over a gridded system on all wiring layers. The reason for this is that gridded routing systems are based upon a worst cast assumption. For example, FIG. 10a illustrates a detailed Manhattan routing grid for a global routing area. The routing grid of FIG. 10a contains two interconnect signals 1010 and 1020. To the two different electrical interconnect signals from being connected together, the conductors associated with interconnect signals 1010 and 1020 must be separated by at least a minimum distance of dmin such that the integrated circuit may be manufactured reliably. However, the interconnect signals 1010 and 1020 may also have adjacent "landing pads" 1015 and 1025 for vias as illustrated in FIG. 10a. Thus, the interconnect signals 1010 and 1020 must be separated by a wider "worst case" distance dpitch(gridded) that ensures a minimum distance of dmin between the two adjacent via landing pads 1015 and 1025 illustrated in FIG. 10a. The gridded system with the spacing illustrated in FIG. 10a is known as gridded system with "via-to-via" spacing.

Thus, as illustrated in FIG. 10a, a via-to-via gridded wiring system must separate interconnect lines by the wide worst-case distance of Dpitch(gridded) since the two adjacent interconnect signals 1010 and 1020 may have adjacent via landing pads 1015 and 1025 as illustrated in FIG. 10a. This worst case scenario wastes space when the worst case is not present. For example, in a gridded system, adjacent interconnect signals 1013 and 1022 with non adjacent via landing pads 1017 and 1027 must still be separated by the wide worst-case distance of Dpitch(gridded) even though this creates a space much larger than dmin between any conductor associated with interconnect signals 1013 and 1022.

With a gridless system, the potential worst-case scenarios do not have hinder the entire integrated circuit layout. FIG. 10b illustrates a section of detailed routing in a gridless system. (A routing grid is illustrated in FIG. 10b to allow comparisons between the gridless system of FIG. 10b and the gridded system of FIG. 10a.) Referring to FIG. 10b, when two adjacent interconnect lines 1030 and 1040 have non adjacent landing pads 1035 and 1045, those interconnect lines 1030 and 1040 can be placed adjacent with a pitch of Dpitch(gridless1) that is smaller than Dpitch(gridded) of FIG. 10a. Thus, an improved wiring density is achieved with a gridless system. The pitch of Dpitch(gridless1) ensures that the minimum distance dmin exists between the landing pad 1035 and interconnect line 1040.

Certain gridded systems allow the closer spacing illustrated by the Dpitch(gridless1) example in FIG. 10b by forbidding vias to be ever be adjacent to each other. Such a gridded routing system is a known as a gridded routing system with "line-to-via" spacing. A line-to-via spacing gridded routing system provides better interconnect line density than a via-to-via gridded routing system. However, this improved density comes at the expense of completely forbidding adjacent vias.

A gridless routing system can provide even further improved interconnect line density than a line-to-via gridded system. If there are no landing pads or other obstacles on a pair of adjacent interconnect wires, then the pitch between adjacent interconnect wires can be even smaller. Specifically, FIG. 10b illustrates interconnect lines 1030 and 1040 separated by a pitch of Dpitch(gridless2) that is equal to the minimum distance dmin. Such a gridless routing system is said to have "line-to-line" spacing. Such a system provides the highest achievable interconnect line density.

Furthermore, with a gridless system, esoteric routing patterns can be created that optimize the layout area. For example, FIG. 10b illustrates interconnect line 1042 connected to landing pad 1047 with interconnect line 1032 neatly following the contour of interconnect line 1042 and landing pad 1047 to conserve integrated circuit die area. Thus, using a gridless system can greatly improve wiring density in all metal wiring layers of an integrated circuit.

Gridless Non Manhattan Routing

Figure 10C:
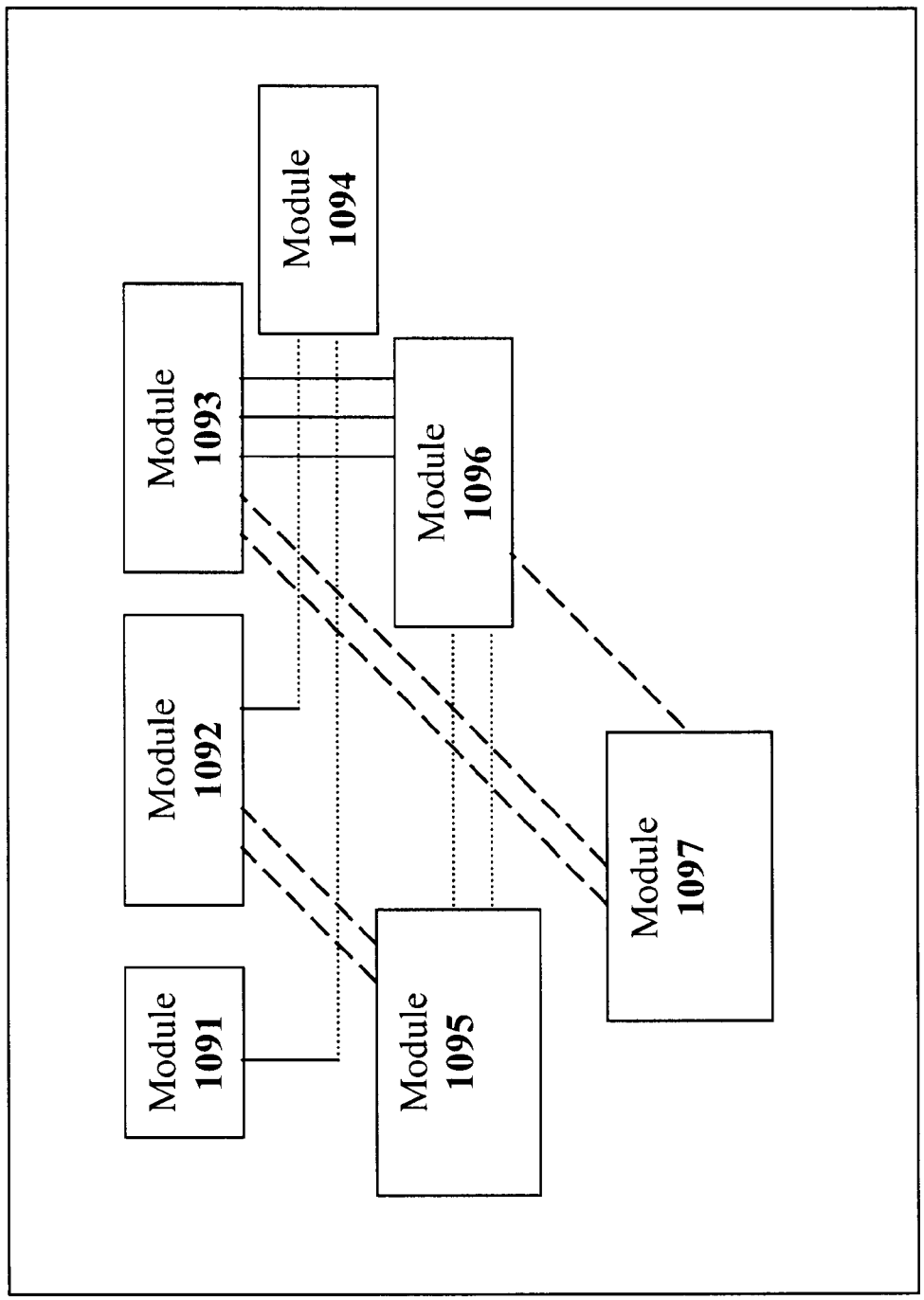
FIG. 10c illustrates a simplified integrated circuit constructed with a gridless non Manhattan wiring system.

By combining a gridless routing architecture with non Manhattan wiring layers, the present invention allows very efficient wiring to be created for integrated circuits. FIG. 10c illustrates a simplified integrated circuit constructed with a gridless non Manhattan wiring system. Since the routing system is gridless, adjacent interconnect lines may be placed as close together as possible provided that there is no interference between the adjacent lines and the adjacent interconnect lines can be manufactured reliably. Furthermore, since the routing system used in FIG. 10c allows non Manhattan layers, diagonal interconnect lines can be used to create the shortest possible paths between modules that need to be connected. For example, referring again to FIG. 10c, module 1093 and module 1097 are coupled with 45° diagonal interconnect lines since those 45° diagonal interconnect lines provide the shortest possible path between those two circuit modules.

To create a gridless non Manhattan integrated circuit layout, a gridless non Manhattan routing tool may be used. Such a gridless non Manhattan routing tool may be created by modifying an existing gridless Manhattan routing tool to accommodate diagonal wiring.

For example, the gridless Manhattan routing tool proposed by Jeremy Dion and Louis M. Monier in their paper "Contour: A Tile-based Gridless Router" (Digital Western Research Laboratory Report 95/3) can be extended to handle diagonal interconnect lines in order to create a gridless non Manhattan routing tool. Their gridless Manhattan routing tool used an automatic maze router based on a corner-stitching data structure. Their router uses a collection of two-dimensional planes wherein each plane comprises a set of rectangular tiles representing circuit geometry or free space between circuit geometry.

Figure 11:
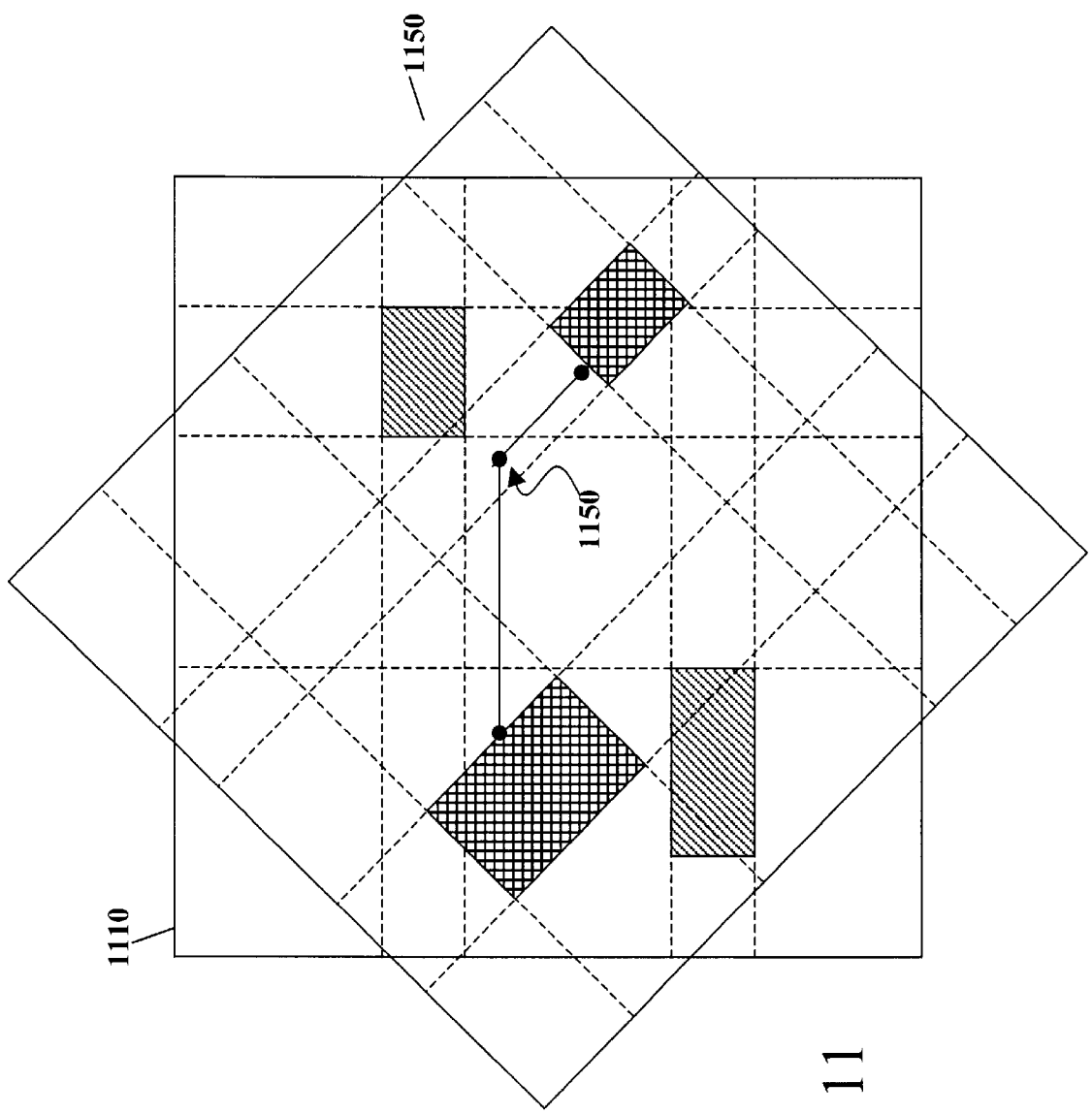
FIG. 11 illustrates a Manhattan two-dimensional tiling structure overlaid with a non Manhattan two-dimensional tiling structure.

To extend their gridless Manhattan routing tool into a gridless non Manhattan routing tool, sets of rotated tiling planes are added. FIG. 11 illustrates a first Manhattan tiling plane 1110 along with a superimposed non Manhattan tiling plan 1150. The maze router may route signals on any plane provided that the signals may be interconnected with a via as needed. In the illustration of FIG. 11, there must be enough room for a via 1150 in both the available tile on the Manhattan tiling plane 1110 and the tile on the non Manhattan tiling plan 1150 that overlaps the Manhattan tile.

Similarly, the gridless Manhattan routing tool proposed by Hsiao-Ping Tseng and Carl Sechen in their paper "A Gridless Multi-Layer Router for Standard Cell Circuits using CTM Cells" (Proceedings of the 1997 European Design and Test Conference, page 319) can be extended to handle diagonal interconnect lines in order to create a gridless non Manhattan routing tool.

Gridless non Manhattan Wiring by Compaction

Another method of creating a gridless non Manhattan layout is to compact a gridded non Manhattan wiring layout. The initial gridded non Manhattan layout may use the gridded non Manhattan wiring with exact intersection vias or the gridded non Manhattan wiring with inexact intersection vias as described in the earlier sections of this document. The gridded non Manhattan routing is then compacted in both vertical and horizontal directions to produce a gridless non Manhattan layout that increases the interconnect line density.

In the resulting gridless non Manhattan interconnect system, any interconnect line on any layer may be placed at any location as long as that signal line does not interfere with other nearby interconnect lines. Similarly, vias used to connect interconnect lines on different layers may be placed anywhere that does not cause interference since the interconnect lines on the different levels may be placed at any position. By allowing the positioning of signal lines and vias anywhere, the compacted gridless system of the present invention renders the routing system much more complex.

Gridless non Manhattan By Compaction Wiring Example

Figure 13A:
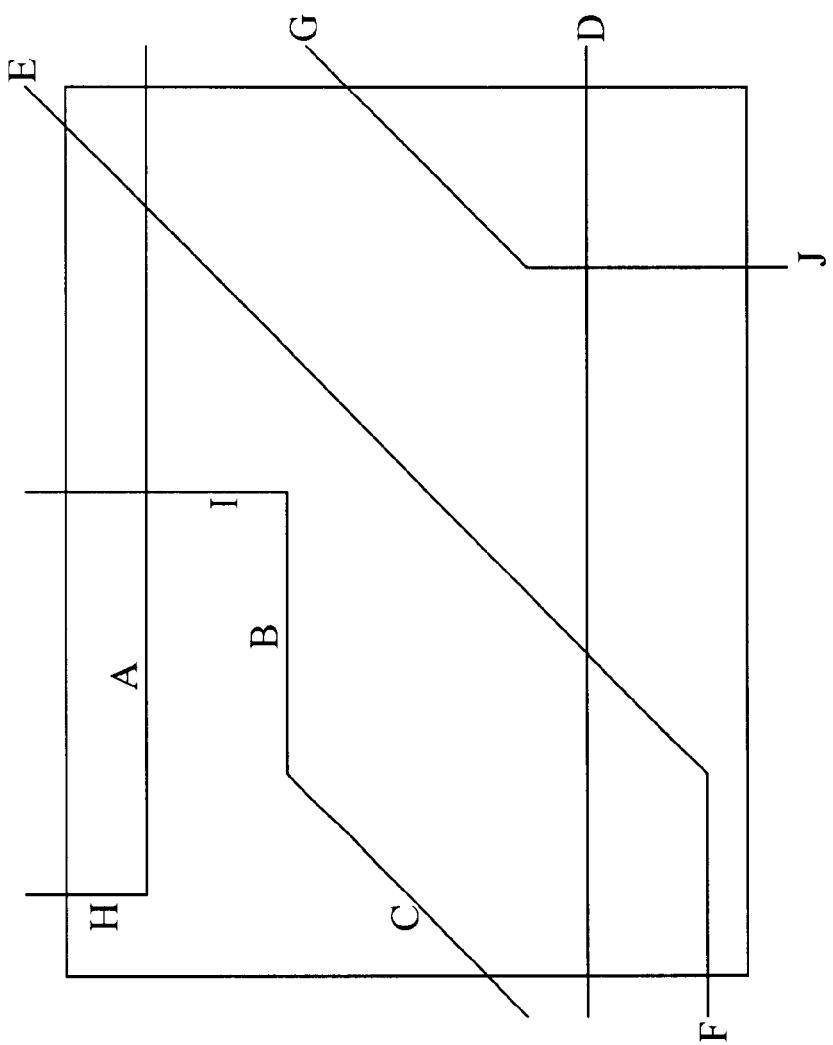
FIG. 13a illustrates a layout section of non Manhattan interconnect wiring that has not been compacted yet.

To best illustrate a compacted gridless non Manhattan wiring system, a full example is presented with reference to FIGS. 12, 13a to 13l, 14, and 15. FIG. 13a illustrates a layout section of non Manhattan interconnect wiring that has not been compacted yet. In the non Manhattan interconnect wiring layout of FIG. 13a there are ten individual interconnect lines labeled A through J. The wiring layout of FIG. 13a is comprised of three wiring layers with three different preferred wiring directions: A horizontal wiring layer with interconnect lines A, B, D and F; a vertical wiring layer with interconnect lines H, I, and J; and a 45° diagonal wiring layer with interconnect lines D, E, and G. Since the different angled wires are on different layers, the wires that appear to cross each other are not electrically connected. The various interconnect lines that connect to form corners are connected with vias (not shown). The non Manhattan wiring of FIG. 13a will be compacted according to the method set forth in the flow diagram of FIG. 12.

Figure 14:
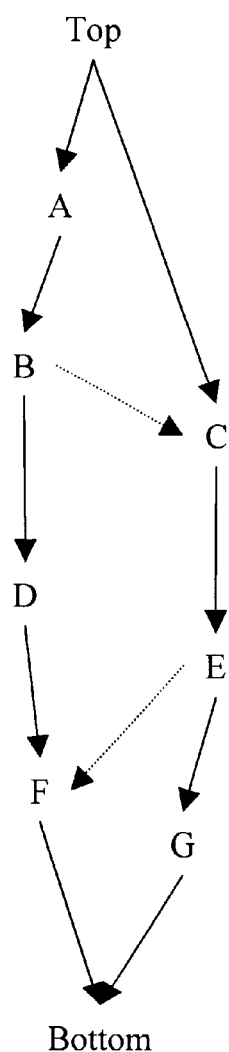

Referring to FIG. 12, the first step is to create a sorted relative position graph of all the horizontal and diagonal interconnect lines as set forth in step 1210. Referring back to FIG. 13a, this would include interconnect lines A, B, C, D, E, F, and G. The sorted relative position graph creates a graph of interconnect lines from top to bottom in their relative positions. Diagonal lines are considered independent from horizontal lines since they reside on a different metal layer. FIG. 14 illustrates a sorted vertical relative position graph of all the horizontal interconnect lines and the diagonal interconnect lines from FIG. 13a. Note that the horizontal and diagonal lines are placed into independent graphs. Furthermore, the graph of FIG. 14 includes dashed connectors that indicated that the two interconnect lines are connected with a via.

Figure 13B:
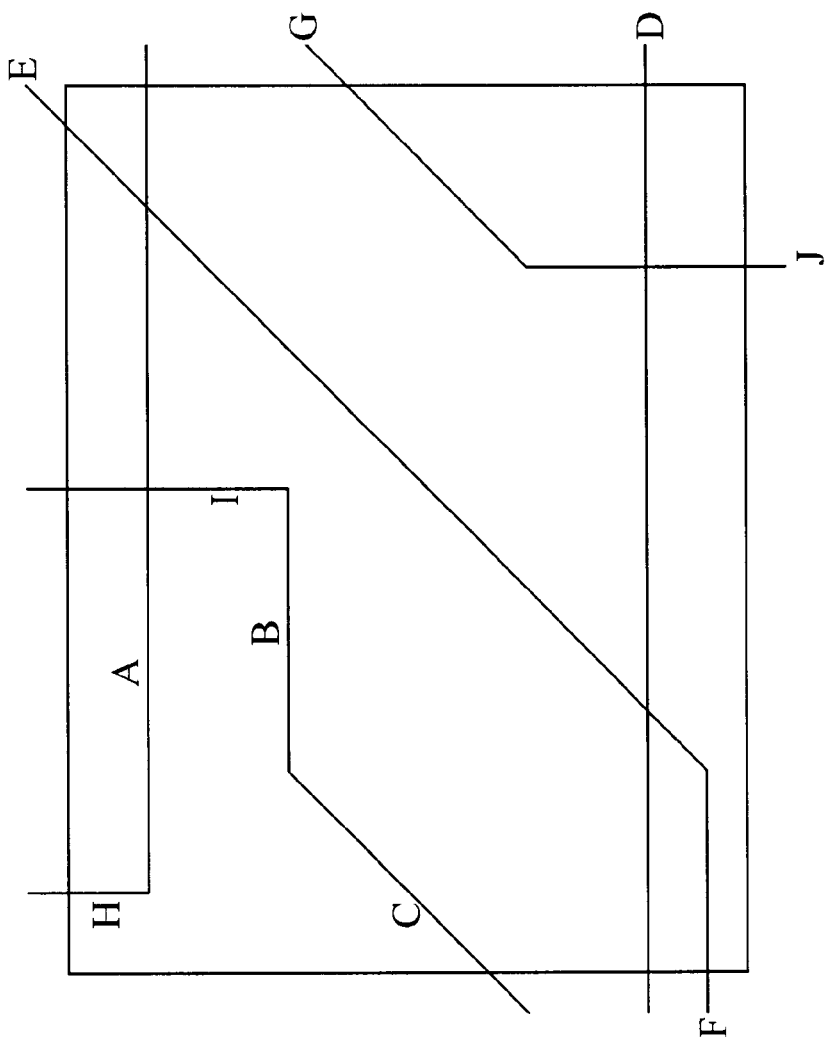
FIGS. 13b through 13k illustrate the layout section of non Manhattan interconnect wiring of FIG. 13a as it is compacted.

Next, at step 1220, the system selects an independent group of interconnect lines from the sorted graph. In this example, the independent group of horizontal lines A, B, D, and F from the graph of FIG. 14 is selected. The system then proceeds to step 1230 where it successively compacts each line from the independent group of sorted interconnect lines. To compact downward, the system first starts with the bottommost interconnect line F and attempts to move it downward. Since it is already at the bottom, it is not moved. Next, the system proceeds to the next lowest interconnect line D and compacts it downward as close to interconnect line F as possible without causing interference. The result is illustrated in FIG. 13b.

Figure 13C:
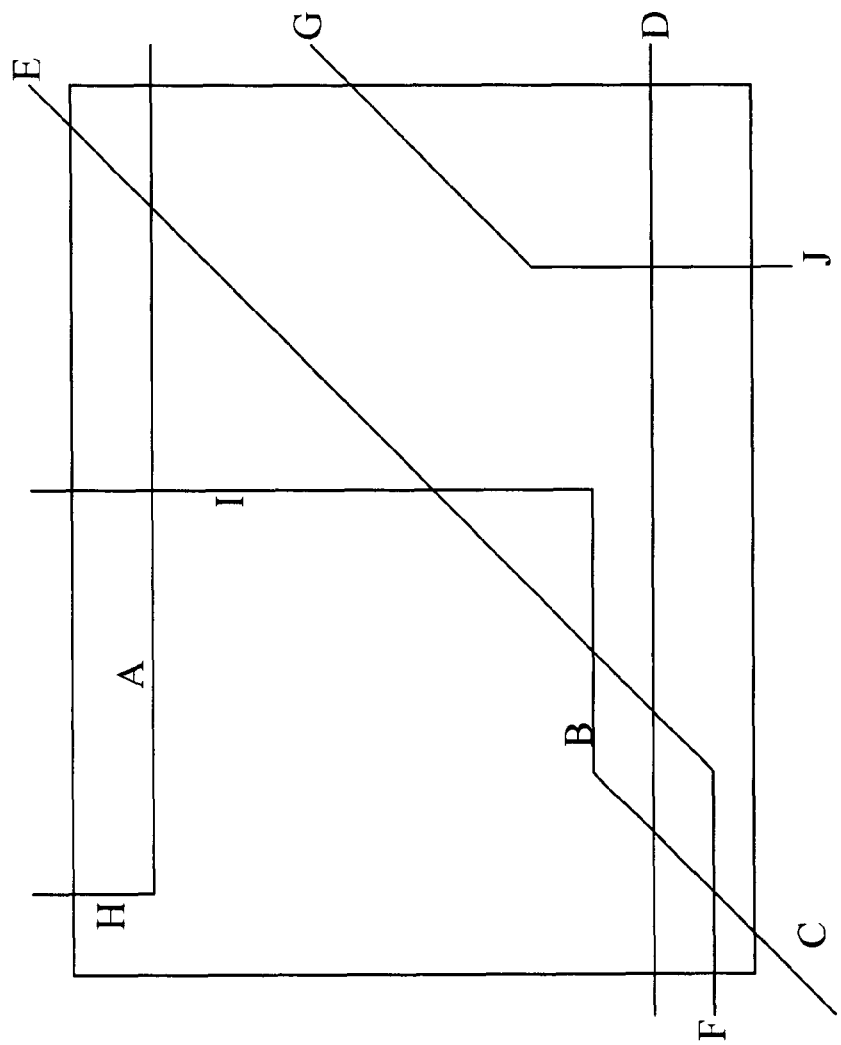
Figure 13D:
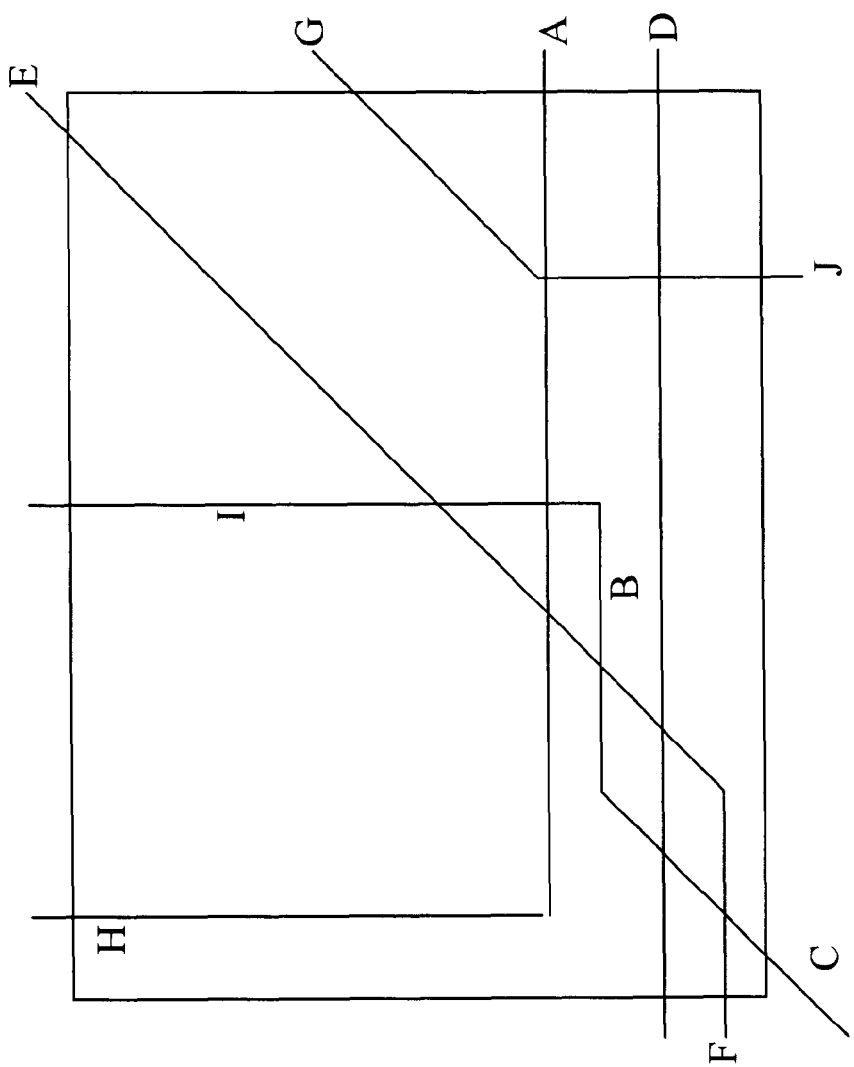

Next, the system moves the next lowest interconnect line B. However, note that interconnect line B is connected to diagonal interconnect line C such that interconnect line C must also be moved downward. The result after moving both horizontal interconnect line B and diagonal interconnect line C is illustrated in FIG. 13c. Finally, the last horizontal interconnect line A is compacted downward as close as possible to interconnect line B. The result after moving both horizontal interconnect line A downward is illustrated in FIG. 13*d*.

Referring back to FIG. 12, after the last horizontal line was compacted the system proceeds to step 1240 where it determines whether there are any more sorted vertical groups that have not yet been compacted. Referring again to the sorted vertical relative position graph of FIG. 14, it can be seen that there is the set of diagonal interconnect lines that need to be compacted. Thus, the system returns back to step 1220 to select the diagonal interconnect lines and then to step 1230 to vertically compact the diagonal lines.

Figure 13E:
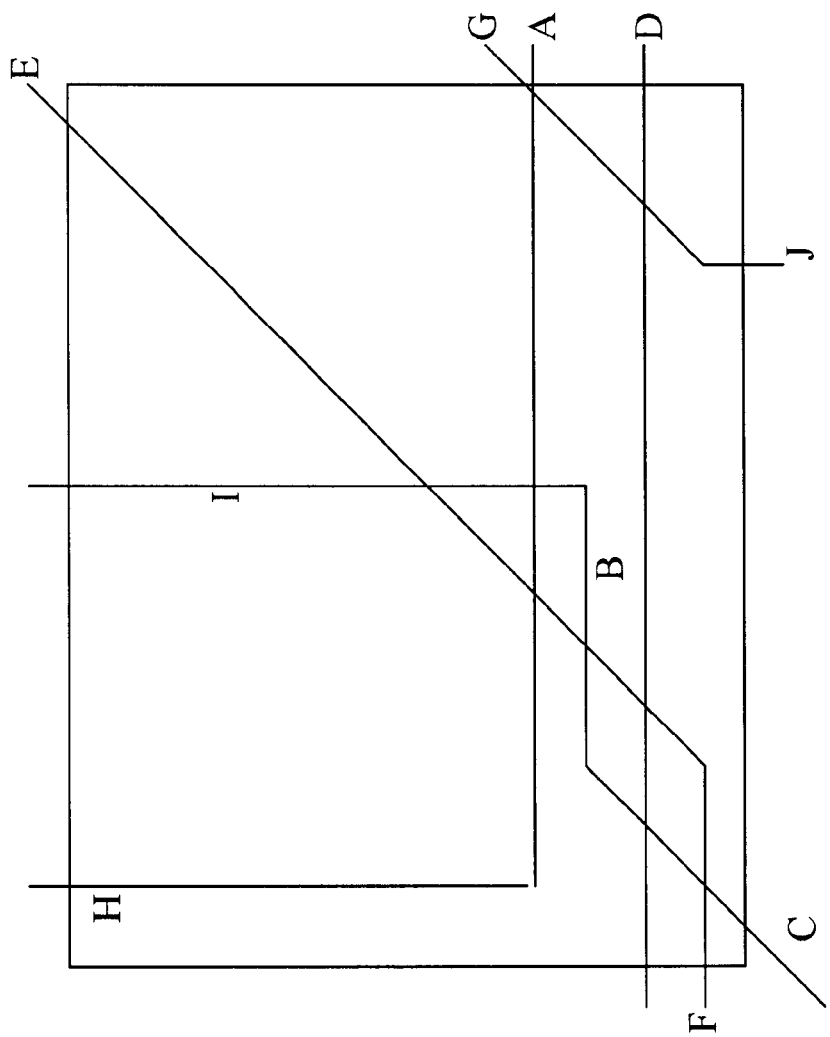
Figure 13F:
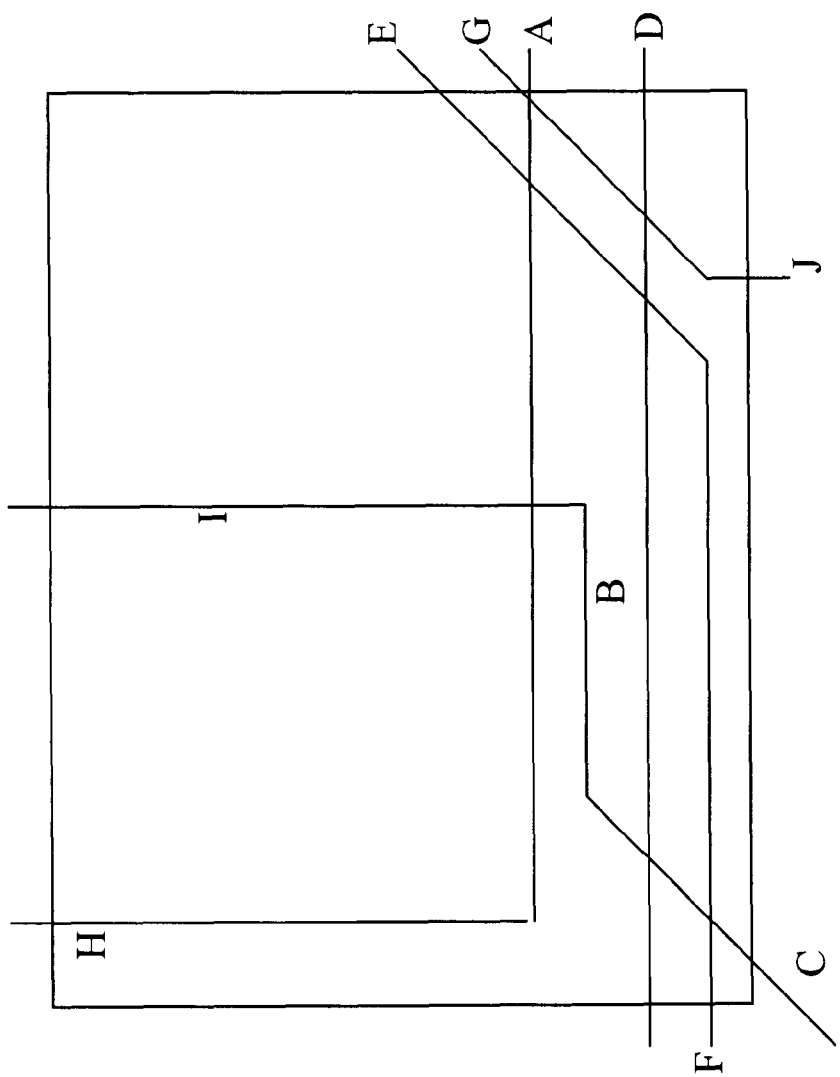

The bottommost diagonal interconnect line G is compacted downward first. The result after compacting down diagonal interconnect line G is illustrated in FIG. 13*e*. Next, the system compacts down diagonal interconnect line E. As set forth in FIG. 14, diagonal interconnect line E is coupled to horizontal interconnect line F such that horizontal interconnect line F also needs to be adjusted. FIG. 13*f* illustrates the resultant routing after diagonal interconnect line E has been compacted downward. Finally, diagonal interconnect line C needs to be moved downward. However, diagonal interconnect line E is coupled to horizontal interconnect line B that has already been compacted down as far as it will go. Thus, diagonal interconnect line C is not moved and the vertical compaction of diagonal lines at step 1230 is done.

Figure 15:
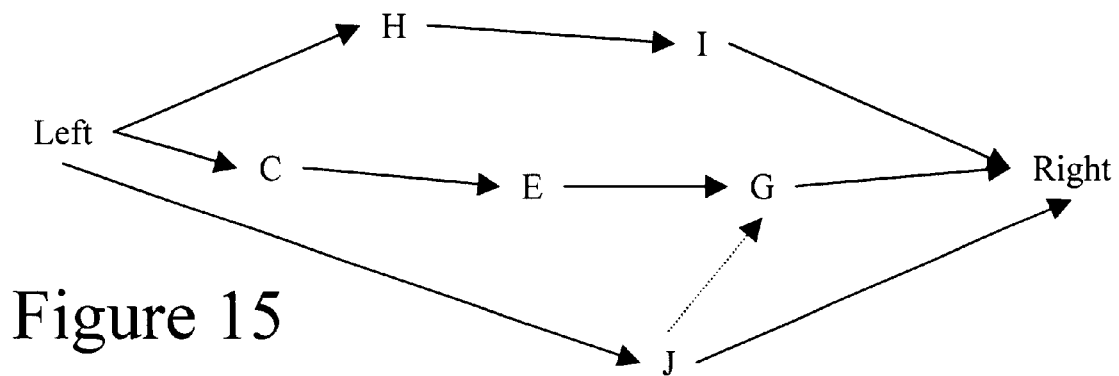

Referring back to FIG. 12, the system then proceeds again to step 1240, at this point all the vertical compaction has complete such that the system proceeds to step 1250. At step 1250 the system creates a sorted relative horizontal position graph of all the vertical interconnect lines and diagonal interconnect lines. FIG. 15 illustrates the output sorted relative horizontal position graph of all the vertical interconnect lines and the diagonal interconnect lines. As illustrated in FIG. 15, there are three independent groups interconnect lines. Note that vertical line J is independent from vertical lines H and I since it does not over lap those two vertical interconnection lines in the vertical dimension.

Figure 13G:
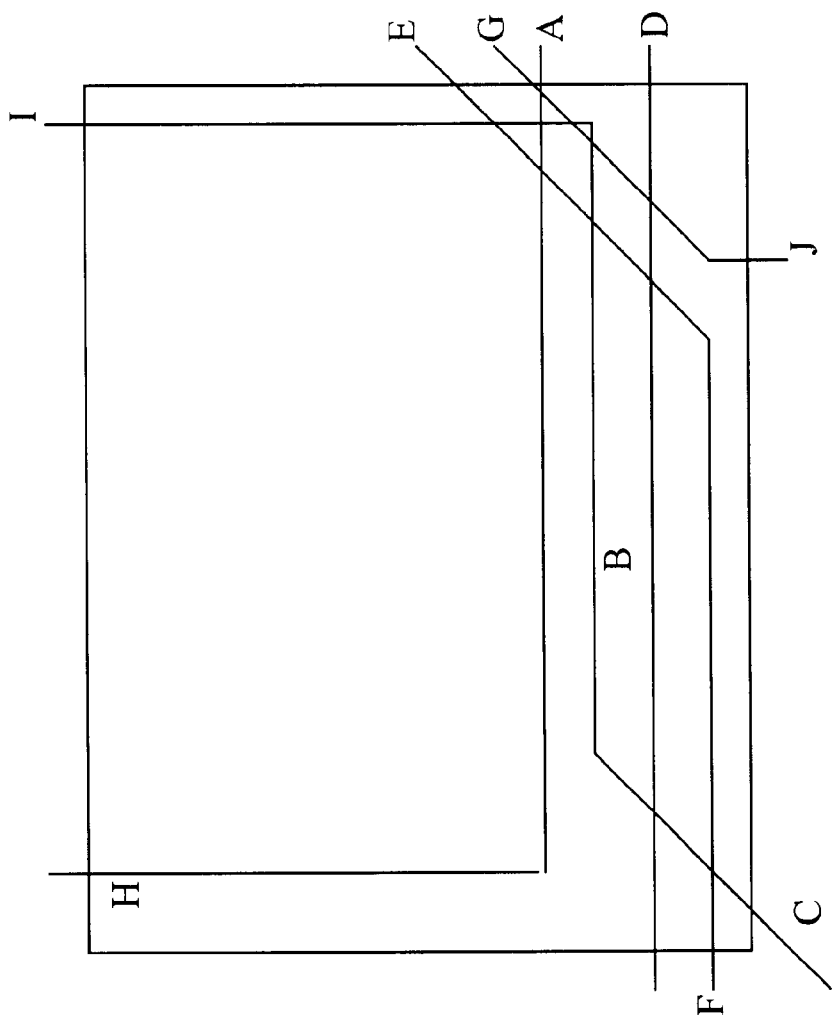
Figure 13H:
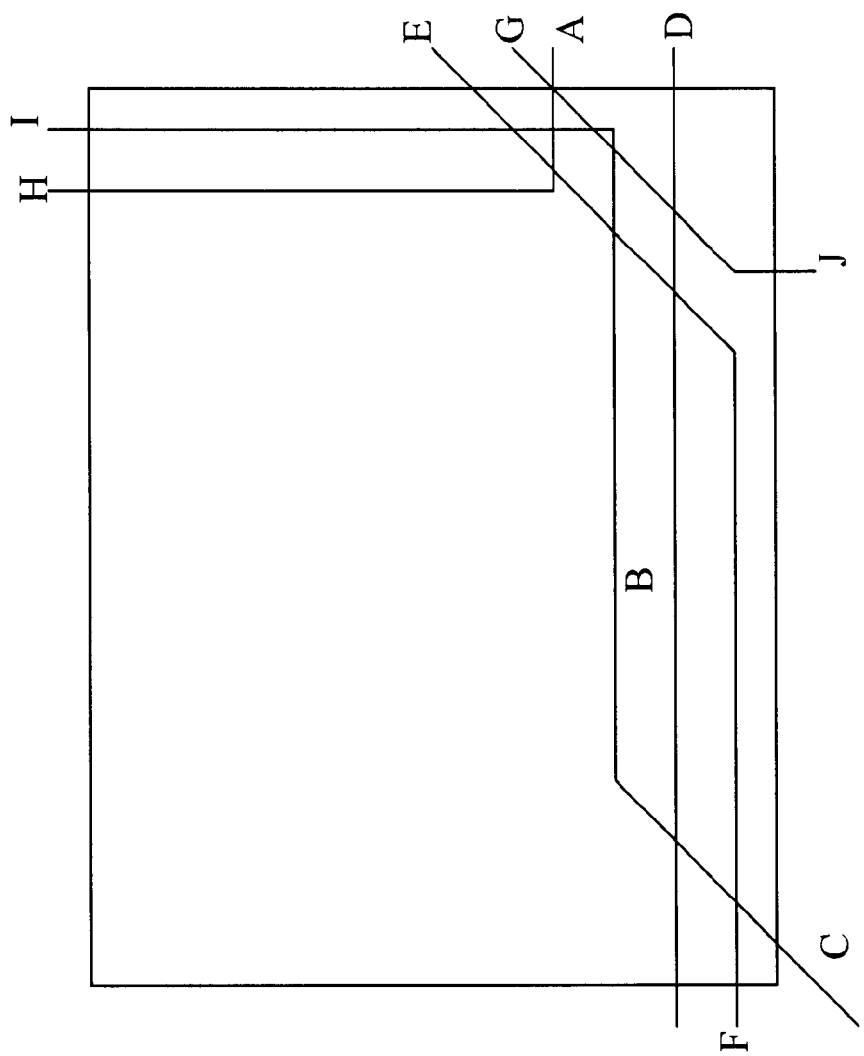

Referring back to FIG. 12, the system selects an independent group of interconnect lines from the set of interconnect lines sorted by relative horizontal positions. In this example, the first group will be vertical interconnect lines H and I. Thus, at step 1270 vertical interconnect lines H and I are compacted horizontally. In this example, the compaction is to the right such that interconnect line I is compacted to the right first as illustrated in FIG. 13*g*. Next, the system compacts interconnect line H to the right as illustrated in FIG. 13*h*, thus completing the compaction of that group of lines.

Figure 13I:
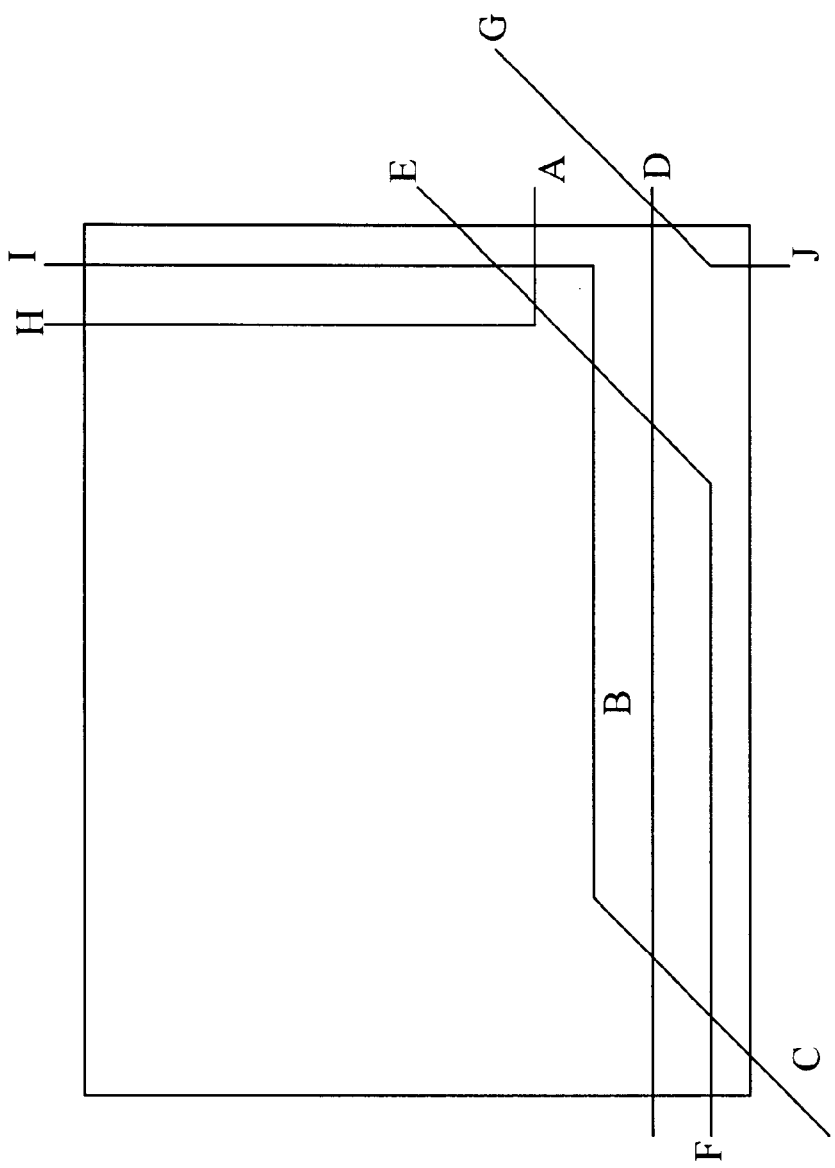
Figure 13J:
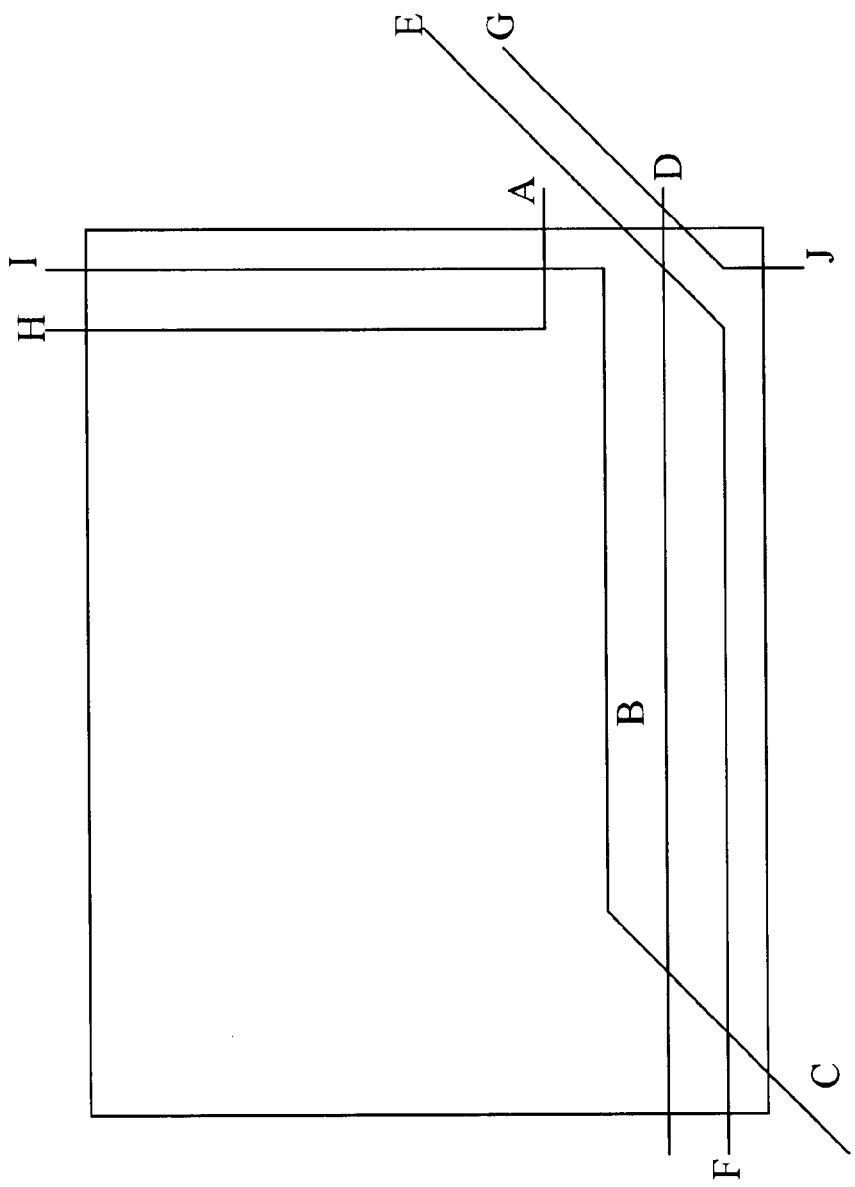
Figure 13K:
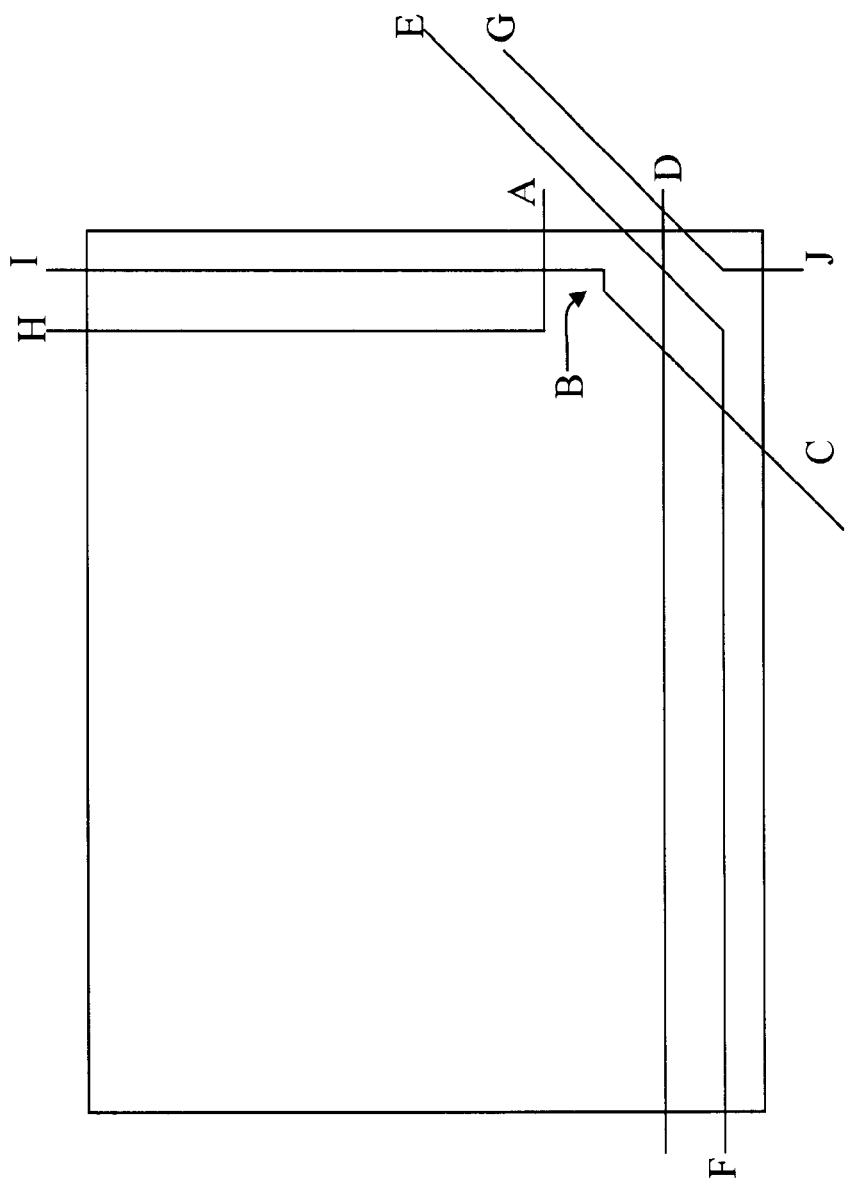
Figure 131:
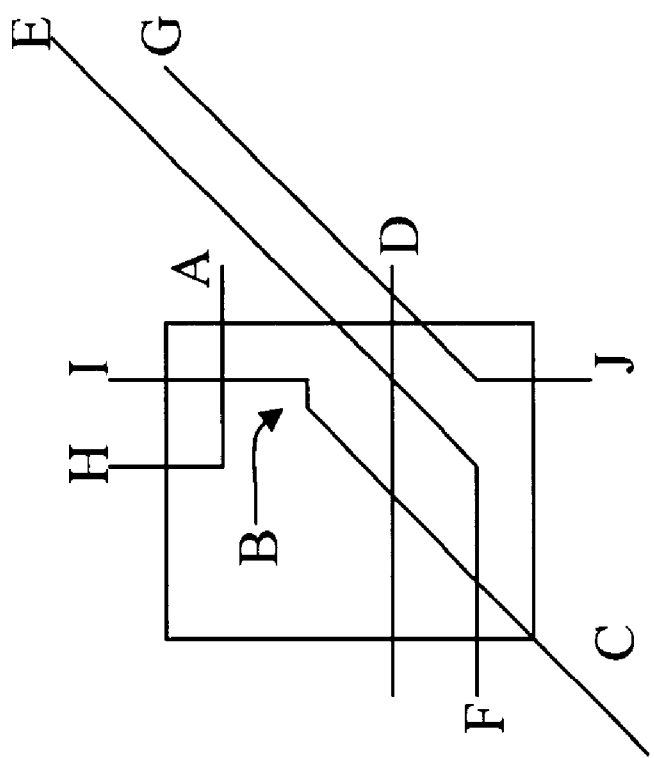

The system then moves to step 1280 to determine if additional lines need to be compacted horizontally. Since the answer is "yes", the system proceeds to step 1260 where the diagonal lines are selected next and to step 1270 to compact the diagonal lines. Right most diagonal interconnect line G is the first to be compacted. The result after compacting diagonal interconnect line G to the right is illustrated in FIG. 13*i*. Next, diagonal interconnect line E is compacted to the right is illustrated in FIG. 13*j*. Finally, diagonal interconnect line C is compacted to the right to complete the diagonal line group with the end result illustrated in FIG. 13*k*. Note that only a very small segment of horizontal interconnect line B remains. In one embodiment, interconnect line B is completely removed and interconnect line C is then coupled directly to interconnect line I.

Referring again to FIG. 12, the system again moves to step 1280 to determine if additional lines need to be compacted horizontally. The answer is again "yes" since vertical interconnect line J still needs to be compacted. The system thus proceeds to step 1260 where vertical interconnect line J is selected next and to step 1270 to compact vertical interconnect line J. However, vertical interconnect line J cannot be compacted anymore. Thus, the system again moves to step 1280 to determine if additional lines need to be compacted horizontally. At this point there are no more groups to compact such that the compaction is complete. FIG. 13*l* illustrates a final view of the compacted routing.

Compaction around Obstacles Example

Obstacles in the layout area may limit the space that may be used for compaction. For example, a licensed circuit module may take a predefined amount of space. In order to handle such area limitations, the compaction system must be able to adapt to the available area.

Figure 16B:
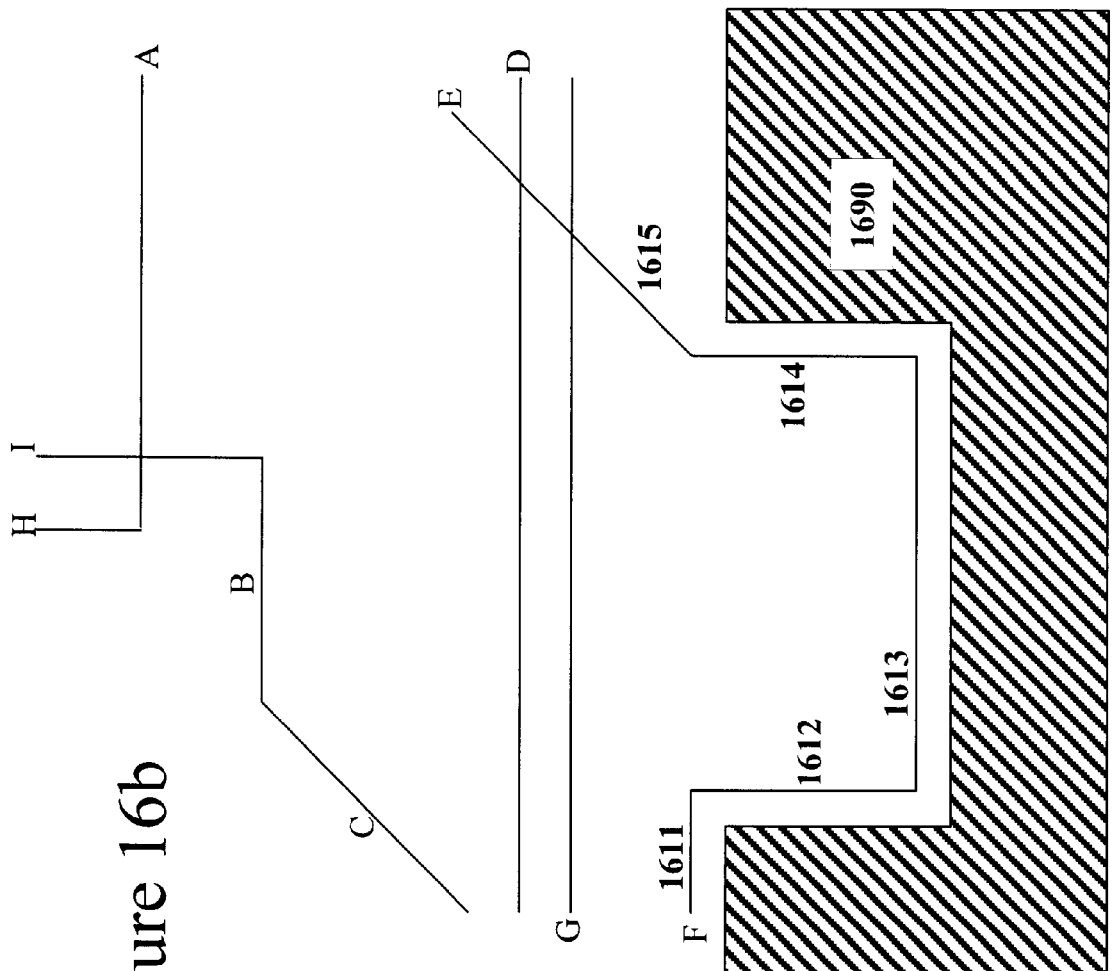
Figure 16C:
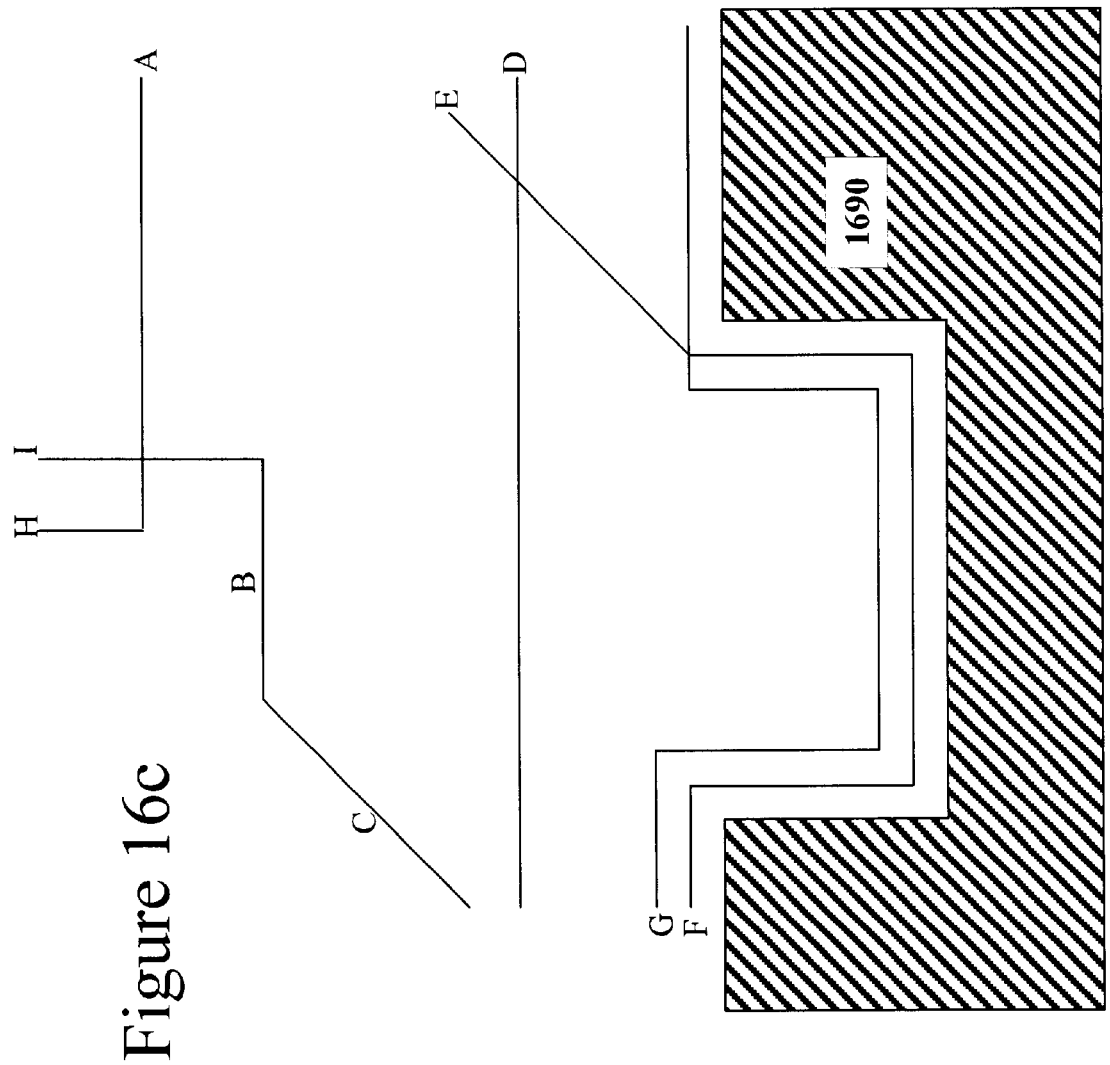
Figure 16D:
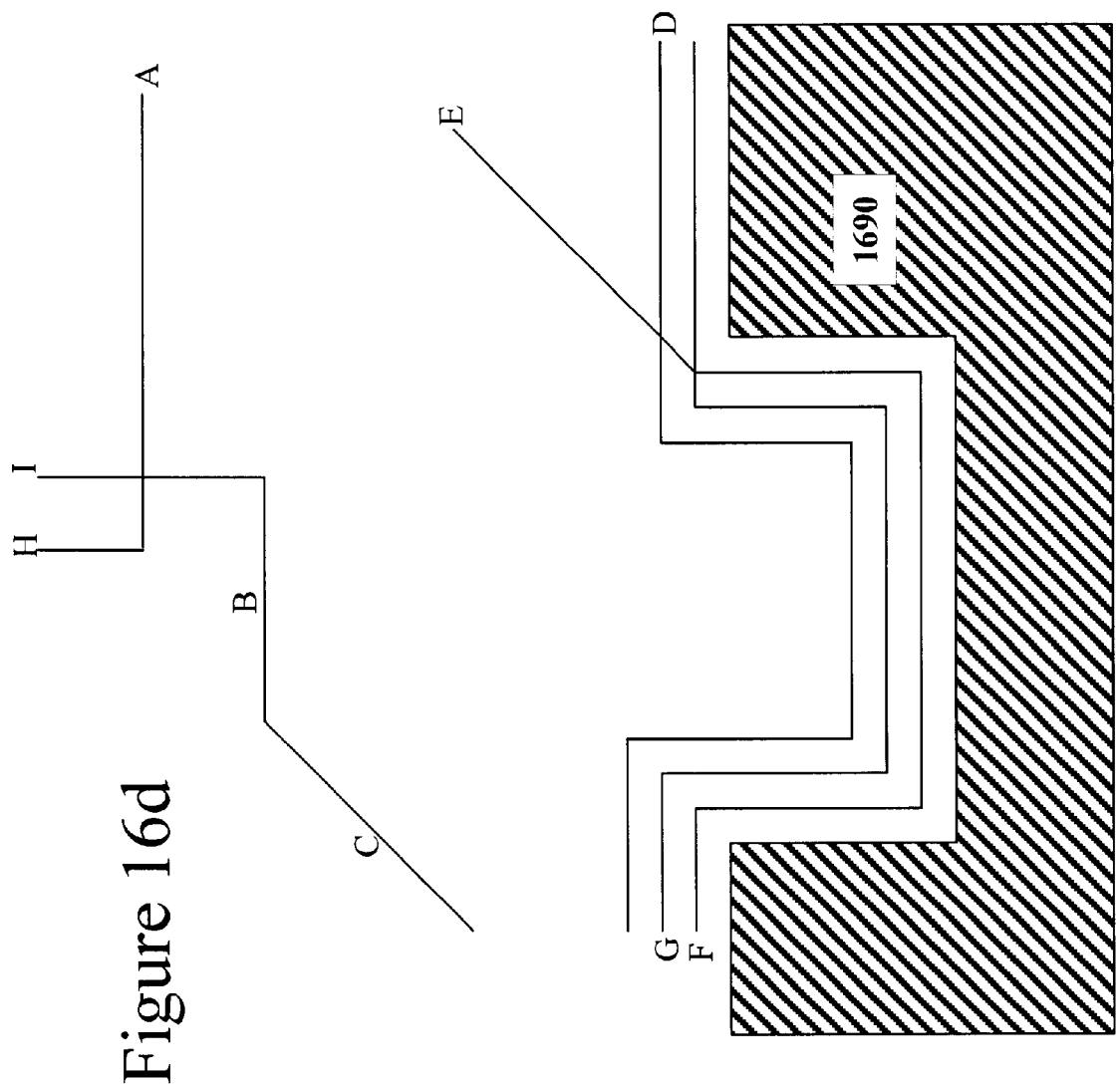
Figure 16E:
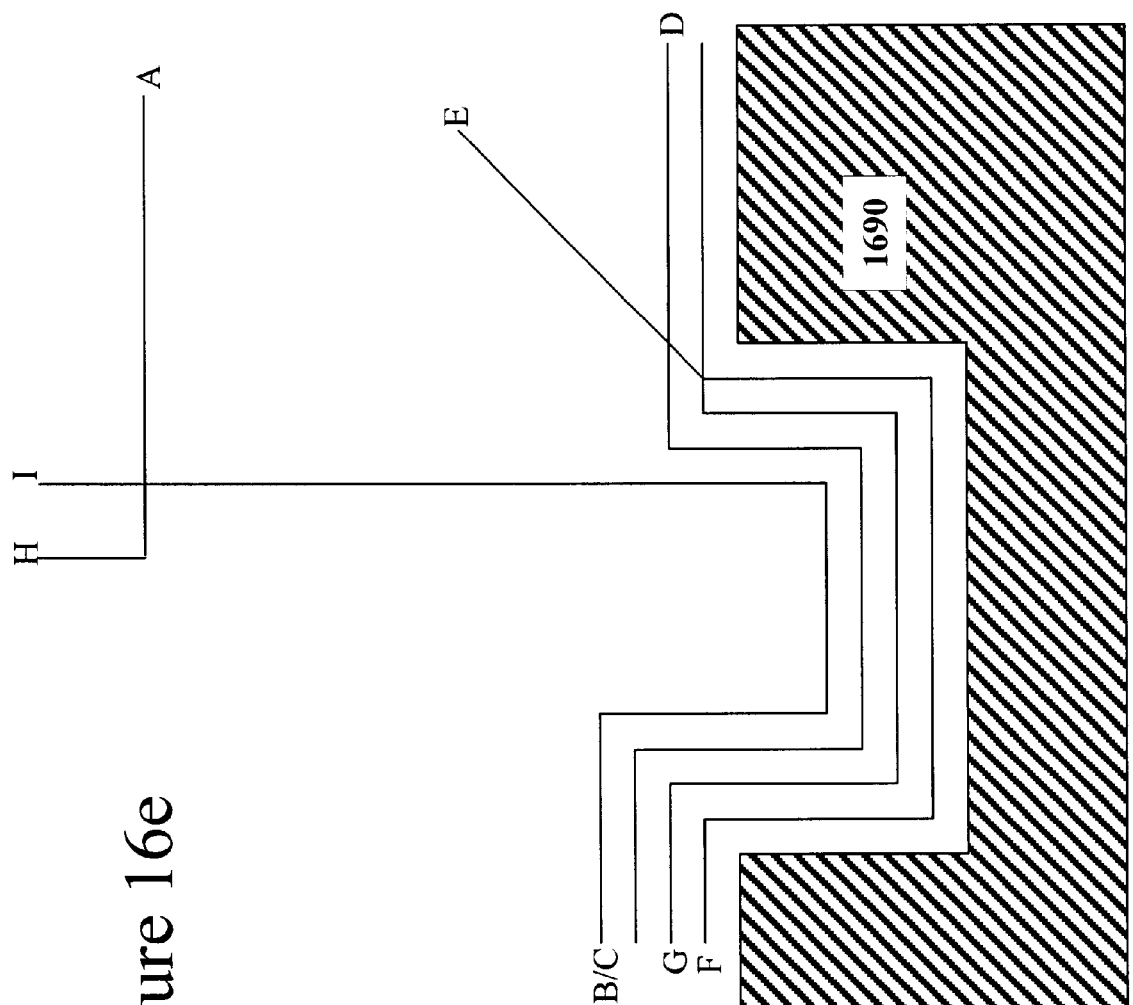
Figure 16F:
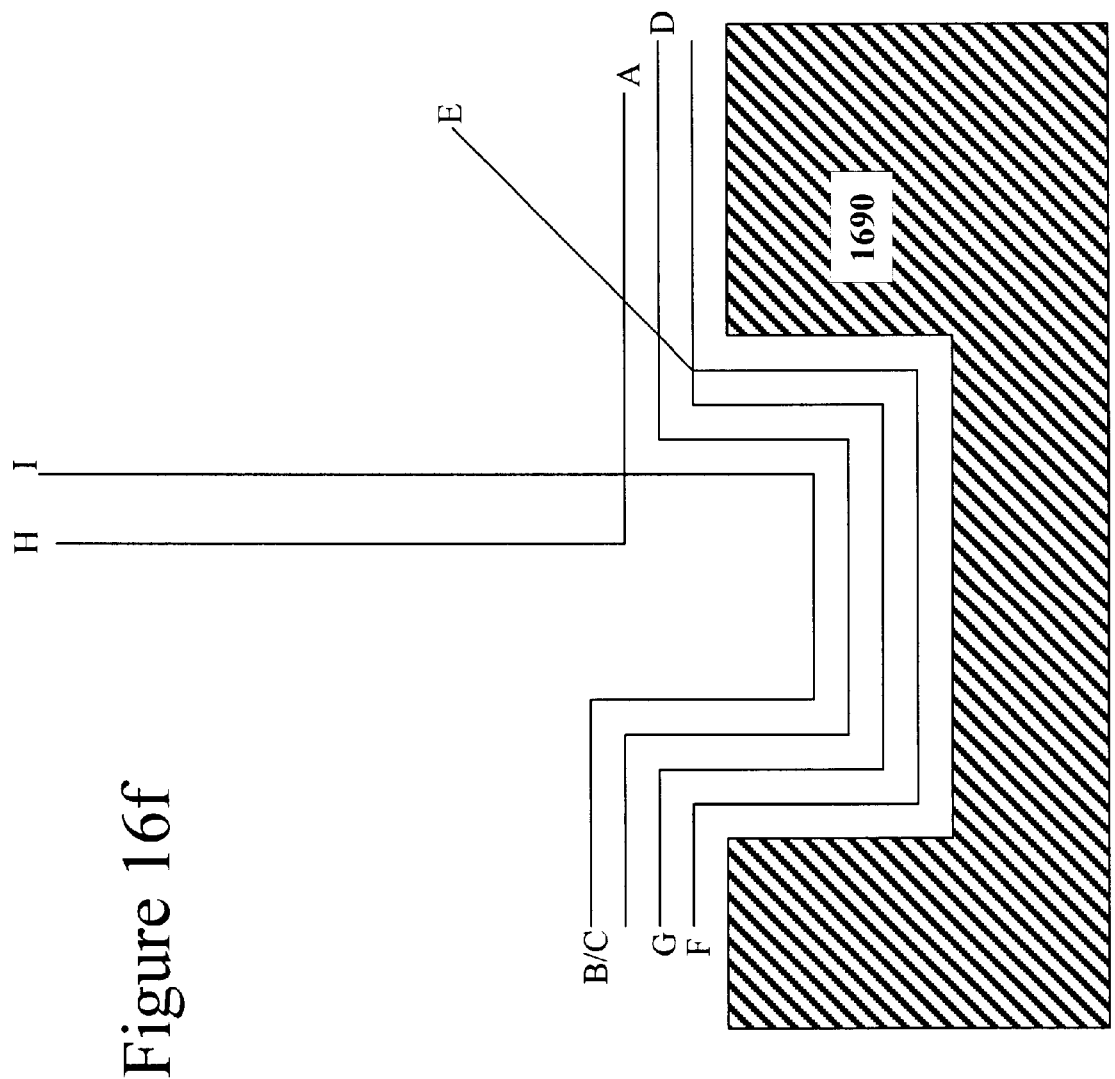

FIGS. 16*a* to 16*f* illustrate the vertical compaction of interconnect lines around an obstacle 1690. As the horizontal lines are compacted down, the horizontal interconnect lines may be broken down into subsections. For example, horizontal line F in FIG. 16*a* is broken into two different sections 1611 and 1613 as illustrated in FIG. 16*b*. The new horizontal subsections 1611 and 1613 are then coupled by newly created vertical interconnect line section 1612. Newly created interconnect lines, such as newly created vertical interconnect line section 1612, are added into the sorted relative horizontal position graph of all the vertical interconnect lines and the diagonal interconnect lines.

Diagonal interconnect lines may be flattened out during the compaction process. Referring again to FIGS. 16*a* and 16*b*, diagonal interconnect line E is flattened into horizontal subsection 1613. In addition, a second newly created vertical interconnect line section 1614 is created to link horizontal subsection 1613 to diagonal subsection 1615.

Euclidean Wiring

Although this document refers to non Manhattan layers that may be of any angle, many manufacturers would be more comfortable with only manufacturing Manhattan wiring or Manhattan and +/−45° angle diagonal wiring. Thus, the present invention introduces the concept of using gridless Manhattan wiring or gridless Manhattan and +/−45° angle diagonal wiring system to closely approximate a Euclidean wiring system wherein interconnect lines may be of almost any angle. In contrast, the number of angles that may be simulated in a gridded system routing system is sharply limited.

Simulated Euclidean with Gridless Manhattan Routing

Figure 17A:
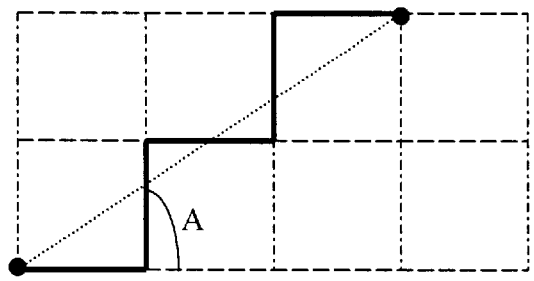
FIG. 17a illustrates a first angled wire created with a gridded Manhattan system.
Figure 17B:
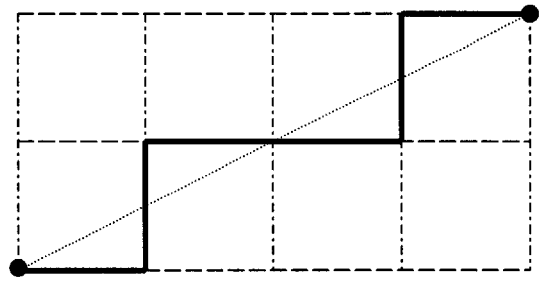
FIG. 17b illustrates a second angled wire created with a gridded Manhattan system.

FIG. 17*a* illustrates a small gridded Manhattan interconnect line made up of horizontal and vertical segments. Specifically, the interconnect line of FIG. 17*a* consists of two separate vertical segments and two horizontal segments that must be on the illustrated detailed routing grid. The four interconnect line segments of FIG. 17*a* simulate a direct signal line with angle A in a gridded Manhattan system. With such a gridded Manhattan system, the number of angles that may be represented is sharply limited by the detailed routing grid. For example, the next smallest angle that may be represented with vertical change of no more than two detailed routing grid units is shown in FIG. 17*b*, where the horizontal segment was extended to the next detailed routing grid intersection.

Figure 17C:
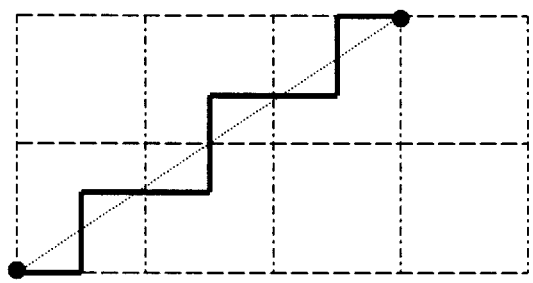
FIG. 17c illustrates the angled wire of FIG. 17a created with a gridless Manhattan system.
Figure 17D:
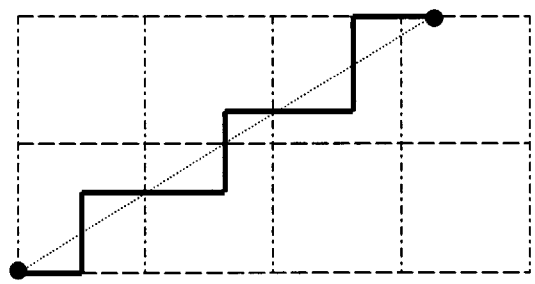
FIG. 17d illustrates a first angled wire with an angle between the angle of FIG. 17a and the angle of FIG. 17b created with a gridless Manhattan system.
Figure 17E:
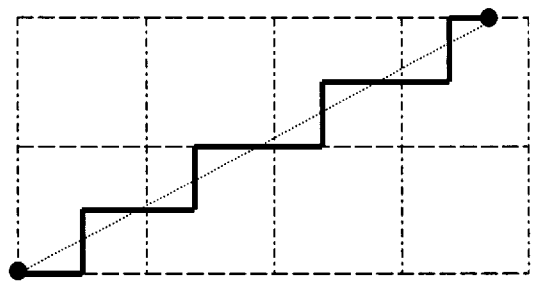
FIG. 17e illustrates a first angled wire with an angle between the angle of FIG. 17a and the angle of FIG. 17b created with a gridless no Manhattan system.
Figure 17F:
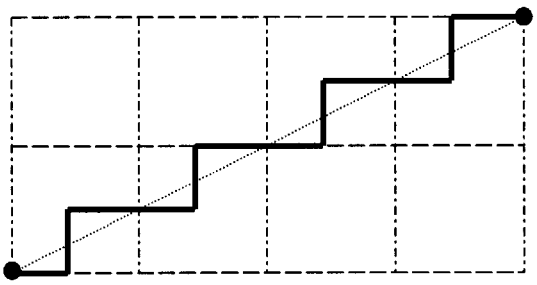
FIG. 17f illustrates the angled wire of FIG. 17b created with a gridless Manhattan system.

In a gridless Manhattan routing system, almost any angle may be represented since the signal lines are not restricted to being on specific detailed routing grid positions. (Note that there still may be a manufacturing grid resolution but that manufacturing grid resolution is finer than the thickness of an interconnect line.) FIGS. 17*c* through 17*f* illustrate a gridless Manhattan system used to simulate Euclidean wiring. The gridless Manhattan system can represent the same angles as the gridded system. Specifically, the gridless interconnect lines of FIGS. 17c and 17f illustrate the same angles as in the gridded interconnect lines of FIGS. 17a and 17b. However, the gridless Manhattan system can also be used to simulate almost every angle in between. FIGS. 17d and 17e illustrate only two of the nearly infinite number of possible interconnect line angles between FIGS. 17c and 17f. Thus, with the gridless Manhattan routing system, Euclidean wiring may be accurately simulated. To simplify the manufacturing task, the system may limit how short an interconnect line segment may be such that the simulated Euclidean interconnect lines do not always use the manufacturing grid resolution.

To construct the simulated Euclidean interconnect lines, a slightly modified version of the well-known Bresenham line drawing algorithm. The required modification is to also plot a point at Y+1, X when plotting a point at X+1, Y+1 such that there is always horizontal or vertical continuity along line segments.

Simulated Euclidean with Gridless Non Manhattan Routing

To provide an even better simulation of Euclidean wiring, it would be desirable to use 45° angle line segments. Manufacturing 45° angle segments are not a severe stretch from existing manufacturing techniques since 45° angle segments can be created by moving a single unit in both the horizontal and vertical directions.

FIG. 18a illustrates a small gridded non Manhattan interconnect line that uses 45° angle segments. The interconnect line of FIG. 18a consists of two separate 45° angle segments joined by one horizontal segment. The three interconnect line segments of FIG. 18a simulate a direct interconnect line with angle A. With a gridded system, the number of angles that may be represented is limited by the detailed routing grid. For example, FIG. 18b illustrates the next smallest angle that may be created for an interconnect line that is no more than two detailed routing grid units high. As illustrated in FIG. 18b, the horizontal segment was extended to the next detailed routing grid intersection.

In a gridless non Manhattan routing system, almost any angle may be represented since the signal lines are not restricted to being on specific detailed routing grid positions. FIGS. 18c through 18f illustrate a gridless non Manhattan system that uses 45° angle segments to simulate Euclidean wiring. The gridless non Manhattan system can represent the same angles as the gridded non Manhattan system of FIGS. 18a and 18b. Specifically, FIGS. 18c and 18f illustrate a gridless non Manhattan implementation of the same wiring illustrated in gridded wiring of FIGS. 18a and 18b, respectively. By comparing the gridless implementations to the dashed ideal Euclidean line, it can easily be seen that the gridless implementation is much closer to the ideal Euclidean line. Note that the interconnect line positions are limited by a "manufacturing grid" imposed by the manufacturing process but that grid is very fine (an order of magnitude smaller than the thickness of the interconnect wires).

The gridless non Manhattan system can also be used to simulate nearly every angle in between the two angles of FIGS. 18c and 18f. FIGS. 18d and 18e illustrate only two of the infinite possible signal line angles between FIGS. 18c and 18f. Thus, with the gridless non Manhattan routing system, Euclidean wiring may be accurately simulated.

Simulated Euclidean with Non Manhattan Layers

Figure 19A:
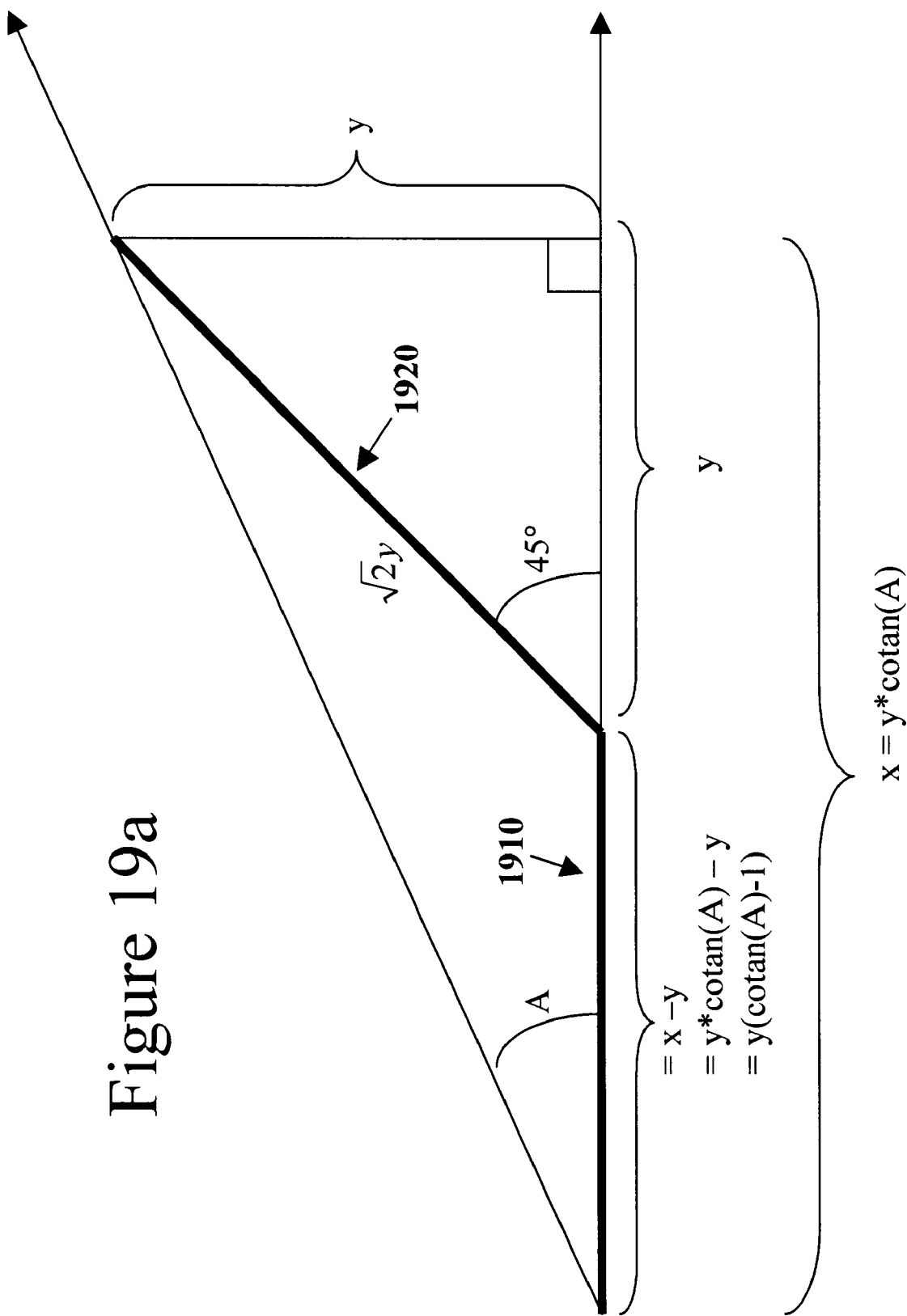
FIG. 19a illustrates a first method of calculating the lengths of a 45° angle diagonal interconnect line segment and a horizontal interconnect line segment to simulate a Euclidean interconnect line segment with an angle A.

To simulate any angle wiring with non Manhattan layers, one implementation of the present invention uses a mix of Manhattan and 45° angle diagonal interconnect lines as shown in FIGS. 18c through 18f. For example, to create interconnect lines with an angle between zero and forty-five degrees, the system uses a mix of horizontal and 45° angle diagonal interconnect lines. FIG. 19a illustrates how an interconnect line of angle A (an angle between zero and forty-five degrees) may be simulated.

FIG. 19a illustrates a first method of calculating the lengths of the two sections. Referring to FIG. 19a, an interconnect line with angle A (an angle between zero and forty-five degrees) is constructed with a horizontal interconnect line 1910 segment and a 45° angle diagonal interconnect line 1920 segment. The interconnect line with angle A has a slope of n/m where $y=x*\tan(A)$. To provide a vertical rise of y, a 45° angle diagonal interconnect line 1920 of length $\sqrt{2}y$ is used. This 45° angle diagonal interconnect line 1920 also provides horizontal change of y. To provide the remainder of the horizontal change, a horizontal interconnect line 1910 of length x-y is used (where x equals the entire horizontal distance change for vertical distance change of y). Expressed only in terms of angle A and vertical distance y, the horizontal interconnect line 1910 is created with a length of $y*\cot(A)-y=y(\cot(A)-1)$.

Figure 19B:
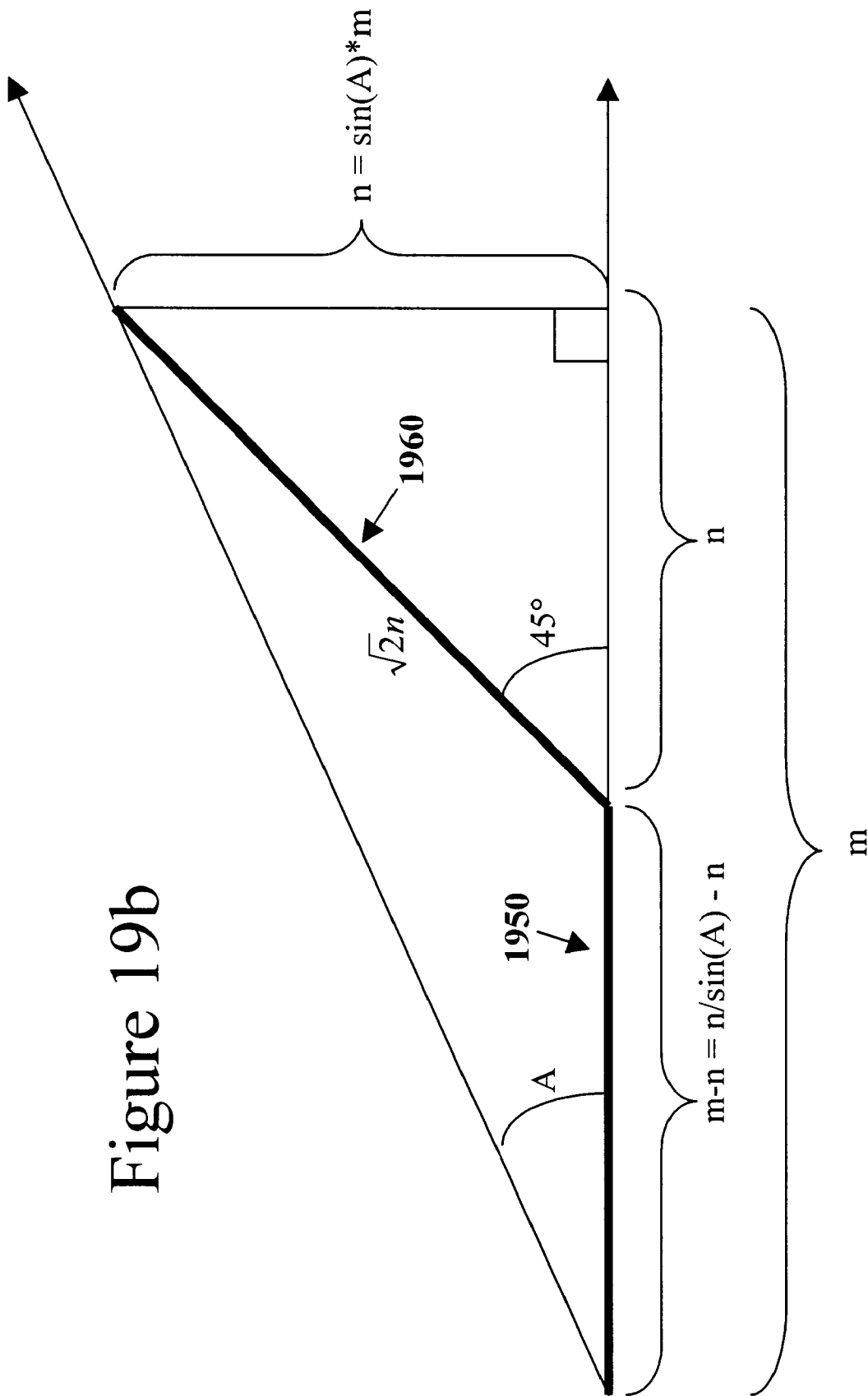
FIG. 19b illustrates a second method of calculating the lengths of a 45° angle diagonal interconnect line segment and a horizontal interconnect line segment to simulate a Euclidean interconnect line segment with an angle A.

FIG. 19b illustrates another way of calculating the lengths of the two sections. Referring to FIG. 19b, an interconnect line with angle A (an angle between zero and forty-five degrees) is constructed with horizontal interconnect line 1950 segments and 45° angle diagonal interconnect line 1960 segments. The interconnect line with angle A has a slope of n/m where $n=\sin(A)*m$. To provide a vertical rise of n, a 45° angle diagonal interconnect line 1960 of length $\sqrt{2}n$ is used. This 45° angle diagonal interconnect line 1960 also provides horizontal change of n. To provide the remainder of the horizontal change, a horizontal interconnect line 1950 of length m-n is used (where m equals the entire horizontal distance change for vertical distance change of n). Expressed only in terms of angle A and n, the horizontal interconnect line 1950 is created with a length of $n/\sin(A)-n$.

The vertical distance change value of n is selected in a manner that best allows the manufacturer to manufacture a desired integrated circuit design. Specifically, a very small value of n approximates the A degree interconnect line very closely but can be difficult to manufacture. A large value of n will not closely approximate the desired line with an angle of A.

Figure 20:
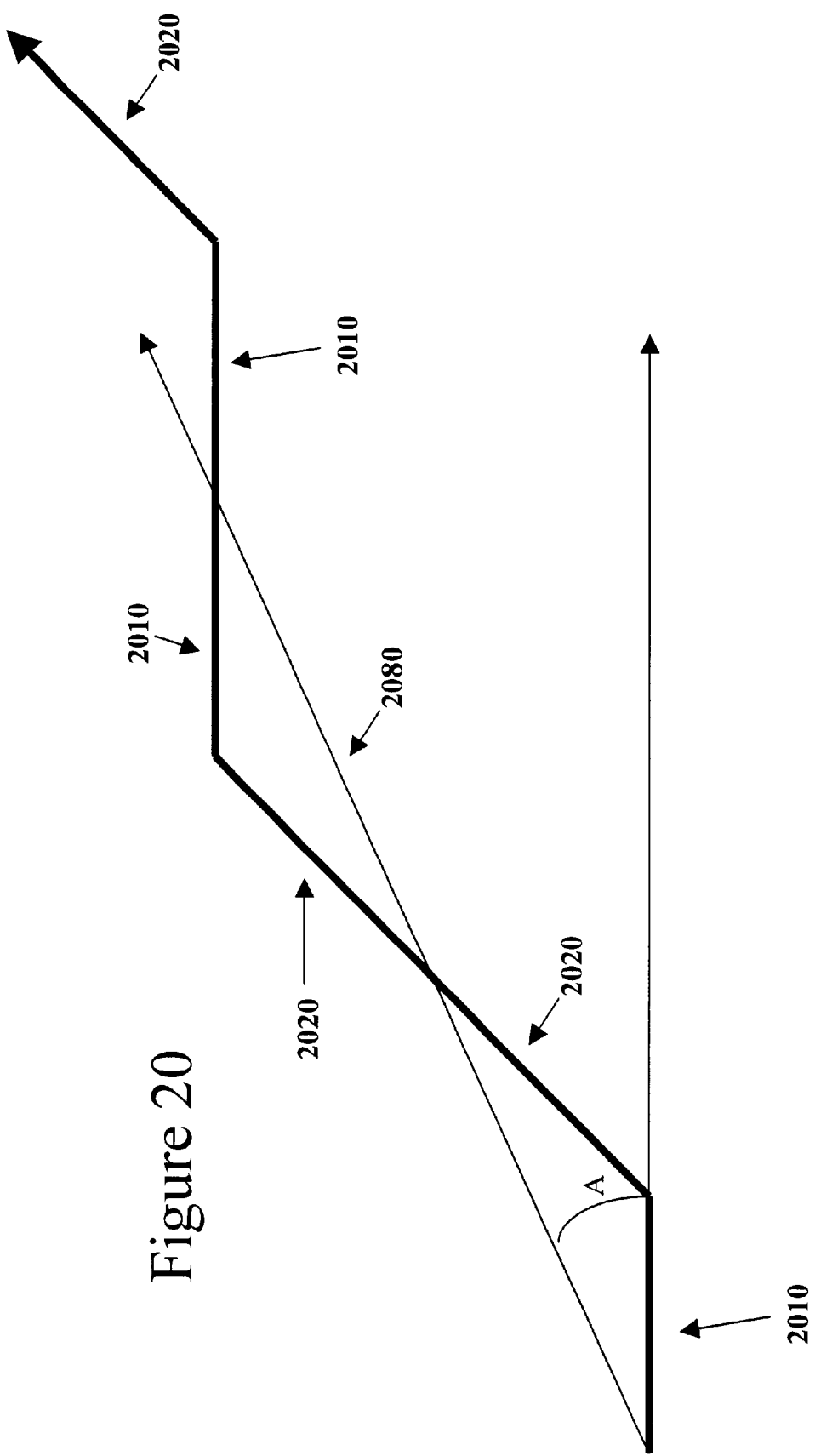
FIG. 20 illustrates alternating pairs of horizontal interconnect lines and diagonal interconnect lines used to create a close approximation to a desired arbitrary angle interconnect line with angle A.

To closely track the desired interconnect line with an angle of A, the simulated angle A interconnect line will cross back and forth across the ideal Euclidean interconnect line with an angle of A. Specifically, FIG. 20 illustrates how alternating pairs of horizontal interconnect lines 2010 and diagonal interconnect lines 2020 are used to create a close approximation to the desired interconnect line 2080 with angle A.

Simulated Euclidean Layers

Figure 21:
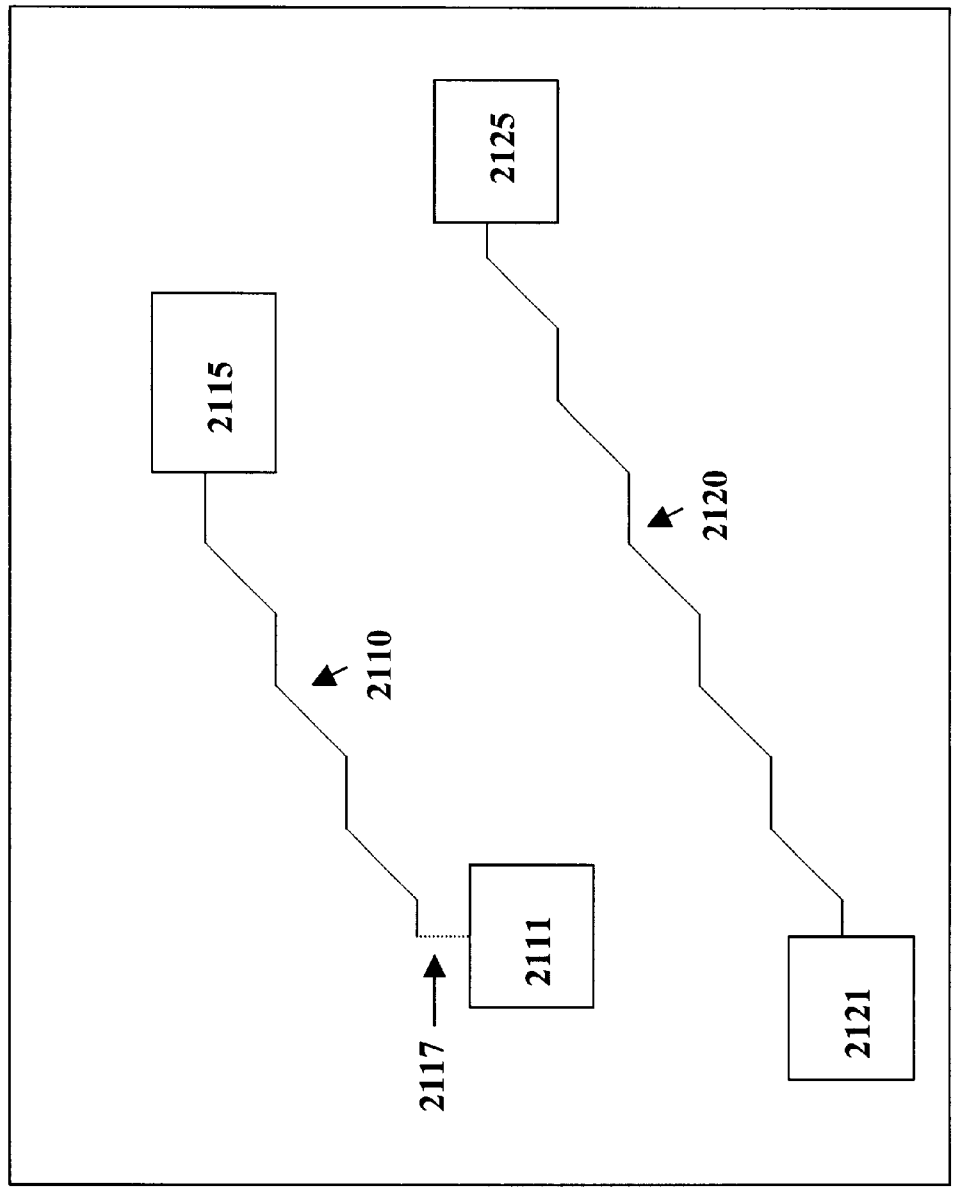
FIG. 21 illustrates an example metal layer containing an arbitrary preferred angle layer that is approximated with a collection of Manhattan (horizontal or vertical) and 45° angle diagonal interconnect line segments on the same layer.

With the ability to simulate any arbitrary angle with a combination of Manhattan and 45° angle diagonal interconnect lines, the teachings of the present invention can be used to created entire metal layers at any arbitrary angle. Specifically, a selected metal layer may be designated to have a preferred direction of any angle. The preferred direction interconnect lines on that layer are then created by depositing both the Manhattan (horizontal or vertical) and 45° angle diagonal interconnect lines on that layer in the proper proportions. For example, FIG. 21 illustrates an example metal layer that contains an arbitrary preferred angle layer that is approximated with a collection of Manhattan (horizontal or vertical) and 45° angle diagonal interconnect line segments on the same layer. Arbitrary angle interconnect line 2120 couples circuit 2121 and circuit 2125. Arbitrary angle interconnect line 2110 couples circuit 2111 and circuit 2115 with the aid of a vertical interconnect line segment 2117 on another layer.

With the availability of arbitrary wiring direction layers, the selection of a wiring layer direction becomes a parameter that may be automatically selected by layout software or hand selected by a layout engineer. For example, a particular layout may be best wired using a wiring layer with a 38.5 degree preferred direction according to a layout program. Thus, such a 38.5 degree preferred direction layer may be created using the simulated Euclidean wiring technique.

Figure 22:
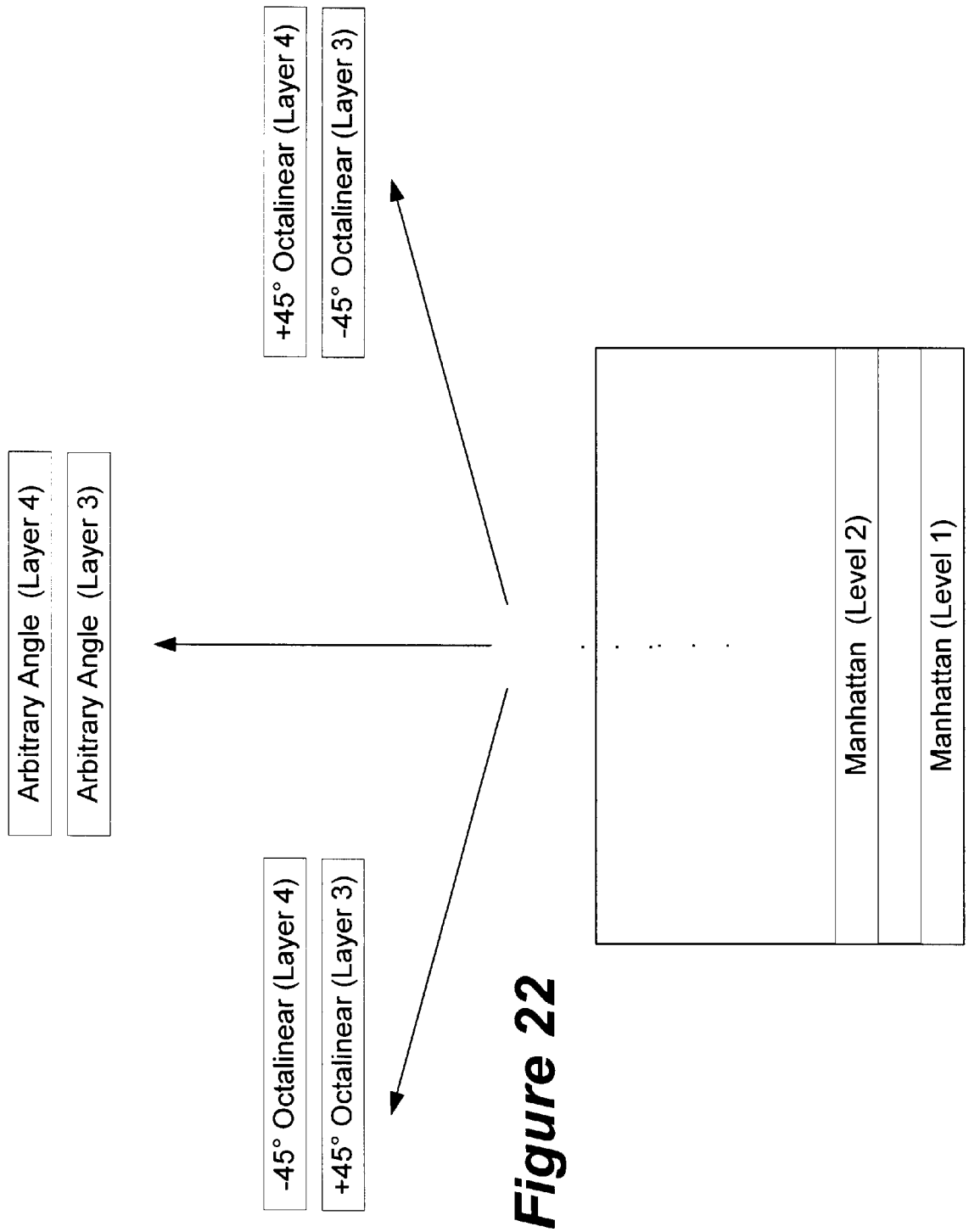
FIG. 22 illustrates a side view of three different types of multiple layer integrated circuits that start with two Manhattan layers and include simulated Euclidean layers.

FIG. 22 illustrates three different useful sets of useful wiring direction layers: (1) $HVD_1D_2$ comprising Horizontal, Vertical, +45° diagonal, and −45° diagonal, layers; (2) $HVD_2D_1$ comprising Horizontal, Vertical, Horizontal, −45° diagonal, and +45° diagonal layers; and (3) $HVA_1A_2$ comprising Horizontal, Vertical, and two arbitrary angle layers that are selected based up on the particular layout requirements. The arbitrary angle layers may be implemented with the simulated Euclidean wiring layers disclosed in the previous section. Additional layers can be added on the four layer systems illustrated in FIG. 22.

Figure 23:
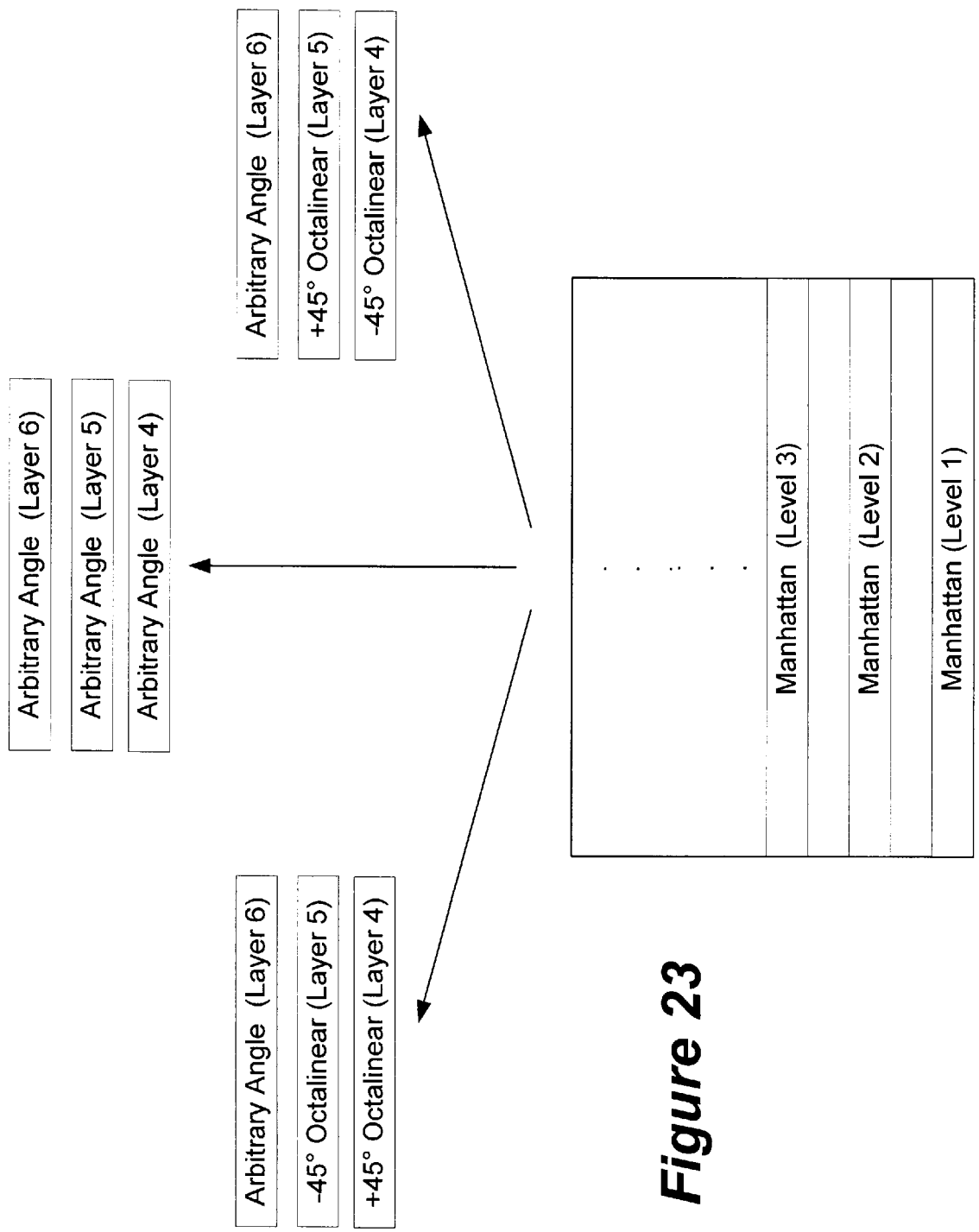
FIG. 23 illustrates a side view of three different types of multiple layer integrated circuits that start with three Manhattan layers and include simulated Euclidean layers.

FIG. 23 illustrates three additional different useful sets of useful wiring direction layers: (1) $HVHD_1D_2A$ comprising Horizontal, Vertical, Horizontal, +45° diagonal, −45° diagonal, and one arbitrary selected layer; (2) $HVHD_2D_1A$ comprising Horizontal, Vertical, Horizontal, −45° diagonal, +45° diagonal, and one arbitrary selected layer; and (3) $HVHA_1A_2A_3$ comprising Horizontal, Vertical, Horizontal, and three arbitrary angle layers that are selected based up on the particular layout requirements. The arbitrary angle layers may be implemented with the simulated Euclidean wiring layers disclosed in the previous section.

Figure 24:
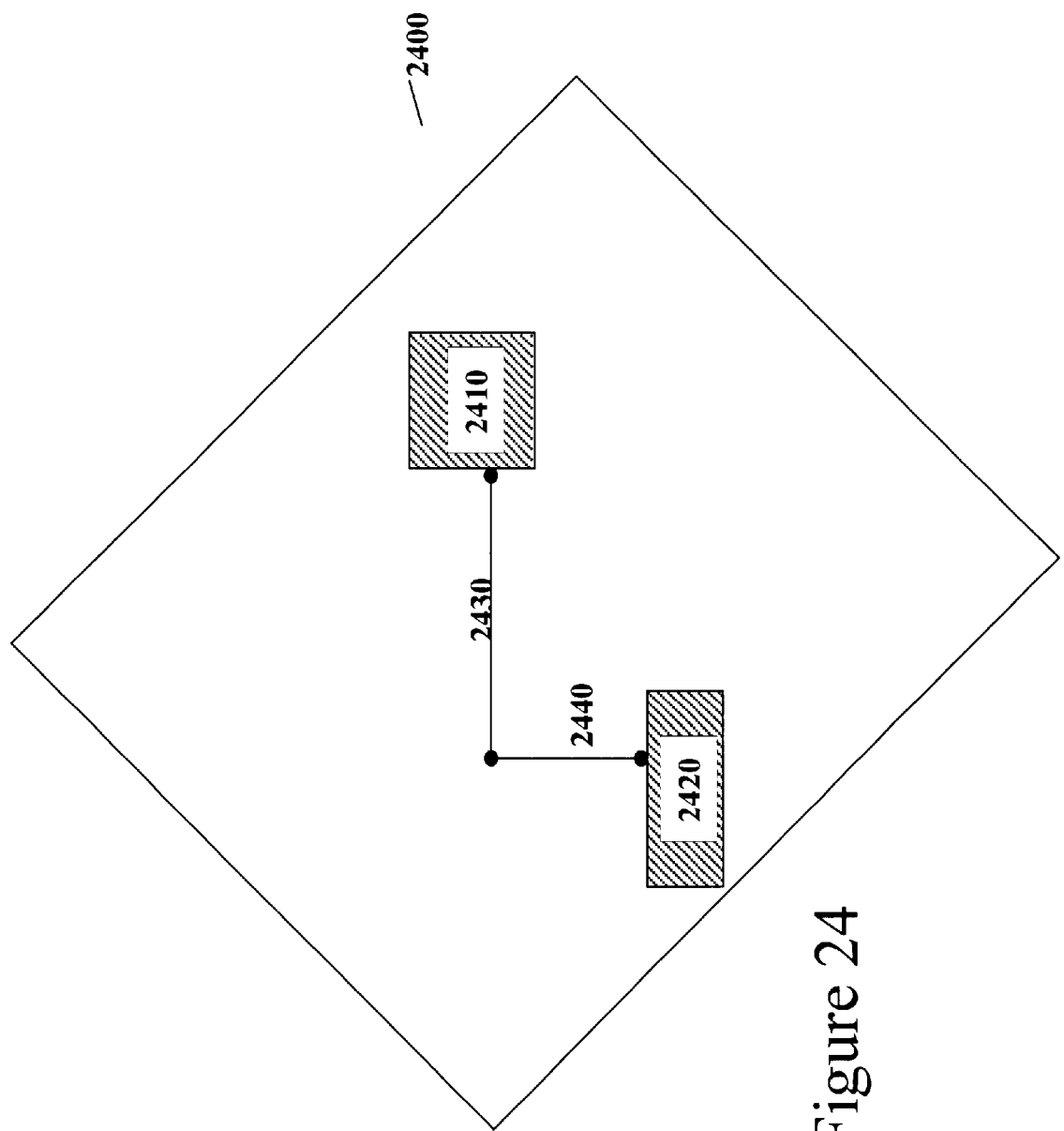
FIG. 24 illustrates a top view of an integrated circuit with Manhattan layers that are diagonal with respect to the integrated circuit edges.

One additional non Manhattan routing system technique to note is a system that uses diagonal wires in the core lowest layers of the design. Specifically, the lowest layers may be created diagonal relative to the integrated circuit edge. In has been found that such designs can improve the density of the overall layout of the design. FIG. 24 illustrates a simplified example of such a design. As illustrated in FIG. 24, circuit module 2410 and circuit 2420 diagonal relative to the edges of integrated circuit 2400. Similarly, the interconnect line routing wires are diagonal relative to the edges of integrated circuit 2400.

The foregoing has described methods and apparatus for routing interconnect lines for an integrated circuit ("IC") in a gridless non Manhattan manner. It is contemplated that changes and modifications may be made by one of ordinary skill in the art, to the materials and arrangements of elements of the present invention without departing from the scope of the invention.

We claim:

1. A method of creating a compacted non Manhattan integrated circuit layout, said non Manhattan integrated circuit layout comprising a plurality of horizontal interconnect lines, vertical interconnect lines, and diagonal interconnect lines, said method comprising:

creating a group of horizontal interconnect lines and diagonal interconnect lines sorted by relative vertical position;

vertically compacting said group of horizontal interconnect lines and diagonal interconnect lines sorted by relative vertical position;

creating a group of vertical interconnect lines and said diagonal interconnect lines sorted by relative horizontal position; and horizontally compacting said group of vertical interconnect lines and said diagonal interconnect lines sorted by relative horizontal position.

2. The method of claim 1 wherein creating said group of horizontal interconnect lines and diagonal interconnect lines sorted by relative vertical position comprises creating more than one subgroups of horizontal or diagonal interconnect lines that are independent.

3. The method of claim 2 wherein a vertical interconnect line in a first subgroup may be related to a diagonal interconnect line in a second subgroup.

4. The method of claim 1 wherein creating said group of vertical interconnect lines and said diagonal interconnect lines sorted by relative horizontal position comprises creating more than one subgroups of vertical interconnect lines or diagonal interconnect lines that are independent.

5. The method of claim 4 wherein a horizontal interconnect line in a first subgroup may be related to a diagonal interconnect line in a second subgroup.

6. The method of claim 1 wherein said diagonal interconnect lines comprise substantially 45° angle interconnect lines.

7. The method of claim 1 wherein said diagonal interconnect lines comprise substantially minus 45° angle interconnect lines.

8. The method of claim 1 wherein creating a group of horizontal and diagonal interconnect lines sorted by relative vertical position comprises creating a graph of horizontal and diagonal interconnect lines arranged by relative vertical position.

9. The method of claim 1 wherein said diagonal interconnect lines comprise substantially 60° angle interconnect lines.

10. The method of claim 1 wherein said steps of compacting further comprise routing interconnect lines around obstacles.

11. A method of creating a compacted non Manhattan integrated circuit layout, said method comprising:

creating a sorted first group of interconnect lines, said sorted first group comprising interconnect lines extending in a first direction and a direction diagonal relative to said first direction, said sorted first group sorted by relative position in a second direction orthogonal to said first direction;

compacting said first sorted group of interconnect lines sorted by relative position along said second direction;

creating a sorted second group of interconnect lines, said sorted second group comprising interconnect lines extending in said second direction and said direction relative to said first direction, said sorted second group sorted by a relative position in said first direction; and compacting said second group of interconnect lines sorted by relative position along said first direction.

12. The method of claim 11 wherein creating said first group of interconnect lines comprises creating more than one subgroups of interconnect lines that are independent.

13. The method of claim 12 wherein a first interconnect line extending in said first direction in a first subgroup may be related to a second interconnect line extending in said direction diagonal to said first direction is in a second subgroup.

14. The method of claim 11 wherein creating said second group of interconnect lines comprises creating more than one subgroups of interconnect lines that are independent.

15. The method of claim 14 wherein a first interconnect line extending in said second direction in a first subgroup may be related to second interconnect line extending in a diagonal direction in a second subgroup.

16. The method of claim 11 wherein said direction diagonal to said first direction is substantially 45° relative to said first direction.

17. The method of claim 11 wherein said direction diagonal to said first direction is substantially minus 45° relative to said first direction.

18. The method of claim 11 wherein creating a group of horizontal and diagonal interconnect lines sorted by relative vertical position comprises creating a graph of horizontal and diagonal interconnect lines arranged by relative vertical position.

19. The method of claim 11 wherein said diagonal interconnect lines comprise 60° angle interconnect lines.

20. The method of claim 11 wherein said steps of compacting comprise routing interconnect lines around obstacles.

* * * * *